United States Patent [19]

Carver et al.

[11] Patent Number: 4,945,488
[45] Date of Patent: Jul. 31, 1990

[54] INTEGRATED AIRCRAFT MANUFACTURING SYSTEM

[75] Inventors: Larry L. Carver, Manhattan Beach; Charles E. Zamzow, Rancho Palos Verdes; Donald D. Mladenoff, Alta Loma; Glenn A. Lovrien, Bellflower, all of Calif.

[73] Assignee: Northrop Corporation, Hawthorne, Calif.

[21] Appl. No.: 319,599

[22] Filed: Mar. 6, 1989

Related U.S. Application Data

[63] Continuation-in-part of Ser. No. 50,794, Apr. 14, 1987, abandoned.

[30] Foreign Application Priority Data

Apr. 14, 1988 [EP] European Pat. Off. ........ 88105995.0
Apr. 14, 1988 [JP] Japan ................................... 63-92623

[51] Int. Cl.$^5$ ............................................. G06F 15/00
[52] U.S. Cl. ............................... 364/474.24; 364/191; 364/425; 364/522
[58] Field of Search ............... 364/188, 189, 191, 192, 364/474.22–474.24, 425, 521, 522, 552

[56] References Cited

U.S. PATENT DOCUMENTS

| 4,665,492 | 5/1987 | Masters | 364/474.24 |
| 4,675,825 | 6/1987 | DeMenthon | 364/474.22 |
| 4,697,240 | 9/1987 | Cedar et al. | 364/474.24 |
| 4,736,306 | 4/1988 | Christensen et al. | 364/522 |
| 4,791,581 | 12/1988 | Ohba | 364/522 |
| 4,791,583 | 12/1988 | Colburn | 364/522 |
| 4,821,214 | 4/1989 | Sederberg | 364/522 |
| 4,845,651 | 7/1989 | Aizawa et al. | 364/521 |

FOREIGN PATENT DOCUMENTS 0307503 12/1988 Japan .............................. 364/474.24

OTHER PUBLICATIONS

Solid Geometric Modeling for Mold Design and Manufacture; W. Wang; General Electric Technical Information Series, Class 1; May 1984; Corporate Research and Development, Schenectady, N.Y.; Report No. 84CRD122.
What to look for in a CAD/CAM system; Hanson et al; I&CS; pp. 47–50; Jun. 1986.

Primary Examiner—Allen MacDonald
Attorney, Agent, or Firm—Terry J. Anderson; Robert B. Block

[57] ABSTRACT

A method of manufacturing aircraft includes constructing a definition of the aircraft in a computer memory and then defining in the memory a first tool for forming a component part of the aircraft and a second tool for assembling a component part made with the first tool. The definitions of the first and second tools are downloaded to a tool forming device which is operated to form the first and second tools essentially independent from one another.

15 Claims, 21 Drawing Sheets

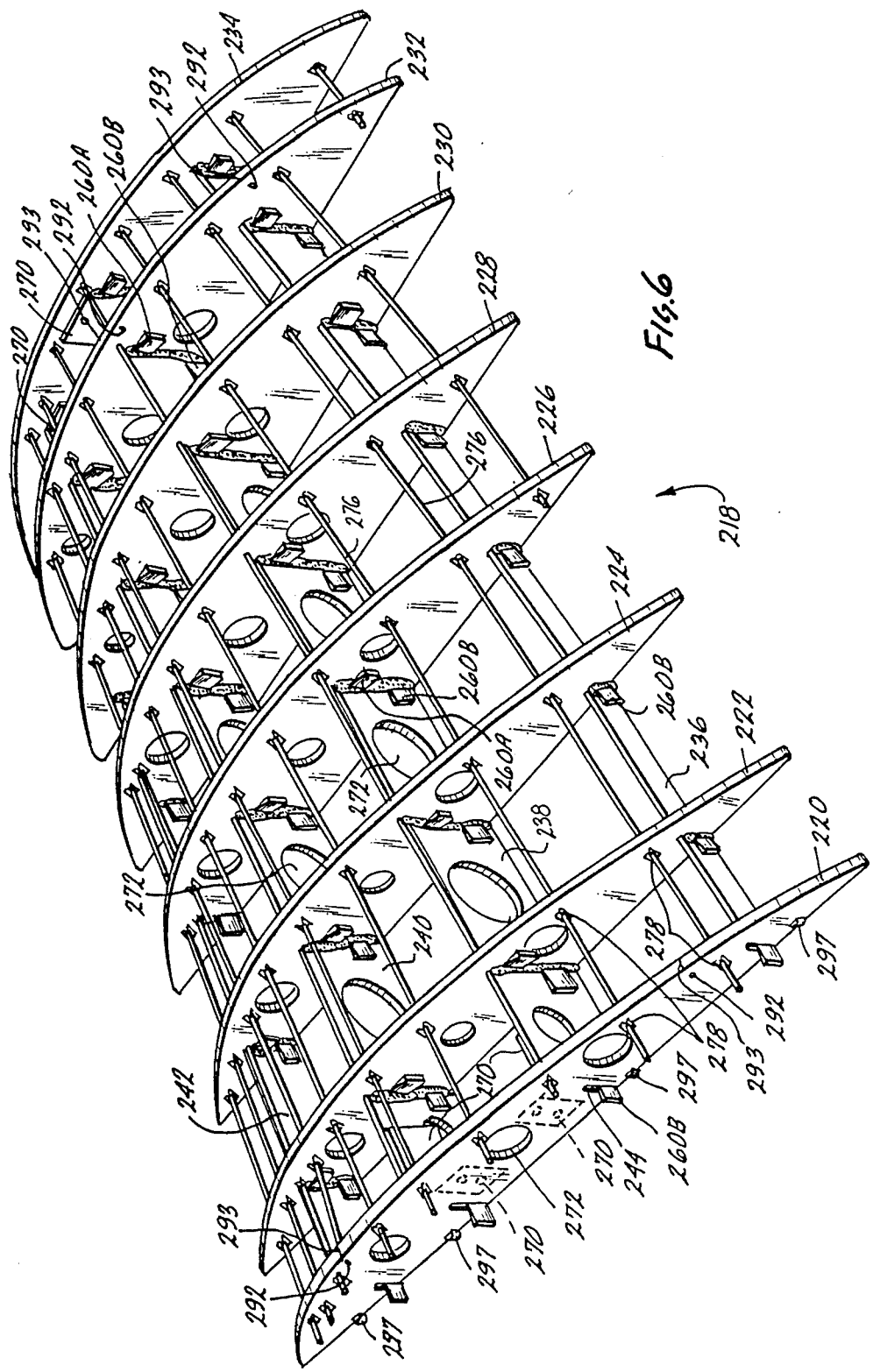

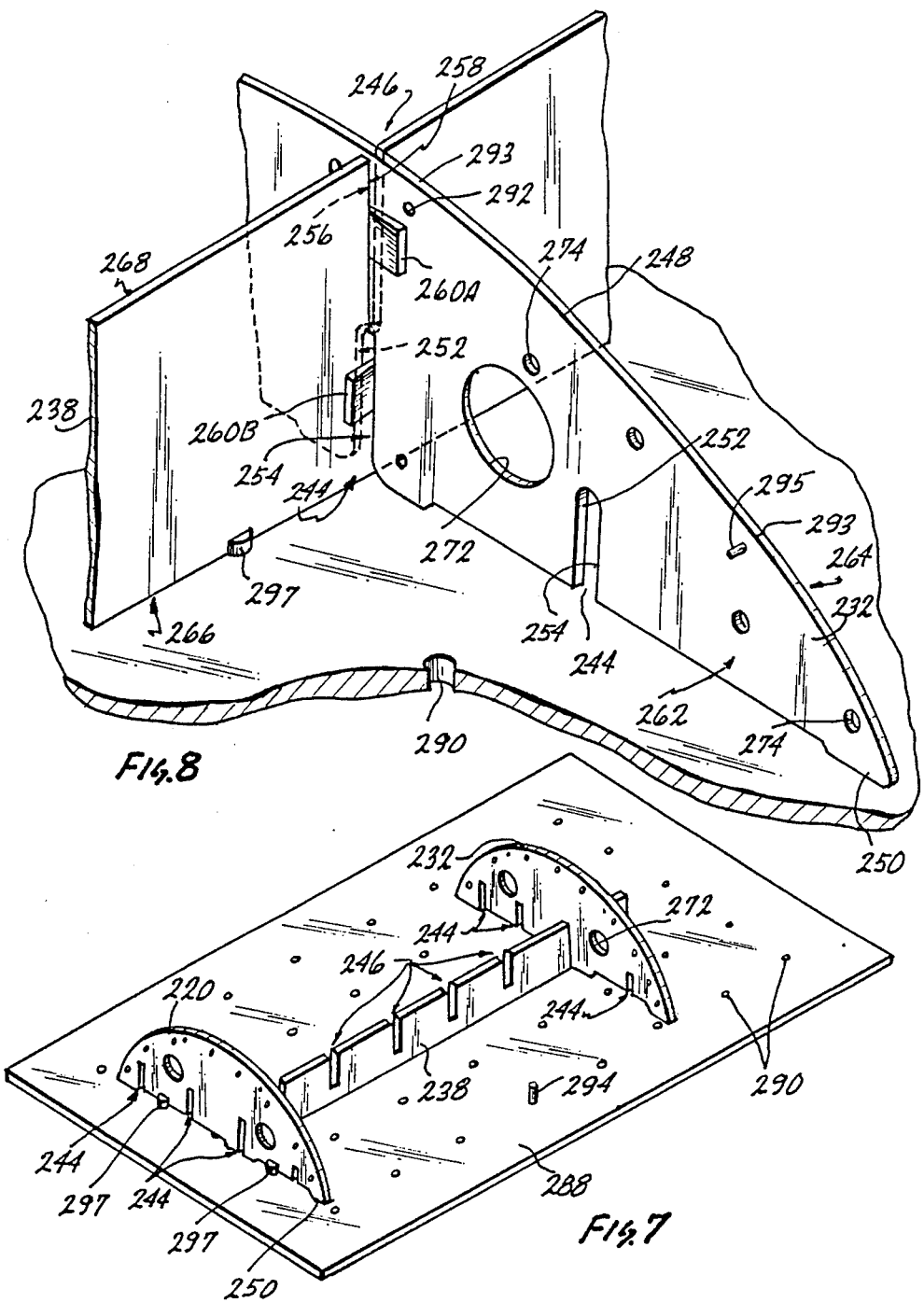

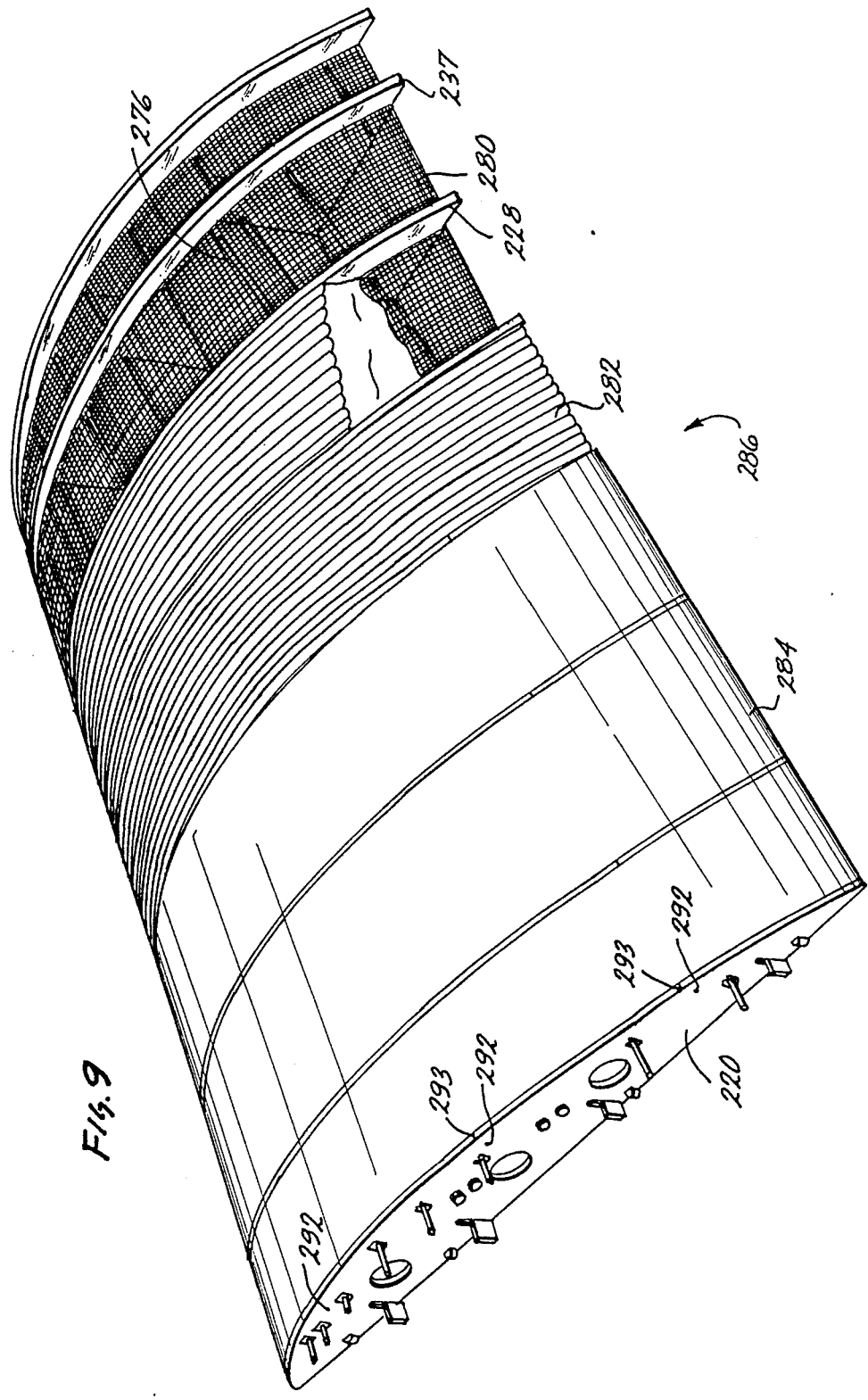

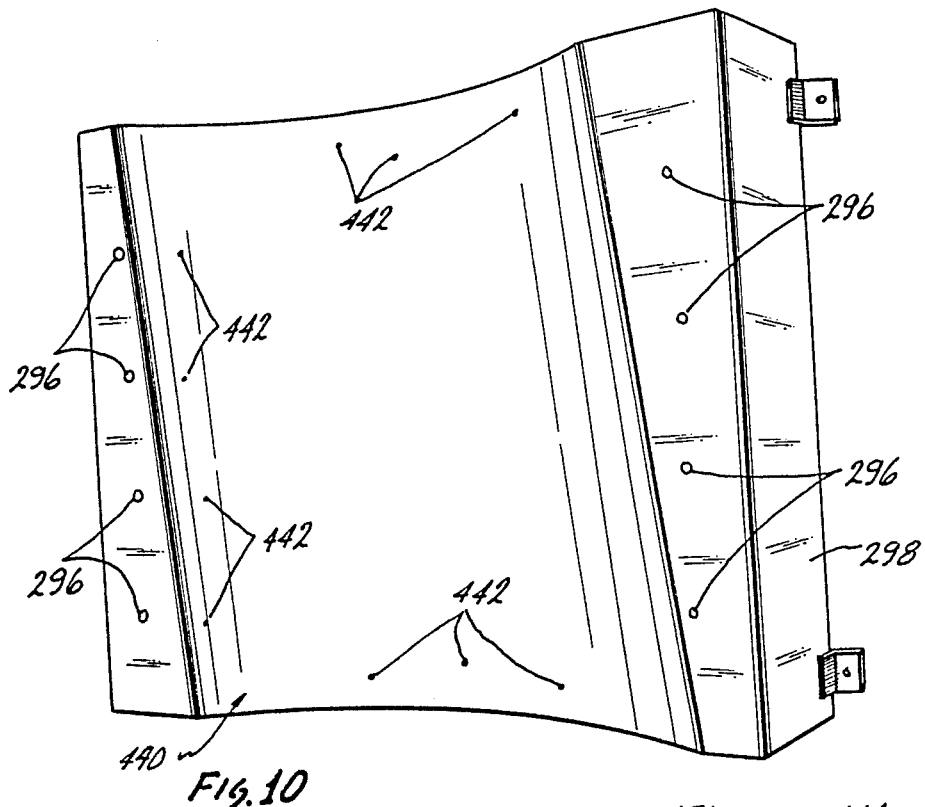
Fig. 10
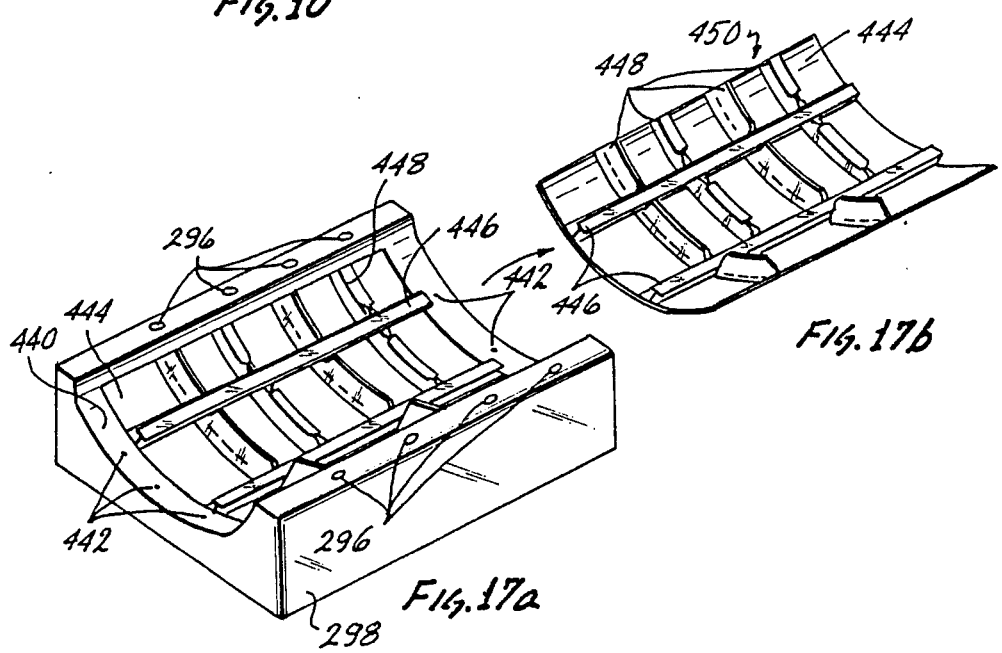
Fig. 17b
Fig. 17a

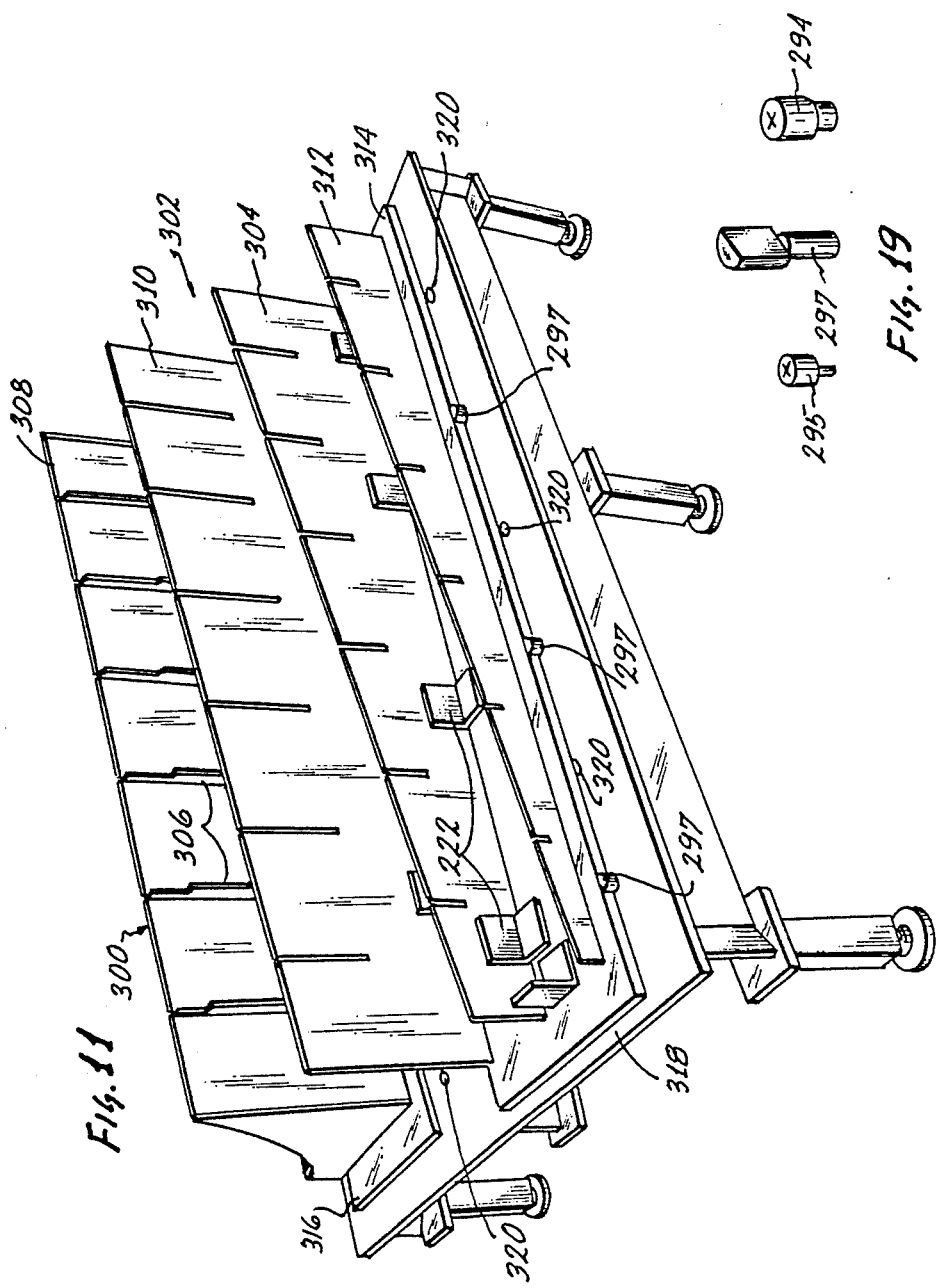

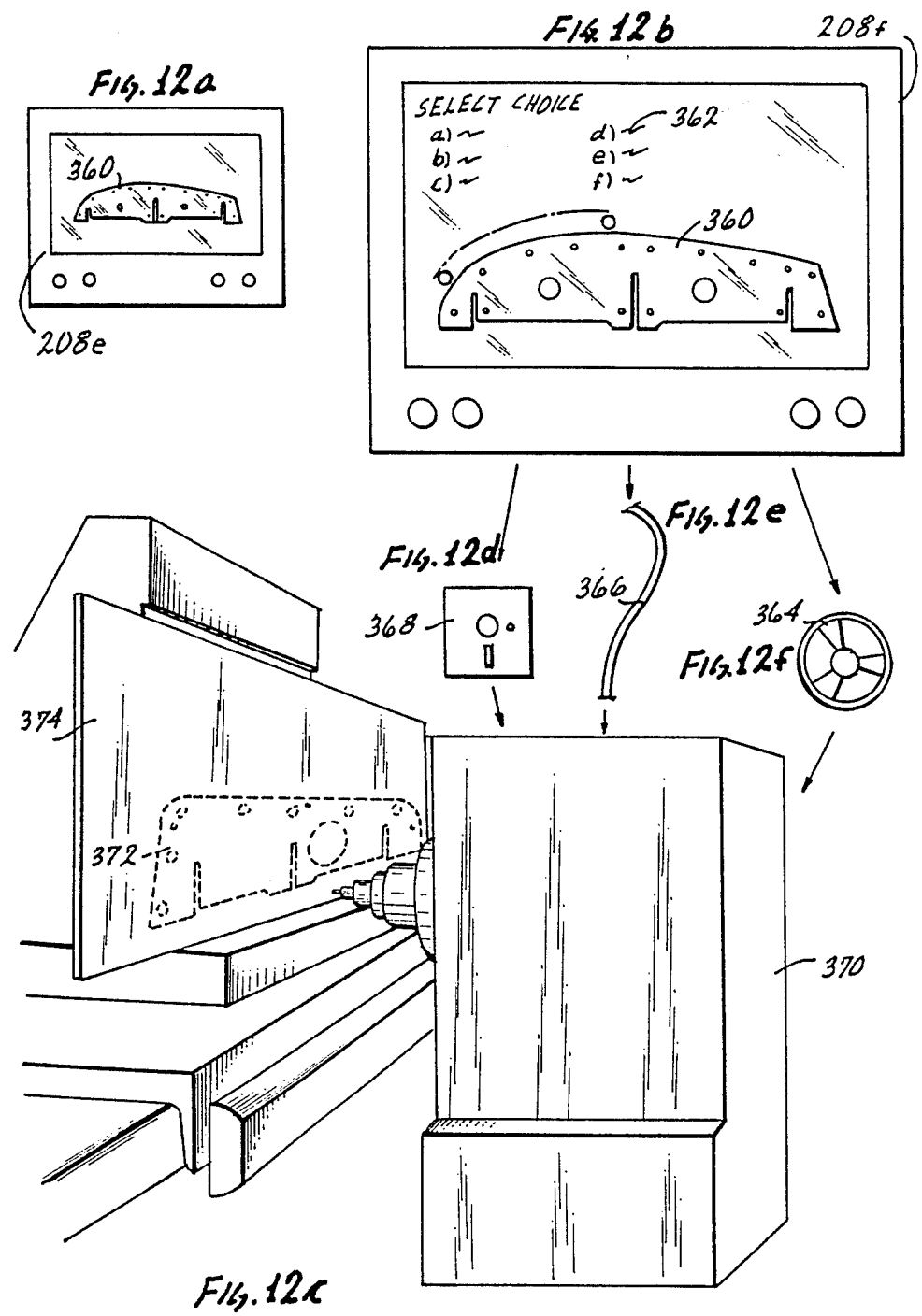

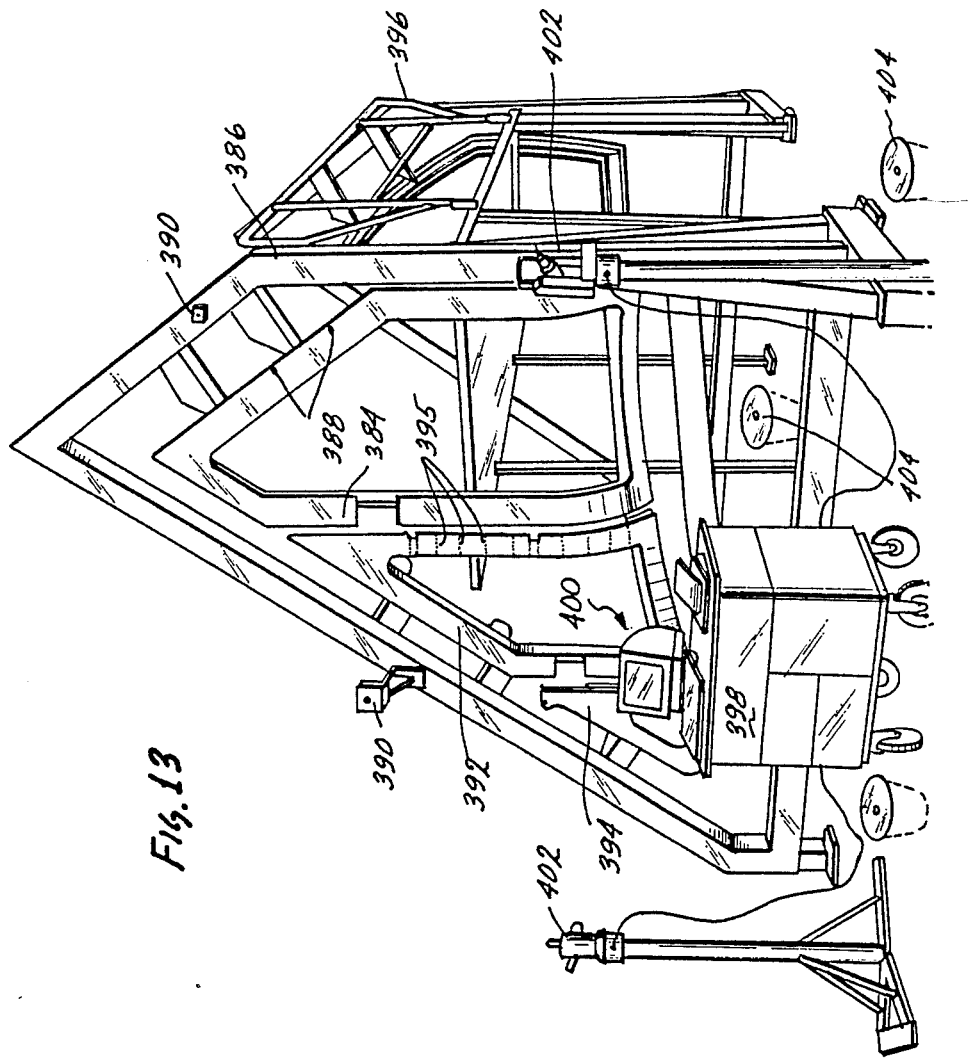

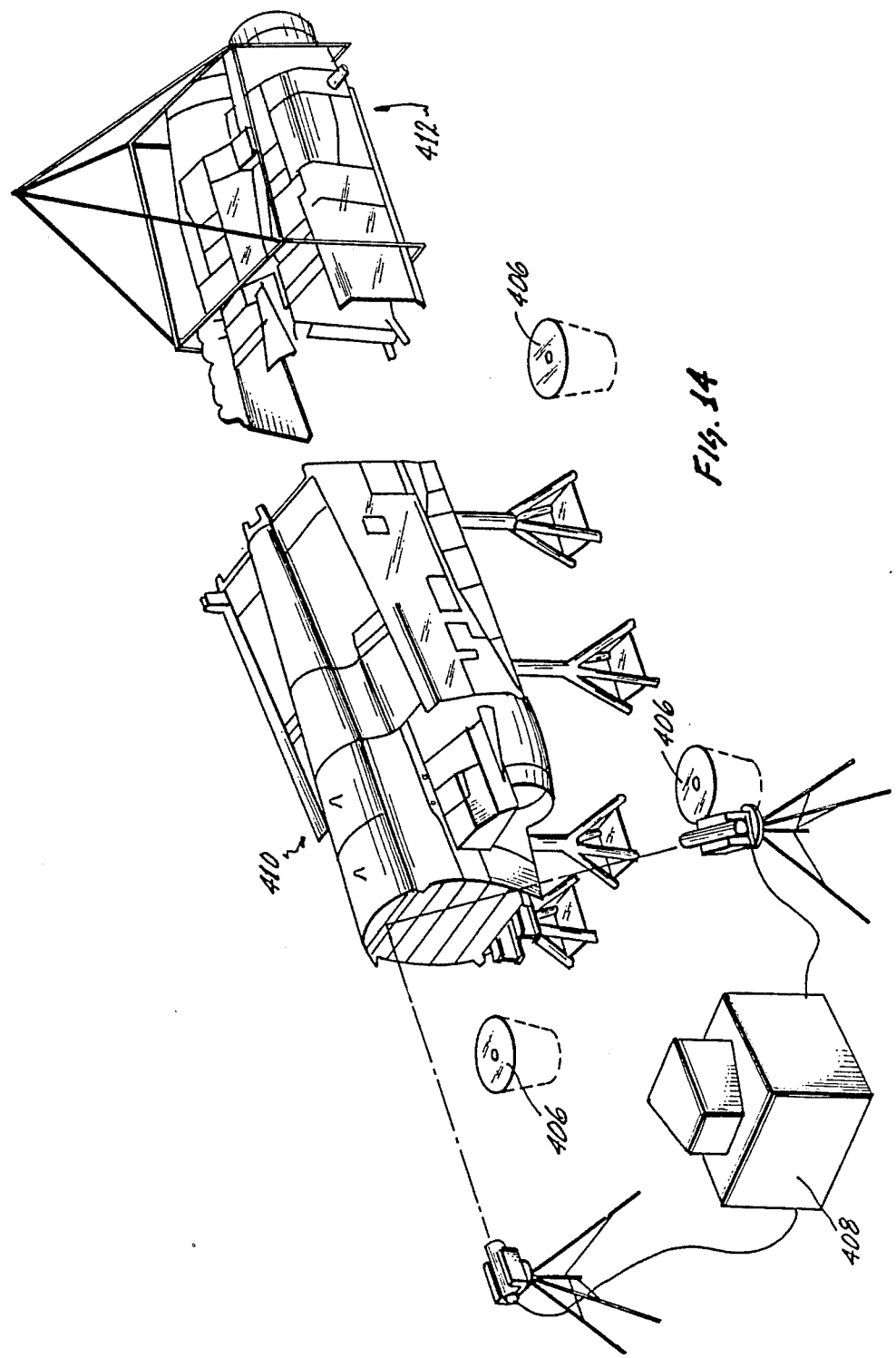

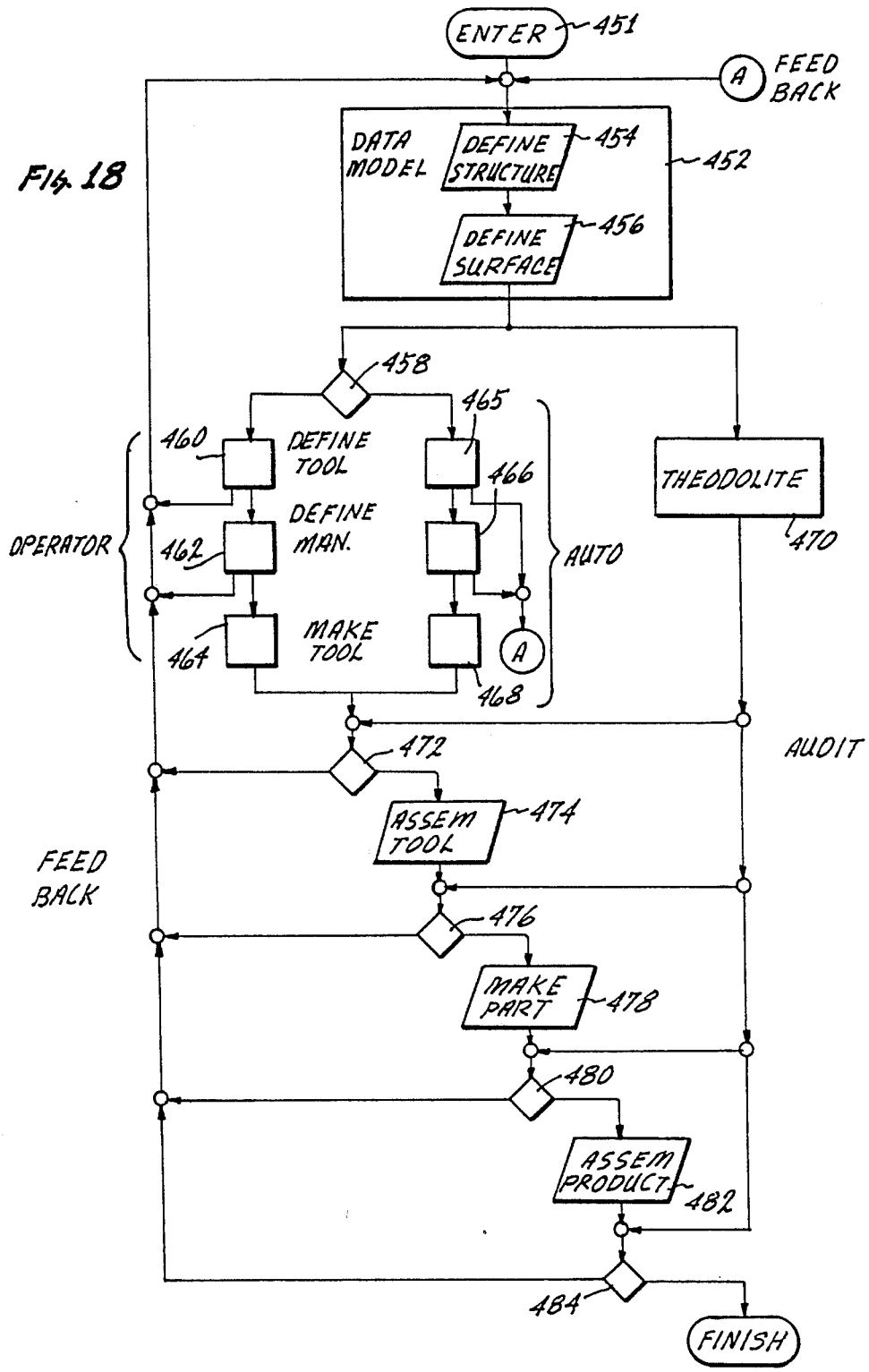

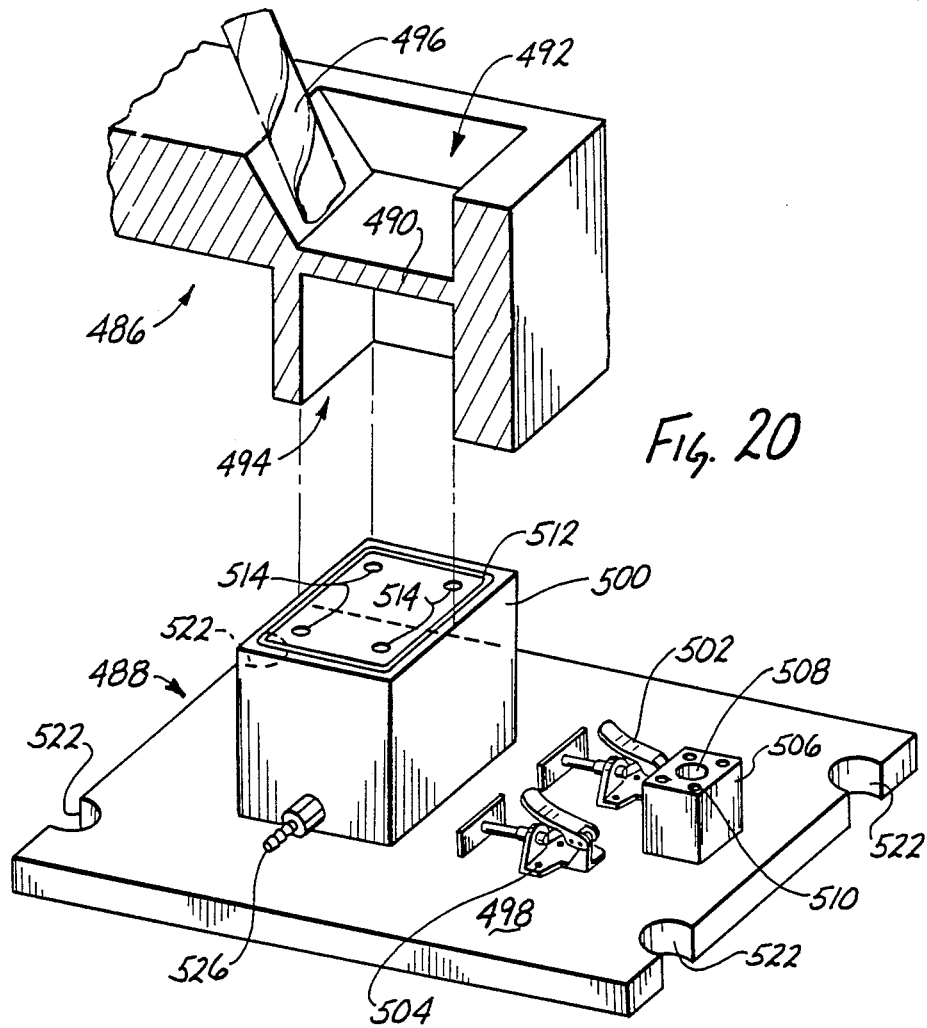
Fig. 20
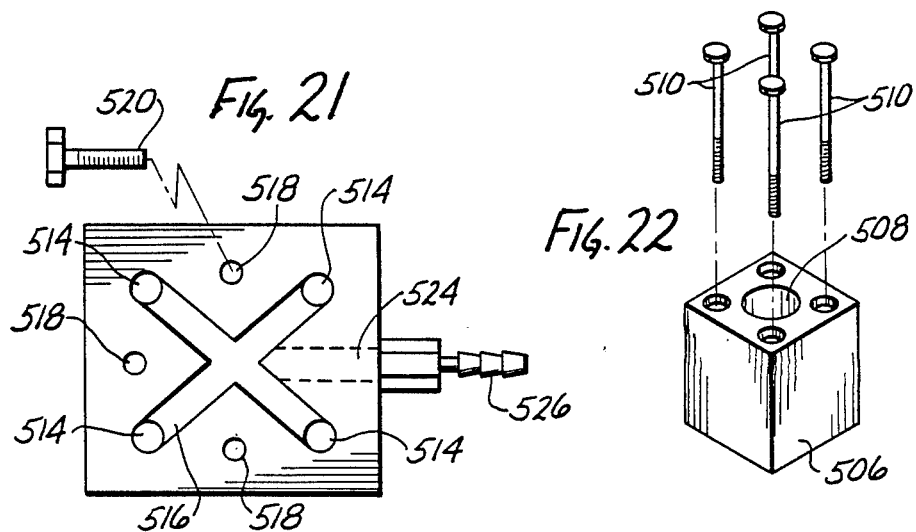
Fig. 21
Fig. 22

INTEGRATED AIRCRAFT MANUFACTURING SYSTEM

CROSS REFERENCE TO RELATED APPLICATIONS

This application is a continuation in part of application Ser. No. 050,794, filed Apr. 14, 1987 in the names of Larry L. Carver, Charles E. Zamzow and Donald. Mladenoff, entitled ASSEMBLY DATA MODEL SYSTEM and assigned to the same assignee as this application. The entire contents of application Ser. No. 050,794 are herein incorporated by reference.

BACKGROUND OF INVENTION

This invention is directed to methods and apparatus for precisely producing and precisely assembling a multi-component article, as for instance an aircraft.

In a manufacturing system it is possible to produce a one piece article with a particular precision by machining the article to that precision. Other articles can be manufactured by first making a die or mold and then forming the article with the die or mold. In using a mold or a die, while the die or mold may be of the required precision, in making the article from the die or mold, precision can and normally is lost.

In manufacturing a multi-component structure, each individual component must be precisely manufactured and then all of the individual components assembled together. Unfortunately, the overall precision of the assembled structure reflects the least precise of its many component parts as well as the precision in joining each of the component parts to each other.

Depending on the article which is being manufactured, the precision required varies. In manufacturing aircraft, the precision of and the alignment of component parts of the aircraft with respect to one another is of a much greater importance than in other manufactured articles. Because of the aero-dynamics of the aircraft, the flight stresses, material fatigue and other similar factors, a very large structure, the aircraft, must be constructed to very exacting tolerances.

An aircraft must be constructed so it is light in weight, but at the same time has sufficient strength to withstand bending, sheer, torsion, and other forces placed on it. To achieve these requirements, modern aircraft are normally constructed utilizing a stressed skin construction.

A stressed skin construction for an aircraft relies upon the strength of the outer skin and attached components and not on strength imparted by internal structural members which might traverse or crisscross through the interior of the aircraft. The stressed skin construction results in a high strength to weight ratio. This is achieved utilizing a thin skin which is reinforced at intervals with bulkheads which are placed transversed to the longitudinal axis of the aircraft and stringers or longerons which are placed along the longitudinal axis of the aircraft. The wings can also be formed utilizing skin construction, except they can include spars the longitudinal axis of the wing. In a stressed construction it is desirable to achieve an as exact placement and alignment of the individual component as possible.

In the past, the design of aircraft structures was done exclusively on two dimensional media, as for instance drafting boards and lofting boards. Drawings of major assemblies and of sub-assemblies were made. A drawing or a loft board was then prepared for each individual structural component specified in the design. While in theory if two drawings are accurately drawn and appropriately dimensioned with respect to one another, the parts made to the specification of these drawings should match. In the practical world, however, this is not necessarily true.

In preparing two separate drawings, inconsistencies do occur, and human judgments made on a 2-dimensional drawing or lofting board do not always prove to be correct in a 3-dimensional world. Further, when one part is joined to another, appropriate alignment of the connecting elements of these parts must be assured. Thus, to produce a modern aircraft it is necessary to use many assembly tools and jigs in order to achieve part alignment. Additionally, assembly jigs require thinking in a further dimension in that they mimic the complementary image of the product and not the image itself, that is the image must fit within the assembly jig.

Typically, in the past, aircraft were formed of metallic components, principally aluminum and aluminum alloys. For more exotic aircraft, as for instance military aircraft, other material such as magnesium and titanium alloys have been used. In aircraft constructed of metallic parts, once the individual parts were formed, during assembly of the aircraft it was possible to make allowances for slight misalignment or precision tolerance differences between parts by using shims or by bending or flexing of certain of the metallic parts, such as thin metallic "skin" sheets. The use of shims or material movement allowed the aircraft assembler to overcome the lack of precision of manufacture of the individual components of the aircraft.

In presently used manufacturing procedures, in order to insure that the component parts of an aircraft do, in fact, fit in alignment with one another, it is necessary to make a family of related master tools including full scale mock-ups or "master models" of major components of the aircraft. Aside from the master model, other master tools include a control (female) master, jig masters, gauging masters, body masters and various templates.

As can be appreciated, many of the master tools for large aircraft, as for instance a Boeing 747, are immense. By their sheer size they are, of necessity, very heavy. Because it is necessary to insure that production aircraft number 999 is the same as production aircraft number 1, these master tools must be stored for the lifetime of the production of the aircraft.

Aside from their size, master tools have further inherent problems. They are easily damaged and can be affected by temperature and humidity. A transfer taken from a master tool at one time may differ from a similar transfer taken from that master tool at a different time because of existing conditions at the time the transfers are taken. Further, in master models, because of their sheer size, a master mold line surface is often independent of the actual engineering design criteria and is extremely difficult to reproduce to the tolerances sought.

With the exception that gauging masters are sometimes independently constructed, the master model must serve as a single mastering source for use in transferring engineering configurations and all other related information, i.e., hole patterns, tool tabs, trim lines, and other criteria to further tools. The master model is used to guarantee interchangeability and replacement, critical dimensional tolerances and match conditions. It is used during fabrication, rework, and verification of other subordinate tools.

In this type of manufacturing system, without the master model, the ability is lost to guarantee dimensional integrity throughout other tools, and in the production parts themselves. The master model is made from engineering data. However, the reproduction of that engineering data in the master model is highly dependent upon the design itself and is very difficult to do.

In the presently utilized manufacturing systems, since further tools are necessary for defining trim lines, hole patterns, and other details which are critical to the final assembly of a highly precision multi-component system such as an aircraft, in order that these further tools give accurate representations of the master model, they have to be "pulled", i.e. molded, directly from the master model or "pulled" second hand from a prior tool which was itself "pulled" from a master model. The master model, thus, served as an image for making further tools, and some of these further tools served as an image for even further tools.

Typically, the control master (a master female mold) is taken off of a component portion of the master model and then utilized to make further image molds of the master model. Inherently, tolerance build-up always occurs when transfers are made from the master model, or from the female control master to any further tool. This is further complicated by the effects of stability of any tool and its response to environmental fluctuation, such as temperature and humidity.

Since in the presently utilized methods of manufacturing aircraft, the master model must first be formed and then the control master pulled from it, the jig master pulled from the control master, the gauging master pulled and . . . etc., etc. prior to the formation of production tooling, the present manufacturing methods for aircraft construction can be considered to be a serial method of manufacturing. By this it is meant that each component tool is dependent on one or more preceding tools and the particular component tool cannot be made until its preceding ancestral tools are first made. By the time production tools are made, many other tools have had to have been created and a lot of time has elapsed. Further in this serial progression of tools, any defects introduced in the lineage of the tools is passed to the descendants further down in the lineage.

In forming an aircraft from a collection of associated parts, assembly jigs are used. Among other things, the assembly jigs are utilized in positioning individual aircraft component parts with respect to one another during final assembly of an aircraft structure. It is necessary, however, to establish the positioning of the assembly jigs themselves to insure that the structures which are positioned with these assembly jigs are accurately positioned. The master tools have also been required for this.

In presently utilized manufacturing systems, an assembly jig rough structure is constructed. A gauging master is rigged in association with the rough structure. Removable locators are designed and manufactured. These locators are then attached to the rough structure in a manner whereby they can later be removed. The locators are designed to "mate" in a known manner with the gauging master and subsequently with the aircraft part or parts which will be assembled on the assembly jig.

Once the locator mounts on the rough structure are established and the locators properly aligned with the gauging master, the locators are removed and the gauging master is also removed. The locators are now reassembled on the rough structure for use in assembly of an aircraft component. When the first aircraft component assembly is completed, the locators are removed to allow for removal of the aircraft component. The locators are then reattached for the next component assembly.

Since the locators are continually being attached and removed from the rough structure, it is necessary to do periodic "cycle checks" or stability audits of the assembly rig. To do this, the gauging master must be re-rigged to the rough structure, the locators mounted, and the total rig checked to see if it is within acceptable tolerance.

Aside from normal cycle checks, the locators can be damaged and are subject to "wear" since they are continually being assembled and disassembled on the rough structure. Anytime a cycle check is performed or a locator is replaced, the particular assembly operation is halted. This not only affects the particular assembly but it can affect related assemblies. A problem with just one locator at a single assembly station can reverberate through many assembly operations.

While cycle checks can be "scheduled" to lessen their impact on other assembly operations, a damaged locator can cause a major disruption of the assembly process because of availability of the gauging master, the time necessary to rig the gauging master on the rough structure and the repositioning of a new locator.

In order to circumvent the necessity of re-rigging the gauging master for a cycle check, a "photogrammetry" process has been tested. In photogrammetry, a glass plate photograph of an assembly is analyzed to verify the position of the assembly. While this process has its merits, it is slow and subject to certain inherent problems such as plate archiving. Further it utilizes a two dimensional process to measure three dimensional spatial parameters. If the photogrammetric process indicates an improper positioning of a locator, the gauging master must be re-rigged to re-align the locator.

As the requirements of aircraft have changed, in order to increase the strength of the aircraft while concurrently decreasing the weight of the aircraft or change other functional properties of the aircraft, new materials have been developed. Presently, composite materials are finding greater use as the construction material for aircraft components. These composite materials offer high strength equal to, or exceeding, that of metallic materials, while at the same time are lighter in weight and have other improved functional properties.

These other functional properties, as for instance increased stiffness and strength of composite parts compared to metallic parts, do not generally lend themselves to the "bend" and "shim" construction techniques utilized in prior metallic aircraft. Since aircraft components formed of composite materials have very rigid structural properties, alignment of adjacent components with one another has become even more critical than in the past. This is a problem not only for the aircraft industry but for other industries, such as automobile manufacturing which is increasingly using composite materials to make body panels and other functional components.

In using composite constructions, it is possible to form a skin panel and stiffeners for the skin panel as a single unit. In prior metal constructions, these normally were formed independently and then joined (using bending and shimming if necessary) with appropriate fasteners such as rivets or bolts. Since the skin panel of a composite component can include other interfacing component members such as spars or longerons formed as an integral part thereon, the criticality of manufacturing parameters including the dimensional precision of these composite structures is even greater than that previously necessary with metal construction techniques. Exact placement and alignment of components with respect to one another in assembling these integrally stiffened composite structures is necessary for a part to be useful. If, in assembling a unified component structure, appropriate parts of the component structure are not exactly placed, the total part is useless and must be scrapped.

Composite components are constructed by laminating structural fibers in appropriate matrixes compatible with these fibers. Fiber glass is a widely used composite system which incorporates glass fibers within an epoxy resin matrix. For formation of aircraft components, more exotic composite systems having improved properties are desirable.

Currently available for use are exotic inorganic materials such as carbon fibers, boron fibers, improved glass fibers, aluminum oxide fibers, inorganic whiskers of different materials and certain organic fibers such as aramides and extended chain polyethylenes. These fibers or whiskers are incorporated as threads, fabrics, mats or the like in appropriate resins, as for instance thermosetting epoxies, polyesters, polyethers, polyimides and bismaleimides or thermoplastic polyamideimines, polyether sulfones, polyetherether ketones, polyphenylene sulfides and other similar polymeric materials.

One construction technique which is common to both metallic aircraft assembly methods and composite components formation is "forming". Parts formed of composite materials are generally formed utilizing molding techniques—using either external molds which are of a complementary shape to a part or an internal mandrel type mold on which the appropriate composite part is built. In either instance the precision of any particular composite part can be no greater than the precision of the mold or tool on which it is made. Highly precise molding techniques are, therefore, necessary in the formation of these composite components. Heretofore, to achieve the necessary precision molds necessary to form composite parts, master tools were also used.

Aside from all of the above, in forming component parts utilizing composite materials, the molds which are utilized must not only serve as a definition surface during lay up of the composite, they also have to provide support for the composite materials during the curing cycle of these materials. During this curing cycle it is required that the molds retain their shape and stability. The curing is normally affected by applying heat under a vacuum in an autoclave. Thus, not only must the mold be stable in an ambient environment, it must also be stable in the elevated temperature and/or pressure environment of the autoclave in order to maintain the critical shape and dimensions of the composite part during the curing cycle before the composite part has matured into a rigid self-defining structure.

A mold utilized for the formation and curing of a composite part is called a bonding tool. Transfer of trim lines, drilling patterns, and other surface locators to these bonding tools is very labor intensive and exacting. Further, checking aids and feeler gauges must be utilized to insure that these transfers are accurate and are maintained over multiple thermal cycling of the bonding tool in forming repeating units of the composite part thereon.

If an out-of-contour condition is found between a check aid and a bonding tool, not only must the bonding tool be suspect but the stability of the check aid and its master tool must also be suspect. If the check aid does not correlate to the bonding tool and it is then checked against its master tool and it does not correlate with the master tool, the question arises as to whether it is the master tool or the check aid which has an out of contour condition. Further, this is a subjective technique and varies from worker to worker.

Since present tools, including the ones utilized for forming composite parts, are fabricated by a multi-step procedure derived from a master model, the degree of dimensional accuracy achievable is restricted by the material properties of the tools as well as processing techniques. Dimensional accuracy cannot be maintained throughout the multi-step transferring process and, as a result, inconsistency in assembly, production, or intermediate tools has been a significant problem.

The necessity for the "bending" and "shimming" during final assembly of an aircraft can easily be seen because of gradual and/or cumulative tolerance build-up over the many steps necessary to manufacture the individual aircraft component parts. Since bending and shimming are not available in composite manufacturing, these problems are even more dramatic when composite parts are manufactured.

Typically, the presently used master tool or master model is formed from steel, aluminum and plaster. The master facility tool or female control tool taken from the master model normally is a fiber glass tool which is transferred directly from the master model. From this, transfer tools can then be taken which mimic the master model, and from the transfer tool the bonding tool is formed.

The bonding tool is normally a composite tool. These bonding tools in the past have been formed of graphite epoxy structures, fiber glass epoxy structures, ceramic structures, or metal deposited structures. These materials are incorporated as a surface onto supported templates or heavy carrier frames. Problems can result because of thermal mismatch between component parts, residual curing stresses, resin shrinkage, and insufficient process control.

In view of the problems addressed above, it is evident why large precision structures such as aircraft are very costly and require long lead times for their development. The use of composite materials in an aircraft or other structure leads to improved characteristics of that aircraft or structure. However, it also contributes to further manufacturing obstacles in addition to those already inherent in the manufacture of aircraft or other structures.

BRIEF DESCRIPTION OF THE INVENTION

This invention provides for new and improved methods and apparatus for precisely producing and assembling a multi-component structure such as an aircraft.

In general, the present invention provides a method of manufacturing an article by constructing a definition of the article in a computer memory. The definitions of a plurality of tool means are then defined in the computer memory in operative association with the definition of the article. These definitions are downloaded from the computer memory to a means for forming tools. This means is operated to form the respective tools, which in turn, are then used to form component parts of the article.

In accordance with the invention, a tool having a defined surface includes a plurality of profile boards and at least one connector board. At least a portion of the profile boards have a profile edge. These profile edge form at least a part of the defined surface of the tool. Each of the profile boards further includes locator means for positioning the profile board with respect to the connector board. The connector board also includes locator means for positioning the connector board with respect to each of the profile boards. The respective locator means each include a locator edge on the respective profile boards or the respective connector board. The connector board is positioned against the locator edge on the respective profile boards. Likewise, the profile boards are positioned against the locator edge on the connector board. Both the locator board and the connector board are then kept in their respective locations by a means for maintaining the profile boards and the connector board positioned with respect to one another.

The defined surface of the tool can comprise a mold line surface with the profile edges of the profile boards being located in this mold line surface. In a preferred embodiment, at least two of the connector boards are used with each of the connector boards having a locator means for positioning it with respect to the individual profile boards.

Each of the locator means can include a slot which has a locator edge and a non-locator edge. The locator edges on the respective profile boards abut against the connector boards to position the profile boards with respect to the connector boards and the locator edges on the connector boards abut against the respective profile boards to position the connector board with respect to the respective profile boards. The locator edges of the respective profile boards abutting against the connector boards position the profile boards with respect to the connector boards in three dimensional space in one of mutually perpendicular X or Y axes. The locator edges of the connector boards abutting against the respective profile boards position the connector boards with respect to the respective profile boards in three dimensional space in the other of the X or Y axes. Further, a Z axis positioning means is provided for positioning each of the profile boards in three dimensional space in a Z axis wherein this Z axis is orthogonal to the X and Y axes.

The means for maintaining the profile boards and the connector board in fixed locations with respect to one another can include a plurality of wedge means. These wedge means fixedly position one surface with respect to a further surface by fitting into the respective slots on the profile boards and connector boards. The wedge means in each respective slot fits between the non-locator edge of the respective slot and the respective board located in the respective slot. This positions and holds the respective board in the respective slot against the locator edge of the respective slot.

A further feature of the invention is achieved by employing a 3-dimensional graphics computer system containing a graphics data model of an article in a data base within the computer system. The computer system includes means for defining a graphics virtual surface of the article in the data model and further includes means for defining a graphics virtual member in the data model. The virtual member includes at least a portion of the graphics virtual surface. An emulating means for forming a tangible member which corresponds to the graphics virtual member is operatively interfaced with the computer system. Further, a means is operatively associated with the computer system for downloading the definition of the graphics virtual member in the data model to the emulating means. Using the downloaded definition of the graphics virtual member, the emulating means then forms a tangible member corresponding to the graphics virtual member.

The emulating means can include at least one numerically controlled tool means for forming a part and the tangible member can comprise an image tool means for forming one of an image copy or a complementary image copy of at least a portion of the article.

The respective means for defining the graphics virtual surface and for defining the graphics virtual member can include an operator interface means operatively associated with the computer system allowing for commands to be inputted to the computer system through the interface means.

The respective means for defining the graphics virtual surface and for defining the graphics virtual member can include computer assisted tooling design software means for defining a sequence of machine operations for machining a tangible part. Further, computer assisted tooling manufacturing software means is included for generating a sequence of machine operations. These are input to the tool means whereby the tool means forms a tangible part which is a mimic of the graphics virtual member in the data model of the article.

The computer assisted tooling design software means and the computer assisted tooling manufacturing software means can be augmented by interfacing them with a library or libraries which include a library of features each having a set of defined attributes describing each of the respective features and by interfacing them with a features based standards program for generation of material costs and manufacturing standards for each of the respective features of the features library.

The means for downloading the definition of the virtual member in the data model can include a means for including coordinate points on the virtual member to precisely locate the virtual member in a three dimensional coordinate system and the emulating means can include a means for translating the coordinate points on the virtual member to coordinating points on the tangible article, with the coordinating points on the tangible member precisely related to the graphics data model of the article.

Further features of the invention are achieved in a mold system for use in mold forming a part wherein the part has a surface as well as a plurality of target means for defining a precisely known spatial relationship in a three dimensional coordinate system. The plurality of target means are located on the surface for defining precisely known positions on the surface. Additionally, an image mold having an image of the part can be located on the surface in a known association with the target means. A complementary mold is formed from the image mold and the surface such that the complementary mold includes a complementary image of the part and further includes an image of the target means. The image of the target means on the complementary mold defines precisely known positions on the complementary mold which are precisely located with respect to the complementary image of the part on the complementary mold to precisely define the complementary image of the part with respect to the three dimensional coordinate system. Thus, when a part is molded on the complementary mold, points on the part are precisely known with respect to the three dimensional coordinate system.

A computer memory data model means of the part can be associated with the mold system. The data model means can include coordinate points in a three dimensional coordinate system. Further, a domain interface means can be associated with the mold system. The domain interface means compares the image of the part on the image mold to the data model means of the part by comparing the target means to the data model means coordinate points.

The domain interface means can include a microprocessor controlled measuring means for measuring target points in three dimensional space. In a preferred embodiment, the microprocessor controlled measuring means is an optical measuring means, as for instance a computer aided theodolite system.

The computer memory data model means can include a master data model of a part in a 3-dimensional graphics computer system with the domain interface means comparing a part molded on the complementary mold to the data model means of the part by comparing precisely known points on the part to data model means coordinate points.

The target means can include a plurality of precisely positioned targets located at precisely known locations on the surface. The targets include a plurality of precisely located and precisely dimensioned target openings formed in the surface and a plurality of target members sized and shaped to fit into the target openings.

The complementary mold can be formed of a plurality of layers of felted or woven fiber fabrics, mats or webs dispersed in a calcium oxide matrix, calcium sulfate matrix or mixture of calcium oxide and calcium sulfate matrix. Illustrative of the fiber layers are a plurality of fiber glass mats having randomly oriented fibers. The mats are dispersed in the matrix.

Further advantages of the invention can be achieved in a method of manufacturing a product which includes the steps of generating a data model means for forming a definition of the product where the data model means is generated as a data base in a 3-dimensional graphics computer system. This is followed by selecting as a data sub set at least a portion of the data model means with the data sub set including at least a portion of a surface of the product as defined in the data model. This, in turn, is followed by generating further data defining a virtual member which is operatively associated with the surface, which in turn, is followed by downloading the further data to a tool means for forming parts in response to input to the tool means. This in turn, is followed by operating the tool means with the further data as input to the tool to form a tangible element which emulates the virtual member and finally constructing at least a portion of the product in operative association with the tangible element.

The tool means can be selected as a tool from one of a set of tools consisting of numerically controlled machine tools, numerically controlled lasers cutters, numerically controlled robots, computer numerically controlled machine tools, computer numerically controlled lasers cutters and computer numerically controlled robots.

The data model means can include a wire model surface definition of the product. Further, the data model means can be generated to include coordinate means for precisely locating the definition of the product in a three dimensional coordinate system, and also can include in the data sub set coordinate means associated with the surface for precisely locating the surface in the three dimensional coordinate system.

By downloading at least a portion of the data sub set to a microprocessor controlled measuring means which can measure target points in three dimensional space and then operating the microprocessor controlled measuring means to measure three dimensional coordinating points on one of the tangible elements or the portion of the product, the measured coordinating points can be compared with the coordinate means associated with the surface in the data sub set to verify a relationship between one of the tangible elements or the portion of the product with the data model means of the product.

Further data can be generated to include the virtual member being formed of at least a plurality of virtual parts with at least some of the virtual parts including a surface intersecting point located in the surface. The further data can be generated to include an instruction set for each of the virtual parts. These are each downloaded to the tool means and the tool means operated to form a plurality of tangible element sub structures, each of which corresponds to one of the virtual parts. The element sub structures are then assembled into the element. The further data can be generated to include at least a portion of the virtual parts formed as virtual planes.

Additionally, by generating the further data to include coordinate points associated with the surface and then operating the tool means to form coordinating point markers on the tangible element, the coordinating point markers will correspond in a three dimensional coordinate system to the coordinate points associated with the surface.

Additional advantages can be achieved in a method of producing a tool which includes generating a data model of a product to be formed at least in part by a tool. The data model can be generated as a graphics data set in a data base in a 3-dimensional graphics computer system and can include coordinate points precisely locating the data model of the product in a three dimensional coordinate system. Next, at least a portion of the data model of the product is selected. This is followed by generating further data in the data base. This further data defines virtual images of component parts of a tool which interact against the selected portion of the product. The virtual image of the component parts of the tool are generated such that they include coordinate points in the coordinate system. The further data is then downloaded to a tool means for forming parts. The tool means is operated with the further data as input to the tool means to form the component parts of the tool and to locate coordinating points on at least one of the component parts of the tool. The tool means is operated such that the location of the coordinating points on the component parts of the tool correspond to the coordinate points in the coordinate system. The component parts of the tool are now assembled into the tool.

In a first embodiment, this can be facilitated by associating an operator interface means with the 3-dimensional graphics computer system. The operator interface means is used for inputting commands to the computer system. Commands are then input to the computer system through the operator interface means to generate the further data defining the virtual images of component parts of the tool.

In a further embodiment this can be facilitated by associating computer aided tool design software with the computer system and running the computer aided tool design software to generate the further data defining the virtual images of the component parts of the tool.

These embodiments can be facilitated by associating a data transferring means with the computer system where the data transferring means is for outputting, storing and transferring data between data devices. This is followed by downloading a memory copy of at least the further data from the data base to the transferring means to form a copy of at least the further data. This, in turn, is followed by transferring the copy of the further data from the transferring means to a numerically controlled machining tool means. The numerically controlled machining tool means is now operated with the copy of the further data to form the component parts of the tool. The transferring means can include a numerically controlled tape generating means for forming input tapes for numerically controlled machining tool means.

In further embodiments the transferring means can include further computer system means for generating input commands for direct numerical control of the machining tool means. In one embodiment of the invention the transferring means is a magnetic recording medium and the copy of the further data is magnetically stored on the magnetic recording medium.

Further advantages are achieved in accordance with a modified method of the present invention which provides for a method of manufacturing a product which includes generating a master design definition of the product as a graphics data set in a data base in a 3-dimensional graphics computer system. The master design definition can include coordinate points precisely locating this master design definition of the product in a three dimensional coordinate system. Next, at least a portion of this master design definition of the product is selected. Next, a further graphics data set is generated for defining virtual images of at least one forming tool for forming the selected portion of this master design definition of the product and at least one assembly means for assembling the selected portion of the product. The virtual images of the forming tool and the assembly means are both defined such that they include the coordinate points. The further data set is then downloaded to at least one tool means for forming parts in response to data inputted to it. The tool means is operated with this further data set as input to form at least portions of the forming tool and to locate coordinating points on these portions of the forming tool. The forming tool is then utilized to form at least a portion of a component part of the product which corresponds to the selected portion of the master design definition of the product and the component part of the product is then assembled with the assembly means.

The coordinating points located on the forming tool can be transposed to said component part formed on said forming tool and these can then be interacted with coordinating points formed on the assembly means to position the component part with respect to the assembly means.

The transposing of the coordinating points can be facilitated by utilizing a microprocessor controlled optical measuring means to measure the coordinating points on both the forming tool and the assembly means. The generation of the virtual images of the forming tool and the assembly means can be facilitated by associating an operator interface means with the computer system wherein the operator interface means includes a plurality of software macro means. Each of the software macro means are for defining a discrete operation of the tool means. Further, the operator interface means would include means for choosing a sequence of these software means.

Further in accordance with the invention, a method of manufacturing an article includes constructing a definition of the article in a computer memory and forming at least one component part of the article in accordance with the definition. A microprocessor controlled measuring means for measuring objects, as for instance a microprocessor controlled theodolite system, is associated with the computer system and is operated to measure points on the component part to compare the component part to the definition.

These and other features, advantages and objects of this invention are disclosed in detail herein with reference to the following detailed description and claims, when taken with the accompanying drawings, of which:

BRIEF DESCRIPTION OF THE DRAWINGS

FIG. 2-b is an isometric view of a representational drafting board with a drawing for one of the component parts of this master/tool;

FIG. 2-c is a representational tape for a numerically controlled machining tool for forming the component part;

FIG. 6 is an isometric view of a tool utilized during the manufacturing process of FIG. 3;

FIG. 7 is an isometric view of a surface and portions of the tool of FIG. 6 during assembly of the tool of FIG. 6;

FIG. 8 is a fragmentary isometric view showing details of certain of the components of FIG. 6;

FIG. 9 is an isometric view of the tool of FIG. 8 showing stepwise modifications of that tool to convert it into a further tool;

FIG. 10 is an isometric view of a further tool utilized during the manufacturing steps of FIG. 3;

FIG. 11 is an isometric view of an alternate embodiment of a tool utilized during the manufacturing steps of FIG. 3;

FIGS. 12-a and 12-b are elevational views of certain components which are related to components seen in FIGS. 4 and 5;

FIG. 12-c is a schematic isometric view of a representational numerically controlled milling machine and a part thereon;

FIGS. 12-d, 12-e and 12-f are schematic elevational views of certain components which connect the structures of FIGS. 12-b and 12-c;

FIG. 13 is an isometric view of a further tool utilized for the construction of aircraft using the manufacturing process of FIG. 3;

FIG. 14 is an isometric view of assembly steps during the manufacturing of an aircraft using the manufacturing process of FIG. 3;

FIG. 17-a is an isometric view of a tool similar to the tool of FIG. 10 including a part located on this tool;

FIG. 17-b is an isometric view of the part of FIG. 17-a exploded away from the tool of FIG. 17-a;

FIG. 18 is a schematic flow sheet of a process of the invention;

FIG. 19 is an isometric view of certain positioners and targets utilized in the process of other of the figures;

FIG. 20 is an exploded isometric view of an aircraft part and a vacuum mill fixture utilized in machining of that part;

FIG. 21 is an bottom plan view of a component of the vacuum mill fixture of FIG. 20;

FIG. 22 is an isometric.view of a component of the vacuum mill mixture of FIG. 20;

DETAILED DESCRIPTION OF THE INVENTION

While the methods and apparatus of this invention can be applied to the manufacturing of many different articles, for the purposes of illustration, the invention will be described utilizing an aircraft system as the basis of the description of the invention. In utilizing an aircraft system, the terminology "mold line" will be considered as being synonymous with the outside skin or exterior configuration of an aircraft. It is of course realized that a "mold line" could also be applied to further surfaces other than just the outside skin. The terminology "pulled" will be in reference to making a copy or a transfer of something off a mold by molding the copy on a master model.

Prior to describing this invention, a more detailed analysis of certain aspects of the currently practiced methods of manufacturing aircraft structures will facilitate the understanding and appreciation of the invention. As was mentioned in the Background of Invention section of this specification, current aircraft manufacturing practice relies on the use of "master models" as the ultimate reference for the production of and fit of the component parts of the aircraft. These "master models" are full scale physical structures or models which are manufactured to mimic the engineering data as closely as possible. Because of the methods used in their construction and their size, it is very difficult, costly and time consuming to construct these "master models" to the tolerances necessary for an aircraft system.

Figure 1:
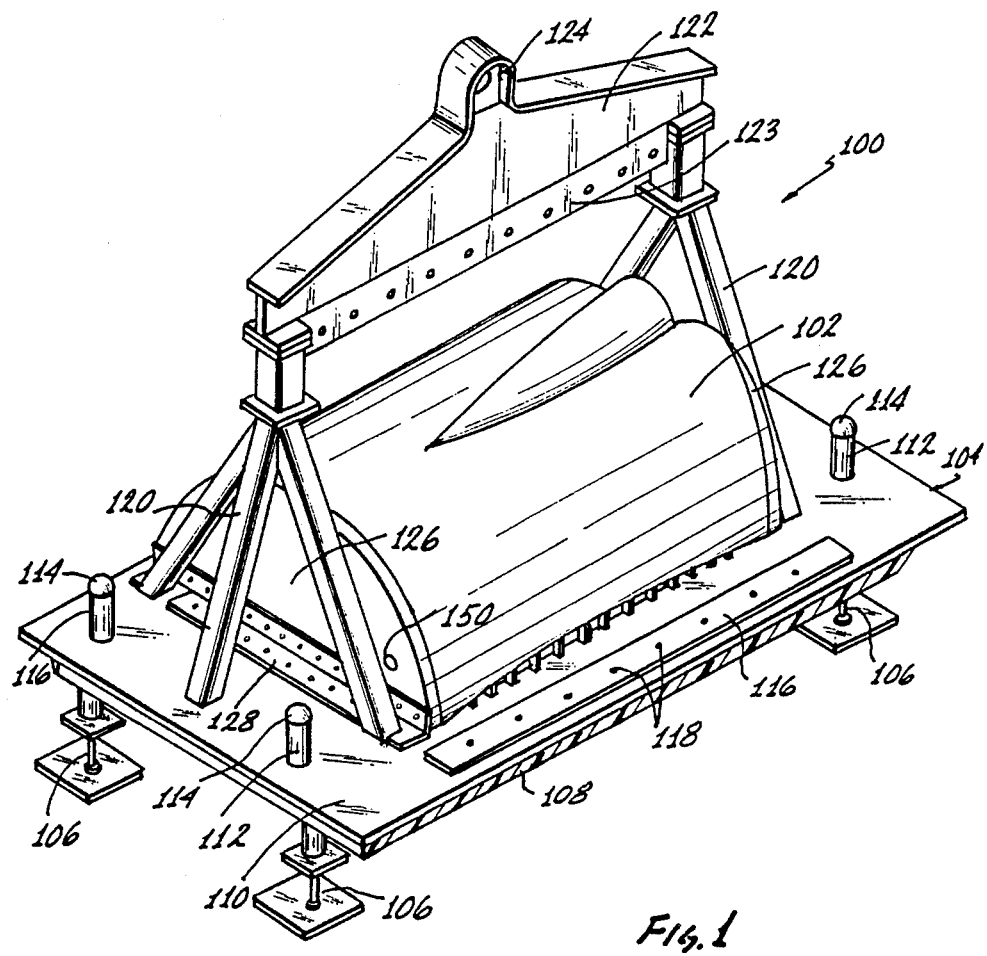
FIG. 1 is an isometric view of a prior art master tool utilized in the construction of an aircraft.

FIG. 1 illustrates a typical "master model" which would be utilized in presently practiced methods of aircraft manufacture. The master model 100 of this figure duplicates a major section of the fuselage of a typical high performance aircraft. The section of the fuselage illustrated by master tool 100 is essentially the upper half of the fuselage aft of the pilot cockpit and forward of the tail section. The master model 100 includes a major portion of the mold line of the aircraft and, as is evident from FIG. 1, includes complex surface characteristics The master model 100 includes many components, all of which are necessary to its construction and stability. These components allow it to serve as the "master" reference for individual components of the aircraft. Master female molds (not separately shown or numbered) will be "pulled" from different sections of the master model 100 for the formation of the individual components which will make up the portion of the aircraft represented by the master model 100.

Before the master female molds can be formed against the master model 100, reference marks must be meticulously and time consumedly laid out by hand and eye on the mold line surface 102 of the master model 100 utilizing typical classical measuring instruments such as levels and scales and hand operated transits.

The master model 100 is constructed with a base 104 which is supported on legs collectively identified by the numeral 106. The base 104 has to be formed as a structure which will support and hold the remainder of the master model 100 as stable and permanently fixed as possible over the life time of the master tool. Typically, the base 104 includes supporting I beams 108 attached to a steel base plate 110. Generally the steel base plate 110 is of a thickness of one inch or greater. As is evident, just the base 104 itself constitutes a heavy massive structure.

Permanently attached to the base 104 are a plurality of "candlesticks" collectively identified by the numeral 112 which are used to support optical targets such as cup mount targets 114. The targets 114 are used as target points to "sight" with a hand operated optical device to level the base 104 and to serve as reference points on the master model 100. The legs 106 are adjustable for initially leveling the base 104 during construction of the master model 100.

Also located on the base plate 110 is a reference plate 116 which has a plurality of holes collectively identified by the numeral 118 positioned at precise locations in the reference plate 116. These are utilized to correlate the master model 100 with other structures such as adjoining master tools (not separately shown or identified) or the above mentioned female masters "pulled" from the master model 100.

As can be observed from the above described structure, which as yet does not include the mold line surface, the master tool is a substantially large and heavy structure. Pillars collectively identified by the numeral 120 are fixed to the base 104 at both ends of the master model 100. A detachable beam 122 which can be connected to the pillars 120 supports a further reference plate 123. A ring 124 is located on the beam 122. The ring 124 serves as an appropriate attachment point for a derrick or crane to move the beam and reference plate 123 from the remainder of the master model 100 when it is necessary to do so to have direct access to the mold line surface 102.

Figure 2:
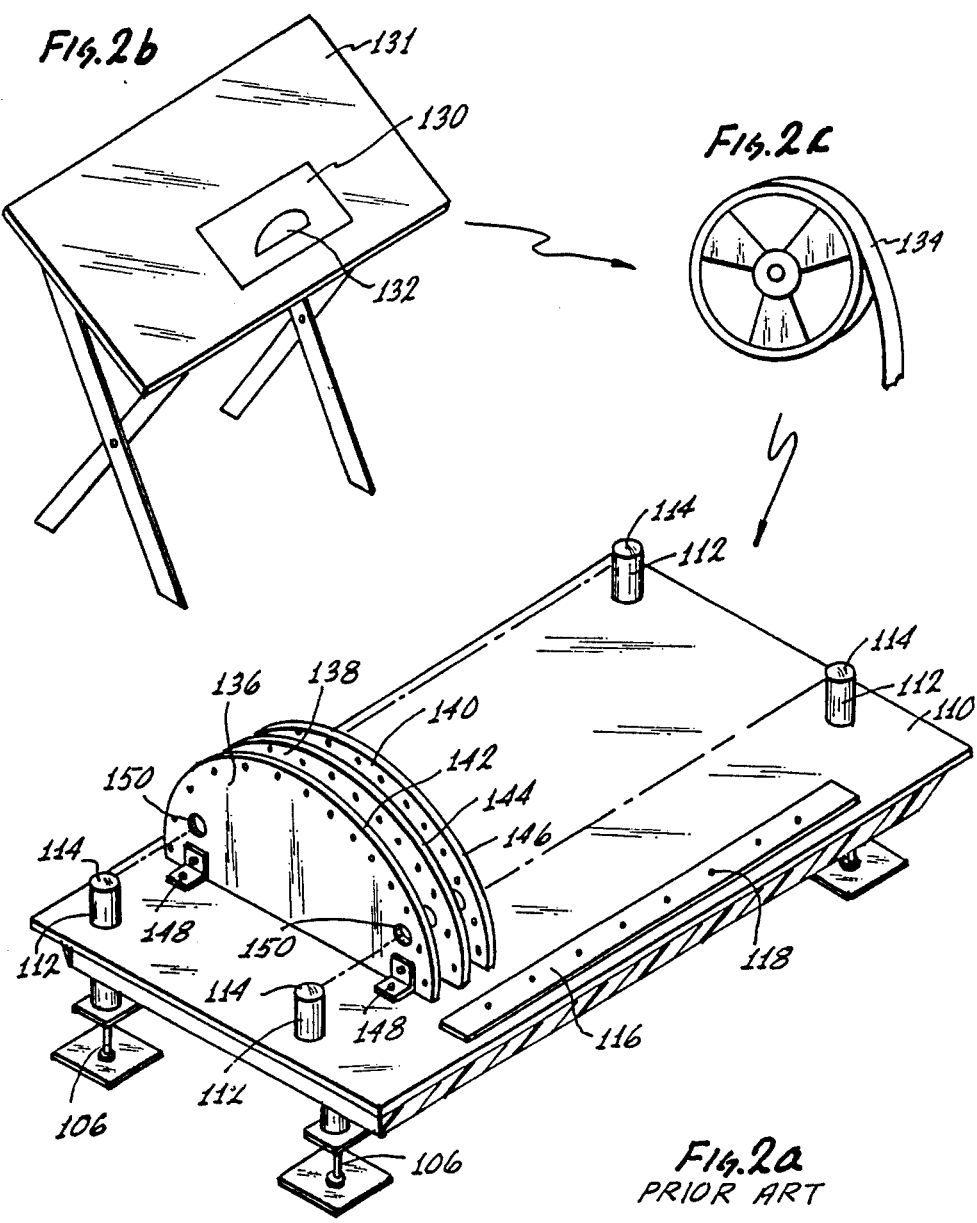
FIG. 2-a is an isometric view of portions of the master tool of FIG. 1 seen during the construction of this master tool.

Prior to describing the formation of the mold line surface 102 on the master model 100 as per FIG. 2, two additional structures are evident on FIG. 1. These are the two end plates collectively identified by the numeral 126. The end plates 126 are fixedly attached to the base plate 110 with channels 128. As is the base plate 110, the end plates 126 are also formed of heavy plate. The end plates abut against the pillars 120 to give stability against lateral movement along the longitudinal axis of the master model 100. Since all of the components of the master model 100 described so far are made of metal, they are subject to thermal instability.

Referring now to FIG. 2 the formation of the mold line surface is described. In FIGS. 1 and 2, like numerals will be utilized to identify like parts common to the two figures.

The mold line is formed using a plurality of "profile boards" which represent sections through the mold line surface. FIG. 2-b shows a drawing 130 on a drafting board 131 of one such profile board 132. The drawing 130 would be prepared by taking a section cut off of a master assembly or sub-assembly drawing of the aircraft under construction. As an aid in preparing the 2-dimensional drawing 130, CADAM, a 2-D graphics drawing aid software program, (available from the Lockheed Aircraft Corporation) can be used. In any event, once the drawing 130 for the individual profile board 132 is prepared, it is passed on to an NC programmer.

NC (numerically controlled) machine tools were first demonstrated about thirty years ago. Around 1960 they began to be widely used. An NC machine tool is given a step by step set of instruction codes. These codes direct movement of an NC machine tool during machining of a part on the NC machine tool. Since the codes utilized by the NC machine tools are very complex, certain software, such as the APT-AC Numerical Control Processor Program available from the IBM Corporation (International Business Machine Corporation, Armonk, NY), has been developed to assist in the code generation.

The APT-AC processor is a computer application program that accepts as input user-oriented language statements that describe the NC operations to be performed. The NC processors produce code termed cutter location data (CLDATA). The CLDATA is used as input to a postprocessor which produces the code on a mylar tape for the particular NC machine tool.

The NC programmer inputs the data (whether it be hand generated data or CADAM data) of the profile board 132 specified by the drawing 130 to the APT-AC processor. While the APT-AC processor assists the NC programmer, the NC programmer must still determine all of the parameters for the tooling operation. This is a time consuming task requiring great skill. In any event, the APT postprocessor generates a mylar tape 134, shown in FIG. 2-c, which is fed to an NC machine tool to direct the cutter path of the machine tool.

Shown in FIG. 2-a are three individual profile boards 136, 138 and 140 which have been cut on an NC machine tool. They each contain one profile edge, edges 142, 144 and 146 respectively. These profile edges have been cut to a specified tolerance on the NC machine tool to match, as accurately as possible, the profile specified for the "profile board" (as for instance, profile board 132) on the respective drawings which defines the respective profile board. Other than the profile edges 142, 144 and 146, the remainder of the profile boards 136, 138 and 140 are not cut to an exacting tolerance but only to a general tolerance.

The profile boards are now positioned and fixed one at a time onto the base plate 110. After the base plate 110 is assembled, leveled, and the measuring targets 114 located thereon, profile board 136 is exactly positioned on the base plate 110 independently locating the profile surface 142 in the X axis, the Y axis and the Z axis. It is then fixed in place on the base plate 110 with angle brackets collectively identified by the numeral 148. Note that the profile board 136 (as well as all other profile boards) must include sight holes, collectively identified by the numeral 150, in order to optically align between targets 114 on the respective ends of the master model 100.

Once the profile board 136 is positioned, its position must be independently verified by an audit by inspection personnel. This is necessary because of the criticality of the master model 100 to the finished aircraft throughout the life time of the production of the aircraft or replacement parts for that aircraft. When all are satisfied that profile board 136 is positioned as accurately as possible in all of the X, Y and Z axes, the next profile board 138 can be placed.

As with the first profile board 136, profile board 138 must be positioned individually so that its profile surface is correctly located in all of the X, Y and Z axes, and to insure that it is correctly located with respect to the profile board 136 (or boards) already in position. Profile board 138 is then fixedly attached to the base plate 110 with angle brackets 148, and its position verified by an independent audit by inspection personnel. This is repeated for the profile board 140 and all remaining profile boards. As is evident, this is a time consuming and, therefore, expensive process. Long lead times are necessary to construct these master tools such as master tool 100.

Once all of the profile boards are located on the base plate 110 and certain supporting rods and supporting mesh added (as will be described in greater detail below in discussing an embodiment of the invention), plaster is "faired-in" between the profile boards by using the profile boards as a guide for a fairing tool pulled across the profile edges of the profile boards filling the space between the profile boards with plaster. This forms the mold line surface 102 of the master model 100.

The mold line surface 102 master model 100 is then once again hand inspected using splines and feeler gauges. This inspection, however, is not an inspection back to engineering specification. It is only to insure that there are not high or low areas on the mold line surface 102 of the master model 100. If the master model is satisfactory, its surface is marked with identifying locations or holes which will be used when other tools are "pulled" from the master model or are checked against the master model. These surface identifiers must be added to the mold line of the master model after this mold line has been established by the above noted process. Typically, fabrication of the base, establishing the reference system on the base, and placement of the profile boards can represent from 50% to 75% of the labor cost associated with production of a master model.

As is evident from the above construction, the master models are very heavy, and anything which must be done in conjunction with them must be done at their storage site. Also they must be made large enough to represent a sufficient portion of the surface of the aircraft to establish the reference for all parts related to that section which have to fit with respect to one another. However, even with very large master models, other tools must be made which span across each two adjacent masters to insure proper orientation of one master model to its adjacent neighbor. A simple configuration change on one master model (such as moving only one hole) can cause rework of two or more master tools before a production tool can be reworked to include the change.

Because of their size and weight, excepting very small master tools for parts such as an intake duct system, master models and other master tools generally cannot be oriented in any orientation except the orientation they are constructed in. Because it must be used to orient assembly jigs, by necessity a gauging master normally must be formed in aircraft orientation. This aircraft orientation is not always the best orientation for ease of assembly of this master tool, nor the best orientation for the formation of other tools from it.

Further, only a limited number of individuals can work in the space around a master tool at one time. Therefore, the construction of them cannot be facilitated by the addition of added personnel. Nor can more than one operation at a time be done with a master tool. As for instance, if a gauging master is being used for assembly jig orientation, it will not be available for use in making or checking other assembly tools or assembly molds. Heretofore no other system has been available to replace or substitute for the master tools.

The present invention dispenses with the necessity of the hard master tool concept. In its stead, it utilizes a "data model" of a structure which resides in computer memory or computer storage. This data model provides an engineering definition of the structure as well as additional information which is added to the data model. Since the data model resides in computer memory, for any and all operations in designing, manufacturing or assembly associated with the structure, access is always made back to the computer memory definition for information.

For the want of a mnemonic identifier, the terminology "data model" is primarily utilized in this specification. Interchangeably, "computer memory definition", "computer memory master design definition", "engineering electronic model", "data base graphics model", "assembly data model", "3-D graphics model" or even "soft master" might be considered equivalent terminology for the "data model".

Further, for the purposes of this specification the terminology "computer memory" or "computer storage" is defined to be that of the typical definition utilized in computer science. The terms "memory", "storage" or "store" are considered synonyms. "Memory" or "storage" can be main or active memory in the usual computer science sense, or secondary memory also in the usual computer science sense. Except during active interfacing of the memory definition (the data model) of the structure to be built, for most purposes the memory definition (the data model) of the structure will exist in the normal secondary memory, i.e. magnetic drums, disks, tapes or optical memories or chip memories like ROM's, PROM'S, virtual RAM memories, etc.

After input of the original engineering definition of the structure into the data model in computer memory, access back to the data model in computer memory can be made for all types of aircraft manufacturing procedures such as: the production of bonding tools which are used to form and cure composite parts; for the production of assembly jigs for orienting component parts of the structure to one another; for the production of machined tools; for material ordering and processing; for the auditing or inspection of component tools and parts; for the assembly of component tool parts; for the assembly of the component parts into the aircraft structure; and other operations and procedures as will become evident from this specification.

In addition to the engineering definition of the structure to be built, the data model can also include further information associated with the structure which is added to the data model throughout the manufacturing steps of the structure. With each step utilized in the entire manufacturing process of the structure, the same dynamic computer memory definition of the structure is utilized. This computer memory definition is not subject to environmental conditions and it can be shared or duplicated so that it is available to many users at one time.

A data model of a structure of this invention inherently includes an exact engineering description of the structure since, among other things, it is the engineering definition of the structure. This is opposed to the master tool concept which was fabricated as best as possible to "represent" the engineering definition of the structure. And contrary to the hard master tool concept, a change can be made to the data model definition of the structure and be reflected through the totality of the manufacturing process of the structure.

The data model replaces the various master models and other master tools, and in their stead it uses a single mastering source for all of the manufacturing processes and assemblies. Further, since component parts of the data model can be utilized by many users at the same time, parallel manufacturing and assembly can be achieved. Thus, as opposed to the old hard master concepts, an assembly jig can be constructed concurrently with or even prior to a bonding tool since neither is dependent on the other for its construction and assembly. This is diametrically opposed to the old hard master concept wherein a gauging master was necessary before the assembly jig could be completed.

With this invention, in addition to the engineering definition of a structure, data representing actual physical components parts, tools or jigs, as formed, can also be stored as a component part of the data model with the engineering definition. Because of this, all deviations are always known for archival and quality control purposes. Additionally, if desired, the actual engineering definition could be changed to reflect changes or upgrades in component parts, and these changes would be propagated to other tools, jigs, assembly instructions, and the like.

The data model of the structure is initiated in an appropriate computer system by first entering the engineering definition of the structure. Virtual tools necessary to fabricate the component parts of the structure are then also defined in the data model. These data model definitions can then be downloaded to emulating means for the production of the component tool parts. Further, these definitions are downloaded to domain interface means for comparing the tools, assembly jigs and the like, and actual physical component parts, to the data model definition of the structure or the data model definition of associated tooling structures which are also created in the data model. The definition downloaded to the domain interface means can also be utilized for assembly of the component parts into the structure or parts of the structure.

While these concepts could be utilized to manufacture a variety of different component structures, for the remainder of this specification only the manufacture of aircraft will be described, it being understood that similar concepts and principles would likewise apply to other structures. Since composite materials are assuming greater and greater importance in aircraft manufacture, the construction of tools for forming bonding tools, and the bonding tools themselves, will be used as a first illustration of the invention.

The tools for forming bonding tools and bonding tools represent both direct image copies of the mold line of an aircraft and complementary image copies. As a further illustration of the complementary image of the mold line of an aircraft, a further embodiment will illustrate the construction of an assembly jig utilizing the principles and concepts of the invention. Additionally the construction of a vacuum mill fixture will be further utilized to illustrate the invention.

Figure 3:
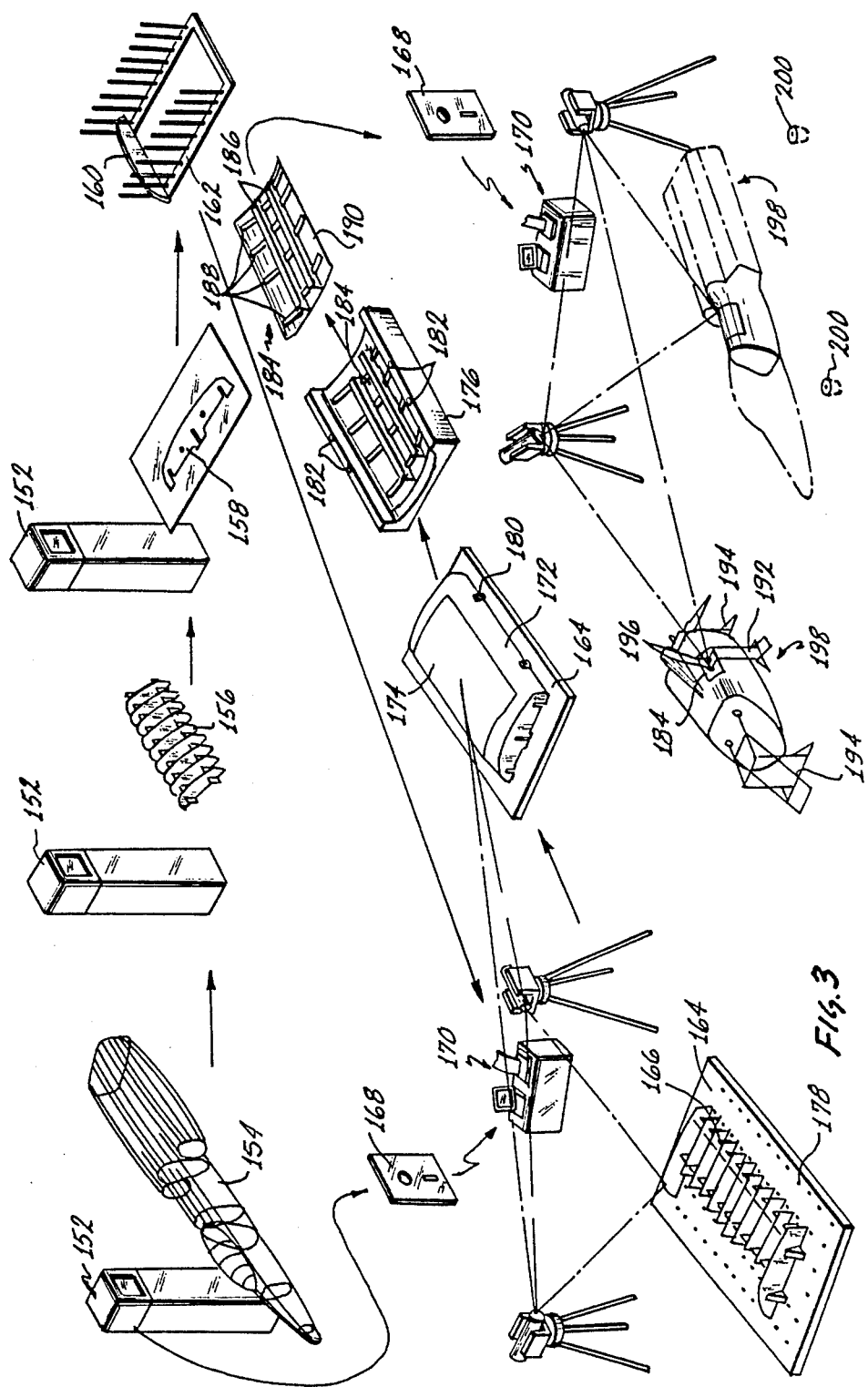
FIG. 3 is a schematic flow chart showing isometric views of certain devices and components utilized during a manufacturing process of this invention.

FIG. 3 schematically shows the overall construction of an aircraft from conception to finish as practiced with this invention. Certain of the steps and structures pictorially presented in FIG. 3 will be expounded upon in greater detail and referenced in other figures of the drawings. Where indicative of continuity between different figures, "like" numerals will be utilized to identify like or "similar" parts. When certain structures or processes are described in greater detail than as described in FIG. 3 (or in later generic Figures), further numerals will be utilized to identify parts similar to those shown in FIG. 3 or other figures.

In the upper left hand corner of FIG. 3, a computer system 152 is utilized to create an engineering definition or master design definition of an aircraft 154 in a data base in the computer system 152. At this point in time, the aircraft 154 is only a virtual aircraft since it only exists as the engineering definition in a data base in the computer system 154. This forms the initial entry into the data model for the aircraft structure.

The computer system 152 is chosen as a computer system running a 3-dimensional graphics software program and, as such, the data model or master design definition is a 3-dimensional (for brevity hereinafter referred to as 3-D) graphics design definition. Such a definition will include coordinate points precisely locating the data model or master design definition in a 3-D coordinate system.

This is typically achieved in a 3-D graphics software program using X, Y and Z coordinate points as well as appropriate locating vectors where necessary. Typically, a 3-D graphics software program will utilize appropriate data structures for defining particular points in the data base of the graphics program. By utilizing algorithms in the graphics program, other points in the structure can be defined and generated by the graphics program. Typically, the graphics program will utilize appropriate vector and matrix routines whereby a structure can be rotated or otherwise moved in computer memory and can be dimensioned whereby the coordinates for any one point are known with respect to other points.

In any event, the data model will be created in the computer system 152 and stored in an appropriate file or files in a data base in computer memory. Further, a data set or data sets of this data model, or portion thereof, from the data base file or files can be downloaded from memory through appropriate output devices associated with the computer system either as memory words (that is the particular word size in bytes for the computer system) on appropriate data buses or input/output (I/O) data ports, as appropriate memory images (magnetic or optical data read/write data transfer), or by creation of hard copies of the same (printer output, etc.). Additionally, many users can be networked into the data model for parallel interaction with the data model.

As is shown and discussed in greater detail below in referring to FIGS. 4 and 5 and other figures, an appropriate component section of the aircraft structure is selected and a virtual tool 156 for constructing the selected section is defined in the data model within the computer system 152 (or other equivalent computer system). A virtual component part 158 of the virtual tool 156 is further defined in the data model.

The virtual part 158 and the remainder of the parts of the tool 156 (also defined in the data model in a like manner) are constructed by an emulating means (not separately shown or numbered in FIG. 3) to form a corresponding actual tangible part 160 and other corresponding parts not separately shown or numbered. The part 160, along with the remaining corresponding parts, are collected in a kit rack 162 for assembly. When all of the component parts are collected in the kit rack 162 for assembly, they are assembled together, as for instance, on a grid surface 164 into bonding tool formation precursor tool 166.

A copy from the data model of the data set containing the definition of the virtual tool 156 is downloaded from the computer system 152 for transfer, as is represented by floppy disk 168. The data set for the virtual tool 156 is transferred to a computer aided theodolite system 170, as for example via the floppy disk 168.

The computer aided theodolite system 170 and the floppy disk 168 serve as one example of a domain interface means for comparing the tangible tool 166 to its data model definition defined by the virtual tool 156 in the data model. As will be described in greater detail below, this is done utilizing 3-D coordinating points on the tangible tool 166 or the surface 164, or both, and comparing them to the coordinate points in the 3-D coordinate system of the data model in the data base created by the 3-D graphics software running on the computer system 152.

The surface of the bonding tool formation precursor tool 166 is faired-in with plaster to complete the bonding tool formation transfer tool 172. This forms a mold line 174 which is an image of a section of the virtual aircraft 154 in the data model. This section of an aircraft is constructed via a tangible tool (the tool 172) which corresponds to a virtual tool, virtual tool 156, in the data model. The virtual tool in turn corresponds exactly to the engineering specification of the aircraft in the data mode.

As with the bonding tool formation precursor tool 166, the mold line image 174 on the bonding tool formation tool 172 can be compared to its virtual counterpart, a virtual surface on the virtual aircraft 154 in the data model by interfacing between the data model and the surface 174 with the domain interface means characterized by the computer aided theodolite 170 and the floppy disk 168.

By building the bonding tool formation precursor tool 166 on a surface which has known spatial identifiers 178, i.e. a grid pattern standard on it, and coordinating, via the computer aided theodolite system 170, these spatial identifiers 178 with the data model, the precise location of coordinating points on the bonding tool formation tool 172 and these spatial identifiers 178 can be established and can be referenced to the data model.

A bonding tool 176 can now be "pulled" off of the bonding tool formation tool 172. However, if the bonding tool 176 is pulled not only from the bonding tool formation tool 172 but is also partially formed against the surface 164, and if prior to "pulling" the bonding tool 176 off of the bonding tool formation tool 172 and the surface 164, precision target pins 180 are inserted in the spatial identifiers 178 on the surface 164, then when the bonding tool 176 is formed on both the bonding tool formation tool 172 and the surface 164, the target pins with assigned values will transfer precise location holes 182 to the bonding tool. These location holes 182 can now serve to reference the bonding tool 176 to the data model.

Since the spatial identifiers were coordinated to the data model and the 3-D coordinate system in which the virtual aircraft 154 is defined, when they transfer via the target pins 180 to the bonding tool 176, they become target holes 182 with known values. That is, the target holes 182 are precisely known in 3-D space (know in a X,Y,Z coordinate system) with respect to the master design definition of the virtual aircraft 154. Since the target holes 182 are known in 3-D space, the computer aided theodolite system 170 can be used to locate any further points which are desired on the surface of the bonding tool 176.

Now when a composite component part 184 is formed on the bonding tool 176, component pieces of the part 184, such as longerons, collectively identified by the numeral 186, and ribs or stiffeners collectively identified by the numeral 188, can be precisely positioned on a composite skin 190 via the target holes 182 or other identifiers (discussed below) on the bonding tool 176.

In the same manner as the virtual tool 156 was defined in the data model in 3-D computer graphics, a virtual assembly tool (not separately shown or numbered on FIG. 3) could also be defined. Instead of it containing a surface (a virtual surface corresponding to the skin panel 190), it would include locator points abutting against or cutting into that surface (points complimentary to or intersecting that virtual surface). In any event, it would be defined, and from its definition component parts would be machined and built in a manner equivalent to the bonding tool formation precursor tool 166 to form an assembly jig 192.

This assembly jig 192 is used in conjunction with other assembly components, collectively identified by the numeral 194 in FIG. 3, to assemble component parts, including the component part 184, into an aircraft structure 198. The positioning of the component part 184 on the assembly jig is done utilizing the computer aided theodolite system 170 and a data model data set on the floppy disk 168. To facilitate this, locators 196 are located on the assembly jig 192 in known positions in 3-D space (in a manner as described for the spatial identifiers 178 or target rod 180) and the computer aided theodolite system 170 is used to align target points or coordinating points on the component part 184 with corresponding locators 196 or coordinating points on the assembly jig 192.

Finally, as is seen in the lower right hand corner of FIG. 3, the totality of the aircraft 198 is assembled with the aid of a copy of the data model containing the definition of the virtual aircraft 154 which has been downloaded as a data set to the floppy disk 168 and inputted into the computer aided theodolite system 170. To facilitate this, known spatial grid points, collectively identified by the numeral 200, (equivalent to the spatial identifiers 178) can be located within the assembly cell as for instance in the assembly bay floor and entered into the 3-D coordinate system of the computer aided theodolite system 170.

The aircraft 198 is assembled by utilizing virtual images of the target points 200 in the computer memory as coordinating points between the virtual image (the virtual aircraft 154 in the data model) and actual aircraft 198. This is done by coordinating the virtual images of the target points 200 to the tangible target points 200 via the computer aided theodolite system 170. The virtual images of the target points 200 are downloaded as a data set from the data model to the floppy disk 168. The floppy disk then serves as the transfer medium for input of these virtual coordinating points to the theodolite system 170.

Figure 4:
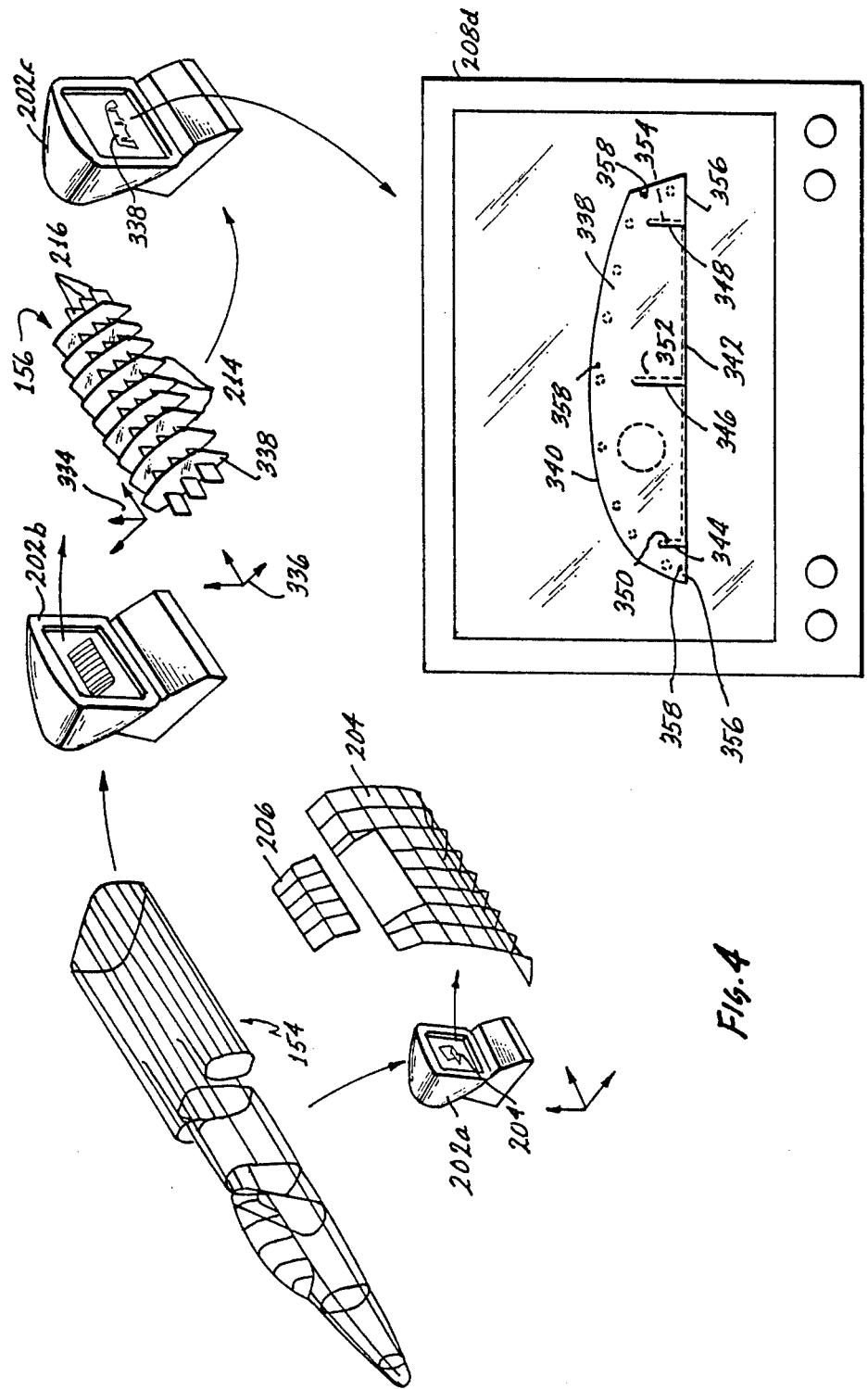
FIG. 4 is a schematic flow chart similar to FIG. 3 showing isometric views of some of the components of FIG. 3 as well as additional components including an enlarged elevational view of one of these components.
Figure 5:
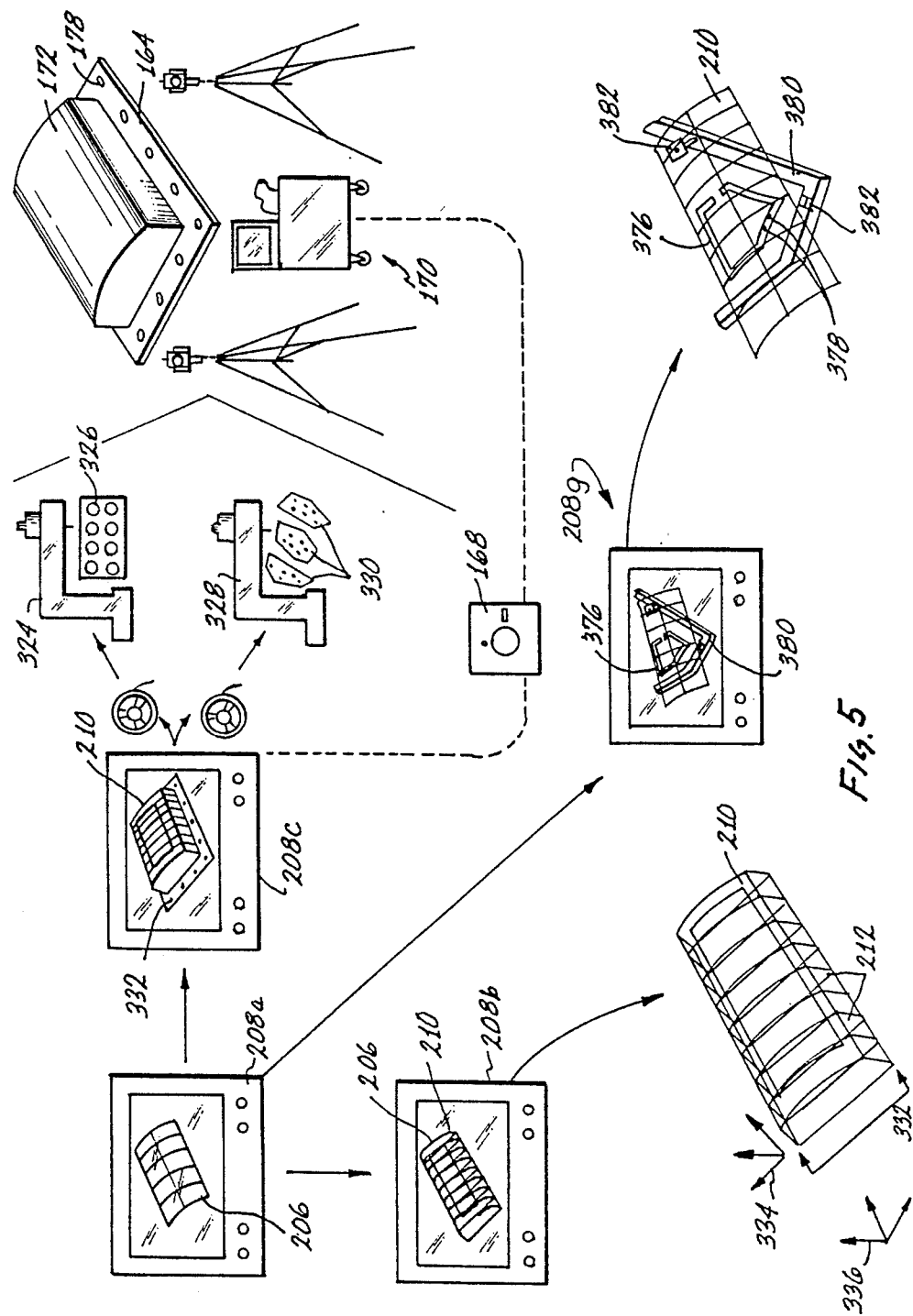
FIG. 5 is a schematic flow chart similar to FIGS. 3 and 4 showing isometric and elevational views of certain of the components of FIGS. 3 and 4 as well as further components.

Referring now to FIGS. 4 and 5, as noted, where appropriate, like numerals will be utilized in describing like and nearly alike virtual and tangible parts seen on FIG. 3.

The virtual aircraft 154, shown in both FIGS. 3 and 4, is constructed utilizing an interactive 3-D graphics CAD program. Normally a design engineering team would construct the virtual aircraft 154 using a CAD program or programs and interface devices such as light pens, function key boxes, graphics or digitizing tables, tablets or boards, or a computer mouse. Of course all of these would also be utilized in conjunction with keyboard entered commands. Insofar as CAD programs of this type are commercially available and the above interface devices are also, a detailed description of the operation of a particular program or device is not deemed necessary to the understanding of this invention.

A 3-D CAD program or programs, such as CATIA (IBM Corporation) or NCAD and NCAL (Northrop Computer Aided Design and Northrop Computer Aided Lofting, Northrop Corporation, Hawthorne, CA) would be suitable to define the master engineering definition of the aircraft 154 in 3-D graphics in the data model. This master engineering definition is created and stored in a file or files in a data base. In inputting the engineering definition, other software can be used to assist in the design chores, for instance, a loft data program like NORLOFT (Northrop Corporation). In addition, the above referenced CADAM 2-D graphics software could also be utilized to produce dimensioned drawings if such drawings were desired for manufacturing purposes. Suggested as other CAD 3-D design software might be CADD (McDonald Douglas Corporation) or other appropriate CAD software.

The master engineering definition, or other entries in the data model, would be done on a suitable computer system such as an IBM 3090-200 mainframe, an IBM 3081 mainframe, or an IBM 4381 mainframe using an appropriate operating system such as the IBM MVS-XA (Multi-user Virtual Storage-Extended Architecture). Engineering data or other data input to the data model would typically be done at an appropriate work station such as an IBM 3278 terminal or an Adage, Sun or Silcon Graphics workstation equipped with an appropriate interface device for instance an Hewlett-Packard 3090 or 5080 emulator.

The workstation or workstations would be appropriately interfaced with the mainframe using appropriate software such as the IBM TSO (Time-sharing Option) software which allows both downloading and uploading between the respective computer devices or the above referenced 3090 or 5080 emulators. Such an interface provides the workstation with a microcomputer working environment while still providing access to the mainframe library allowing the generation and use of a "single source" information data base for the data model.

Other CAD systems such as the ME Series 30 CAD (Hewlett-Packard) are designed to run on specific computer hardware such as Hewlett-Packard mini-computers while CAD software packages such as AutoCAD (Autodesk, Inc.) are available for micro-computers such as an IBM AT computer running a DOS operating system on an Intel 80286 microprocessor and 80287 math coprocessor and on similar machines which utilizes the more advanced Intel 80386 and 80387 processors.

The master engineering definition is created in 3-D graphics such that it includes appropriate coordination of the engineering design in a 3-D coordinate system. This design definition could be as a wire model or could utilize solid surfaces to form a hidden surface type model. Or it could include both of these as would be included in the CAD design software package.

The data model is initialized by inputting the master engineering definition of the aircraft in the 3-D graphics program as a data set or data sets (and stored as a file or collection of related files or other like association) in a data base (or other like software) in the computer system. After input or uploading of the engineering definitions and any other information which forms a part of the data model, as is discussed below, copies of the totality of the data model or portions thereof as data sub sets can be downloaded (for instance, as individual files) from the mainframe library in an appropriate manner using, for instance, the above mentioned emulators or TSO software to download from the above mentioned computer system to further computer systems or data interfacing devices.

Once the data model is established, it can be interfaced either through a human operator or through other software. Initially for the purposes of describing the steps in interfacing with the data model, the interaction with a human operator (with the assistance of certain described software) will be described. This will then be supplemented with the description of a system wherein a greater degree of automation is effected.

A design engineer, programmer, or other operator using the data model or a portion of the data model and interacting with the computer system downloads the data model or a portion of it (normally by downloading files containing this data) and interacts with the data model or portion thereof with the use of the above noted operator interface means, i.e. light pens etc., at work stations 202-a to 202-c.

The operator selects a portion of the total structure, as for instance port side fuselage section 204 of FIG. 4. In this figure these parts, as well as others, have been exploded from the workstation 202-a, 202-b and 202-c to show them in greater detail. In FIG. 5 and other figures, select components are seen in greater detail on a screen 208-a to 208-g of the workstation 202-a to 202-c. From this major structural component, i.e. section 204, the operator taking advantage of the lofting lines and other design data in the data model selects a particular component part such as virtual skin panel 206.

Referring now to FIG. 5, the loft lines of the virtual skin panel 206 in workstation screen 208-a suggest suitable profile cuts which can be used to define the skeleton for a virtual tool such as the virtual tool 156 of FIG. 3. In workstation screen 208-b, the individual loft lines each form a locus in a virtual surface 210 which includes the virtual skin panel 206. Using some of these loci (as for instance the ones traversing from the upper left to the lower right in workstation screen 208-a of FIG. 5), or other lines, curves etc. the operator might create using the above noted operator interface means, the operator extends these loci in the surface 210 beyond the trim line of the virtual panel 206 and then away from the panel 206 in the direction of the interior of the virtual aircraft 154 and truncates them in a plane such that they form a plurality of virtual planes 212 which intersect or cut into the virtual surface 210.

Since the planes 212 define profile cuts, this has generated a series of virtual profile boards collectively identified by the numeral 214 of the virtual tool 156 of FIG. 4. These virtual profile boards 214 define the virtual surface 210 which includes the virtual part 206. Referring back to the work station 202-b of FIG. 4, the operator adds several virtual connector boards collectively identified by the numeral 216 to locate and orientate the profile boards 214. All of this is done using the 3-D interactive graphics software running on the computer system.

It is evident that the above steps are susceptible of being coded to create computer aided tooling design software. This software would utilize the computer system itself to create a tooling design. One such computer aided tooling design software is a program identified as TCAD (Tooling Computer Aided Design, Northrop Corporation, Los Angeles, CA.). TCAD is augmented by a tooling manufacturing program identified as TCAM (Tooling Computer Aided Manufacture, Northrop Corporation, Los Angeles, CA).

Leaving certain details of the virtual tool 156 aside for the moment, the operator (or equivalent software such as the TCAD—TCAM software) has now created the virtual tool 156. The graphics definition of the virtual tool is stored in computer memory as a part of the data model of the aircraft. Since the computer memory does not have any prejudice as to just what is or is not part of an aircraft, the tool design can become part of the data forming the data model of the aircraft 154. The portion of the data base containing the definition of the virtual tool 156 can be accessed and utilized for the manufacture of an actual tangible tool corresponding to the virtual tool 156. A data sub set (for instance as a file or files) of the data model data base can be created which would contain just the data defining the virtual tool 156.

Further reference will be made to FIGS. 4 and 5 below, however, prior to any additional discussion of FIGS. 4 or 5 a description of certain physical or tangible (as opposed to virtual) components as seen in FIGS. 6, 7, 8 and 9 will facilitate the further understanding of certain processes shown in FIGS. 3, 4, and 5 and other figures. Additionally, the description of just how the individual components of a tangible tool are formed will also be facilitated if this is delayed until after the tangible tools themselves are described.

FIG. 6 shows a tangible tool 218 equivalent to the bonding tool formation precursor tool 166 of FIG. 3. While the tangible tool 218 and other tangible tools of FIGS. 9, 15 and 16 might at first appear to be very similar to the old "master tools", they are not.

The tangible tools of FIGS. 6, 7, 8 and 9 (as well as those of FIGS. 15 and 16 discussed below) are not masters, they are working tools whose master exists in the data model in a data base in computer memory. They do not form the definition of a component; they are an expression of an already existing definition—the data model engineering definitions. As will be evident below, they can be reproduced if desired—they are not compromises of the engineering data as are the "master tools". They are precise expressions of the engineering definition of these tools. They can include explicit 3-D coordinate system locating points incorporated directly into their structure. They can include inherent surfaces or locator means which precisely position or locate each component piece with its respective neighbors as well as other attributes, as will be evident from this specification.

The tool 218 is composed of a plurality of profile boards 220, 222, 224, 226, 228, 230, 232 and 234. These "interact" with connector boards 236, 238, 240 and 242. Each of the profile boards 220, 222, 224, 226, 228, 230, 232 and 234 includes downwardly facing slots collectively identified by the numeral 244 (see FIGS. 7 and 8); one for each of the connector boards. Each of the connector boards 236, 238, 240 and 242 includes upwardly facing slots collectively identified by the numeral 246 (see FIGS. 7 and 8); one for each of the profile boards. In FIG. 6, except for the slots 244 in profile board 220 the remaining slots 244 and 246 in FIG. 6 have been covered and sealed with an aircraft sealant.

The above referenced slots 244 and 246 are essentially "lap joints", albeit very special ones that, as will been seen, include an automatic rigging or positioning faculty. The depth of the slots in either the profile boards or the connector boards is of a depth allowing the profile boards to fit over and interlock with the connector boards with the bottom of the profile boards (as more fully described below) in contact and fitting against a supporting planar surface.

In FIG. 7, to facilitate illustration, only one connector board, connector board 238, is illustrated. Further in FIG. 7, only two profile boards, profile boards 220 and 232, are shown. In FIG. 8 only fragments of profile board 232 and connector board 238 are illustrated. As is seen in FIGS. 7 and 8, all of the slots 246 in the connector board 238 face or open upwardly. Further, all of the slots 244 in the profile boards 232 and 220 face or open downwardly. Because of this, the profile boards can be slid downwardly onto the connector boards.

To assemble the tangible tool 218 of FIG. 6 all of the connector boards 236, 238, 240 and 242 are first set upright on a surface and then each of the profile boards, boards 220 to 234 respectively, are slid down one at a time over the connector boards with the slots 244 in the respective profile boards 220 to 234 respectively engaging the slots 246 of the respective connector boards 236 to 242.

A profile edge, collectively identified by numeral 248, on each of the respective profile boards 230 to 234, is precisely machined to exact specifications on an NC machining tool, as is hereinafter described. As opposed to the old "master models", the bottom surface (or portion thereof such as feet, collectively identified by the numeral 250 on all of the respective profile boards 220 to 234) is also machined to exact specifications. Because of this, if the feet 250 of each of the respective profile boards 220 to 234 are positioned in the same Z plane, the profile edges 248 are, therefore, also positioned with respect to that Z plane.

Each of the slots 244 on the respective profile boards 220 to 234 is machined to include a locator edge 252 and a non-locator edge 254. The locator edges 252 are machined in the profile boards to exact tolerances and orientations with respect to the profile edges 248 and the feet 250. The non-locator edge 254 is cut such that the slots 244 are wide enough to accept the thickness of the connector boards plus a non-critical increment.

The same thing is done in machining the respective connector boards 236 to 242. Each of the slots 246 includes a locator edge 256 machined to exact specifications, and a non-locator edge 258 which is not critical but is spaced from the locator edge 256 an amount sufficient to allow the profile boards to fit into the slots 246 with a small amount of excess space.

A plurality of small wedges 260 A and B are used to secure and also concurrently precisely locate the respective profile boards 220 to 234, and the respective connector boards 236 to 242, to one another to form a precision three dimensional structure. In FIG. 8, the wedge 260-A is pushed between the non-locator edge 258 of the slot 246 on the connector board 238 and near face 262 of the profile board 232 to push far face 264 of profile board 232 tightly and accurately against the locator edge 256 of the slot 246 in the connector board 238.

In a similar manner, the wedge 260-B is pushed between the non-locator edge 254 on the profile board 232 and near face 266 of connector board 238 to push far face 268 of connector board 238 tightly and accurately against the locator edge 252 of the profile board 232. This is repeated for each of the intersections of a respective profile board 220 to 234 with one of the respective connector boards 236 to 242. When the profile boards and the connector boards are so assembled or automatically rigged into the tangible tool 218, it resembles an egg crate type structure. This assembled tangible tool 218 is an extremely precisely oriented and dimensioned structure.

Since the two end profile boards 220 and 234 are only held to the connector boards 236 to 242, respectively, by a single wedge (the bottom most wedge 260-B), in order to tightly hold these pieces against the respective locator edges on the respective connector boards 236 to 242, brackets, collectively identified by the numeral 270, are used to fixedly hold the end profile boards 220 and 234 to several of the connector boards. As for instance, connector boards 238 and 240. Brackets 270 would be attached to the respective profile boards 220 or 234 and the connector boards 238 and 240 after their position to one another was established by locating the profile boards 220 and 234 against the locator edges 256 on the connector boards 238 and 240, and the connector boards 238 and 240 against the locator edges 252 on the profile boards 220 and 234.

While more complex interaction between the respective profile boards and respective connector boards could be designed and constructed, for ease of both design and assembly, normally the locator edges 252 in the slots 244 in the profile boards would all be oriented the same way in space. As for instance, they would all be the far edges as viewed in FIGS. 6, 7 and 8. With the exception of locator edges 256 for one of the end profile boards (boards 220 or 234), the locator edges 256 in the slots 246 in the connector boards would all be oriented the same way in space. For example, they would all be the far edge as viewed in FIGS. 6, 7 and 8, except for the locator edges 256 on the connector boards which interact with the end profile board 234. The locator edges 256 for the profile board 234 would be on the near edge of the slots 246 in the respective connector boards 236 to 242.

The use of brackets 270, and the need to have one "odd" orientation of the locator edges 256 on the connector boards 234 to 242 for the end profile board 234, can be eliminated by simply extending at least one of the connector boards 236 to 242, respectively, slightly longer than the distance between the end profile boards 220 and 234 such that a "full" slot, as opposed to just one locator edge 256 (a half of a slot), is included on one or more of the connector boards 236 to 242, respectively. This full slot is then used to fix the end profile boards 220 and 234 to the connector boards.

Each of the respective profile boards 220 to 234 and the respective connector boards 236 to 242 includes a large vent hole, collectively identified by the numeral 272, to vent the structure when it is faired-in with plaster, as described below. In addition, the profile boards 220 to 234, respectively, each include a plurality of plaster support rod holes, collectively identified by the numeral 274. Plaster support rods, collectively identified by the number 276, are passed through the holes 274 and attached to the respective profile boards 220 to 234 with "Tinnerman nuts", collectively identified by numeral 278. The attachment of the plaster support rods 276 to the profile boards is not critical to the orientation or the precision of the tangible tool 218.

Referring now to FIG. 9, wire mesh 280 is laid on top of the plaster support rods 276 and first a rough plaster 282 is laid over the mesh 280 and then a finish plaster 284 is faired-in using a fairing tool against the profile edges 248 on the respective profile boards. The plaster support rods 276, the mesh 280, and the two plaster plies are standard as per the plaster fairing of the old "master tool" concept.

After the plaster is faired-in, a transfer model 286, similar to the tool 172 of FIG. 3, has been constructed. This transfer model 286 and its precursor tool 218 have been constructed on a grid table. However, as opposed to the old "master tool" concept, the support surface has not been incorporated as a part of the finished tool nor is it necessary to do this (however, as is shown in a further embodiment below, optionally a surface could be included but it can be formed as a light weight aluminum surface which does not need I beams, legs etc.).

A further important point to note at this time is the orientation of the tools 218 and 286 in three dimensional space. They need not be constructed in "aircraft orientation". They are, in fact, constructed on a flat horizontal surface in a "horizontal" tool orientation that is very convenient for the assembler.

The flat horizontal surface used during assembly of the tool 218 of FIG. 6 and its faired plastered counterpart tool 286 is the planar surface 288. This is shown in FIG. 7 and in part in FIG. 8. It need not be horizontally orientated in space except this is very convenient for the assembly personnel. The planar surface 288 is used during construction of the tools 218 and 286 but it does not physically become a permanent part of them.

The planar surface 288 is a flat plane which has been "Blanchard" ground such that it is very flat and contains a precision matrix of precisely sized holes, collectively identified by the numeral 290. The holes 290 are located in precise parallel lines: one set in the X axis and one set in the Y axis, to form a precision grid of squares each defined by four holes. Because of this, knowing the location of any two holes on the surface 288 in three dimensional space establishes a line on the surface 288 in three dimensional space and, knowing the location of any three holes on the surface 288 in three dimensional space, establishes the location of the plane of the surface 288 in three dimensional space. The holes, thus, serve as target means for defining a position in three dimensional space.

As will be noted in greater detail below, when the profile boards 220 to 234, respectively, (or even the connector boards 236 to 242 if desired) are designed and machined, coordinating points are established on at least one of the profile boards. These coordinating points could be a point where three edges meet. As for instance, at either of the corners of profile board 220 in the near foreground of FIG. 6. Normally, they are chosen as explicit points which are placed at convenient locations on one or more of the profile boards.

Coordinating holes, collectively identified by the numeral 292, are shown machined into the profile board 220 of FIGS. 6 and 9, and the profile board 232 of FIGS. 6 and 8. These holes are sized to accept small precise target pins 295 shown in detail in FIG. 19 which fit into them forming coordinating points with assigned x, y, z values on the profile boards. Similar target pins, albeit larger ones, target pins 294 (also shown in detail in FIG. 19), are used in conjunction with the holes 290 in the surface 288.

A coordinating line 293 is located normal to the profile edge 248 of selected profile boards. This forms coordinating target values directly on the profile edge which becomes part of the faired plaster surface. Alternately, the coordinating points could be formed as crossed scribe lines. This would eliminate the need for target pins 295.

A computer aided theodolite system (not separate shown or identified in FIG. 7 but identical to the system 170 noted in the discussion of FIG. 3) is used to establish a three dimensional coordinate system by establishing in three dimensional space the spatial positions of the holes 290 in the surface 288 using the target pins 294. Alternately, the theodolite system would establish the three dimensional coordinate system using the spatial position of a profile board (or connector board), such a profile board 220, via the coordinating holes 292 and target pins 295 or lines 293 or other precisely located points on the board. Once the surface 288 or the profile board 220 is established in three dimensional space the other can be coordinated in the three dimensional coordinate system with it.

The target pins 294 are formed as stepped cylinders having centered cross hairs scribed on their top surface. Related locator pins 297 are formed with a hemi-cylindrical upper section however their bottom section is identical to the pins 294 allowing them to also fit into surface grid holes such as holes 290 on surface 288. The locator pins 297 seen in FIGS. 6, 7, 8 and 19 are very useful during assembly of tools such as the tools 218 and 286 since the flat planar near or far faces 262 and 264 of the profile boards fit precisely against them forming mating edge. The pins 297 can include a scribe line which is normal to that mating edge. Thus the scribe line serves as a first "cross hair" and the mating edge of a board serves as the other "cross hair". Because of this, the pins 297 can also serve as target pins.

Further by using the hemi-cylindrical locator pins 297, the edge of a board positioned against the locator pins 297 is directly centered over the center of a hole such as hole 290 in surface 288 and is held in this position. Thus the edge of the board is fixed in the X (or Y) plane with respect to the surface.

Since the surface 288 was established in three dimensional space using the pins 294 and a computer aided theodolite system (identical to system 170 of FIG. 3) and then a profile board, such as board 220 was established on the surface 288, the relationship of the surface 288 with respect to the board 288 is known. Now when the remainder of the tool 218 is assembled on the surface 288, the tool 218 now has been assembled in a known position in a three dimensional space coordinate system.

The surface 288 and the feet 250 on the profile boards 220 to 234, respectively, orientates the profile edges 248 in precise orientation in space with respect to the Z plane, and the locator edges 252 and 256 and the interaction of the tool 218 with the locator pins 297 fix the X and Y planes and precisely orient them with respect to hole grid on the surface 288. Thus, the locator edges 252 and 256 establish perpendicular X and Y planes, and the surface 288 adds the orthogonal Z plane.

After the tool 218 is established in three dimensional space, it is faired-in with plaster to form the tool 286. Since the tool 286 inherits the characteristics of the tool 218, tool 286 is also established with respect to three dimensional space.

The tool 286 is now used in conjunction with the surface 288 as a mold for a bonding tool. The pins 294 are positioned in the surface 288, and the bonding tool cast to include part of the surface 288 which contains these target pins 294. The pins 294 transfer as holes 296 in the bonding tool 298 of FIG. 10. Since the holes 296 transferred to the bonding tool 298 will correspond to the target pins 294 which fit in the holes 290 in the surface 288, and since the holes 290 in the surface 288 were orientated to a three dimensional coordinate system, the bonding tool inherits this orientation in three dimensional space allowing the bonding tool 298 to be oriented with respect to the same three dimensional coordinate system in three dimensional space and to carry its own target coordinating points, the holes 296 created by the spatially known pins 294.

In describing the above tool 218 and its descendent tool 286, a number of connector boards 236 to 242 were utilized. Instead of using a plurality of connector boards, a single connector board could have been used if it was made sufficiently wide to provide for maintaining the respective profile boards 220 to 234 parallel to one another. For machining, economics, structural and material considerations, it is preferable to utilize a number of connector boards made from thin flat stock versus one made from wide stock.

In certain instances it might be desirable to include a base as a part of a transfer tool, as for instance when the shape of the tool is very narrow. With a narrow tool the number of connector boards which can be used is limited simply because of space consideration. Taking into consideration the reasons as outlined in the previous paragraph, instead of using, for instance, one very wide bar stock connector board or a number of connector boards which are located very close to one another, a further embodiment of the invention shows the use of a limited number of thin flat connector boards (that is components machined from thin plate sheet versus heavy bar stock) plus a thin base board. This is shown in FIG. 11.

In FIG. 11 two bonding tool formation tools, completed tool 300 and incomplete tool 302, are seen. Both of the tools 300 and 302 are long and narrow. They are, in fact, tools for making a right side part and a left side part, i.e. mirror image configurations. Because they are long and narrow, as is seen with tool 302, only one central (or internal) connector board 304 is used.

Because only one internal connector board is used in the tools 300 and 302, the profile boards, collectively identified by the numeral 306 (only those of tool 300 being shown), extend or would extend when the tool 302 is finished, out beyond the back connector boards 308 and 310 of the tools 300 and 302, respectively, and also beyond the front connector board 312 of tool 302, and the unseen front connector board (not separately shown or numbered) for the tool 300.

By extending the profile boards 306 beyond the end connector boards, as discussed above, slots can be placed in the profile boards 306 for the back connector board 308 of tool 300; the back connector board 310 for the tool 302; the front connector board 312 for the tool 302; and the unseen front board for the tool 300. This adds to both the stability and to the precision of the tools 300 and 302 and other tools.

In the embodiment of FIG. 11, the base 314 of tool 302 as well as the base 316 of tool 300 are initially positioned on the table surface 318. The table surface 318 is a duplicate of surfaces 164 and 288 discussed above. All of these surfaces 164, 288, or 318 could, in fact, be the exact same surface which is being used at a different time for a different tool. As with the other surfaces, 164 and 288, the surface 318 also includes a hole grid 320 in which locator pins 297 are being used to locate the bases 314 and 316 with respect to the surface 318. In locating the bases 314 or 316 to the surface 318 we are concurrently locating the tools 302 and 300 constructed thereon relative to the surface 318.

Angle brackets 322 are used to first initially support the connector boards 304, 310, and 312 on the base 316. The profile boards are positioned on the connector boards 310, 304, and 312, and wedged together, as was described for the tool 218. The tool 302 is then fixed to the base 314 by securing the angle brackets 322 to the base 314. Alternatively, after the profile boards and connector boards are located in position with respect to one another using their respective locator edges, instead of utilizing the wedges to hold the structure together, the brackets 322, after being secured to the base 314, would serve this function. It is preferable however, to include the wedges.

Note that two separate tools 300 and 302 are being assembled simultaneously on a single surface 318. Both of the tools 300 and 302 can be moved from the table surface 318 when the assembly of these tools is complete. The table surface 318 is then free for the assembly of further tools. In the embodiment of FIGS. 6, 7, 8 and 9, the tool 286 can also be removed from the surface 288 after the bonding tool 298 is pulled from it.

It is evident that only one or, at most, only several of the surfaces 318 of FIG. 11 and/or 288 of FIGS. 7 and 8, and/or 164 of FIG. 3, are ever needed for the construction of many tools. Further depending on the size of the tools, several tools can be constructed on the same surface at the same time. This then requires only one (or a limited number depending on the production requirements) of Z planes, i.e. surfaces, for the production of a plurality of different and individual tools. In effect all of the different tools are normalized to the same Z plane and hole grid pattern located thereon.

In the top center of FIG. 5 a representational machine tool 324 is seen forming a representational Z plane surface 326. This corresponds to the surfaces 164 and/or 288 and/or 318 or other standard surfaces which might be established. In effect, while a Z plane will be needed for each tool, it can be the same Z plane which is reused over and over again and need not be remanufactured, leveled, stored, etc., again and again for each different tool as is necessary with the old "master tool" way of manufacturing.

Just below the representational machine tool 324 in FIG. 5 is a further representational machine tool 328 which is forming a plurality of parts, collectively identified by the numeral 330. These correspond to the individual unique parts of an individual unique tool such as those of tool 218. As can be seen in FIG. 5 by the representational machine tools 324 and 328, and the parts they form, tools for use in constructing tangible surfaces which mimic the surface 210 in the workstation screen 208-b, can be constructed utilizing a standard component, surface 326, for one plane, the Z plane; and unique component parts 330, for definition in the other two planes, the X and Y planes.

In a family of tools each of which includes a Z plane, the standard component, surface 326, always gives at least one way of accessing back to the master engineering definition of the aircraft structure in the data model.

A workstation operator or appropriate software can normalize each of the members of a family of virtual tools which are being formed at the workstation screen 208-b (or in memory if software is being utilized) to the standard Z plane component by simply defining a Z plane shown by the representational arrows 332–332 in the lower left hand corner of FIG. 5 associated with the virtual planes 212 and by a Z surface identified by the numeral 332 shown in workstation 208-c. This is easily done by an operator utilizing his light pen or other input device.

This Z plane 332–332 now creates a tool origin or configuration noted by the coordinates 334 which can (but does not necessary have to) differ from the aircraft origin or coordinates 336. If the tool coordinates 334 do differ from the aircraft coordinates 336, they are, however, both known to the graphics software and thus to the data model and can always be referenced back to one another.

If a tangible tool, such as tool 172 in the upper right hand corner of FIG. 5, which is located on surface 164, is being measured using tool coordinates by referencing coordinating points on either the tool 172 or the surface 164, since the tool coordinates in the data model (workstation screen 208-b) are known with respect to the aircraft coordinates (by matrix rotation or the like in the CAD software), the tangible tool is, therefore, also known with respect to the aircraft coordinates.

Referring again to FIG. 4 and having seen representative tangible tools such as tool 218 and its faired plaster descendent, tool 286, to manufacture these tools, an operator or appropriate software such as the above referenced TCAD computer aided tool design program and TCAM computer aided tool manufacture program, selects the portion (normally a file or files) of the data set from the data model data base which defines the virtual tool 156 and brings this data set up into working memory. For illustrative purposes the data containing the definition of one of the virtual profile boards 214 is selected. The selected board 214 is individually identified as component 338. The component 338 is a virtual profile board and ultimately a tangible counterpart will be formed which will be one of the profile boards of a transfer tool, as for instance tool 286.

As was described above in first designing a virtual tool, except where explicitly noted, the description of the formation of the tangible components will be addressed using an operator to carry out certain tasks. It is realized, of course, that whatever tasks the operator carries out, the same tasks would be coded into appropriate software instructions as functions, macros, procedures and, the like, in appropriate programs. These programs and supporting software such as appropriate AI (artificial intelligence) software would be utilized in place of the operator directed task.

Most specifically, the following noted operations might also be accomplished using the above referenced TCAD computer aided tooling design software and TCAM computer aided tooling manufacturing software. These can be augmented, as can the operator directed operations as described below, with the above mentioned CADAM and with MAXCAM (Multi-Axis Computer-Aided Manufacturing, Northrop Corporation, Los Angeles, CA) a precursor of the above noted TCAD system as well as with other programs such as the above mentioned NCAD and NCAL.

MAXCAM is an interactive graphics numerical control programming system which utilizes an interactive graphics terminal to develop, simulate and submit a machine program to an APT processor. A MAXCAM standard tool library is maintained in a logical and hierarchical manner in a data base as, for instance, the IBM DB2 data base management tool (IBM Corporation) that allows for ad hoc queries and rapid report utilizing tables of attributes pertinent to items like feed rates, speeds, etc.

A data set from the data model data base containing the component 338 is loaded into working memory and onto the workstation screen 208-D in FIG. 4. The profile edge 340 has already been defined. It was defined by the intersection of virtual planes 212 (corresponding to the virtual profile boards 214 of the virtual tool 156 of FIG. 4) with the virtual surface 210 (see workstation screen 208b of FIG. 5). The virtual surface 210 in turn included the virtual part 206 from the virtual aircraft 154. The bottom edge 342 also has already been defined by cutting with a plane as per the Z plane 332–332 of FIG. 5 described.

Since we are dealing with a virtual image of a part of the virtual tool 156 which in reality is only a set of mathematical algorithms defined within the 3-D graphics software, all lines of this image have no thickness. The lines of this image only divide space. The intersect lines 344, 346 and 348 of the virtual connector boards 216 of the virtual tool 156 are, thus, only lines on a virtual component which divide space. So also are the profile and bottom edges 340 and 342. Because of this, they define precise lines (curves, arc, etc.) which are known with absolute precision in the coordinate system of the 3-D graphics software.

While the profile edge 340 and bottom edge 344 define outside boundaries, the intersect lines 344, 346 and 348 do not—they define where one tangible component will interface with another. At this point in time the intersect lines 344, 346 and 348 do not yet have thickness corresponding to the thickness of these respectively tangible components. In view of this, they can be used to define the virtual counterparts of the locator edges 252 on corresponding tangible profile boards.

To define the remainder of a slot in which a connector board will fit, the operator working with his or her light pen or/and other interface devices, and having decided, for instance, that all of the locator edges will be on the left hand side of all slots in the profile boards, defines the slot 350 which contains the locator edge 344. The slot can be built up by selecting predefined basic features of a slot, i.e. parallel lines and then connecting them by a normal line or curve. Alternately, if a slot has previously been defined as an accessible feature, by selecting it from a library. In any event the slot is positioned via a light pen or the like such that one of its edges corresponds to the intersect line 344. This results in the intersect line 344 serving as the locator edge for the slot. Since the intersect line 344 is precisely known in the coordinate system of the graphics software, the locator edge it now defines will also be precisely known.

This is repeated for the remaining slots 352 and 354. They too will include the precise orientation and location of their locator edges because of their respective intersect lines 346 and 348. The operator removes some of the bottom edge 342 to define virtual feet, collectively identified by the numeral 356. The operator then goes on to added target points, collectively identified by the numeral 358. The virtual part is nearly finished except for vent holes and the plaster support rod holes. The position of the plaster support rod holes will be defined in the same manner as were the virtual connector boards 216 by adding lines which intersect the virtual profile boards 214 of the virtual tool 156 at points. With the virtual component part 338 at the workstation screen 208-d, the points defined in the virtual part 156 are expanded to holes, and the vent holes are added by the operator at designated locations.

At this point in time, the virtual component 338 on the workstation screen 208-D of FIG. 4 has been modified into a complete virtual profile board 360 shown in the workstation screen 208-E of FIG. 12-a. The virtual profile board 360 is saved in the data base and becomes a component part of the data set forming the data model.

At this junction, the memory description (as a file, for instance) of the virtual profile board 360 could be downloaded to 2-D software such as the above referenced CADAM to prepare 2-D scaled, dimensioned drawings, and then used by an NC programmer in conjunction with the above referenced APT processor software to produce an NC tape for a numerically controlled machine tool to use in machining a tangible part corresponding to the virtual profile board 360. While the tangible profile board corresponding to the virtual profile board 360 could be formed in this manner, since the NC programmer must completely direct each machine process and each tool movement, this process is exacting, time consuming, and, therefore, very slow and operator time intensive.

FIGS. 12-a to 12-c show the formation of a tangible part from the memory definition of the same in a data base by using further improvements of this invention. Using interactive 3-D graphics, the operator loads the data set (the file) containing the virtual profile board 360 onto the workstation screen 208-F of FIG. 12-b. The operator also loads, as is shown on workstation screen 208-F, an interactive graphics numerical control programming system depicted as the indicia 362 on the screen 208-F. One such interactive graphics programming system is above referenced MAXCAM which interfaces with an operator utilizing menus which describe "tool macros". In a further improvement of the invention, the above referenced TCAD-TCAM software would be used to further limit the amount of operator interfacing.

Having logged on with the interactive graphics loaded at the workstation, the workstation screen 208-F presents the operator with a choice of various tool macros. Each of these tool macros defines an automated machining operation. Some of the macros describe non-machining processes such as cooling on, cooling off, tool change, etc. Others describe machining operations such as face mill, drill, rough and finish pocket, rough and finish profile, regional mill, or flange top. Machine operator instructors can also be entered with appropriate details for the machinist, as can instructions for the formation of 2-D plan drawings for the machinist's use if necessary, depending on the ultimate machine which will be used to form the component part.

The operator first selects planning macros which interface with the NC machine library of the system. The necessary planning information to be utilized by other macros, such as part information including material type and condition, is entered; next, machine tool characteristics, such as number of axes and spindles, bed size, part orientation or maximum X, Y, and Z travel is also entered. Further fixture information like number of stages, tool design information, and clamp types and location are entered.

After the planning is entered, the stage design is entered. The operator can enter routines to develop multiple stage fixtures, fixture definition, tooling tabs, etc. Once the staging is completed, cut programming begins by selecting the cut macros (drill, ream, etc.) for the geometry and, as these are entered, the cutter and its parameters (speed, feed, etc.) are defined.

The geometry of the cut is picked and the macro is executed. The operator can then simulate the cutter movements through visual representation, as is shown on the workstation screen 208-F in FIG. 12 showing the operator the "on the fly" cutter paths to produce the tangible component corresponding to the virtual profile board 360. Once the total part formation or manufacturing operation is complete, it is saved for future reference as part of the data model. Further saves can also be made to update the tooling libraries.

If an NC machine which requires a tape for its input instruction will be utilized to produce the component part, an NC cutter tape 364 is now generated. Alternately, the cutter information is directly downloaded via a data bus 366 to a digitally controlled machine tool (a computer numerical controlled tool) which resides in the software post processor file, or to an interface medium such as floppy disk 368 for indirect transfer to such a digitally controlled tool. Transfer to a digitally controlled tool can also be through a further computer system such as a micro or mini-computer.

The tape 364 or disk 368 or direct bus 366 computer control is then utilized to run an appropriate tool means such as NC machine tool 370 to cut a tangible profile board 372 from suitable feed stock 374. Aside from numerically controlled machine tools, such as tool 370, the component formation information (tape 364, disk 368 or direct downloading of a memory copy of an instruction via a data bus 366) can be used to direct component part formation by other tools, such as numerically controlled laser cutters, numerically controlled assembly robots, computer numerically controlled machine tools, computer numerically controlled laser cutter and computer numerically controlled assembly robots.

Not only does the tool 370 cut the outside profile, slots and locator edges, plaster rod holes, and vent holes of the tangible part 372, it also forms the coordinating target points (holes, cross scribe lines, etc.) directly on the tangible component part 372. This places a direct reference on the component part 372 for location in a known precise position and orientation in 3-D space for referencing and locating the part 372 to other components, tools, parts, etc. residing in the data model for the aircraft structure.

It is evident that once the definition of the component part 372 and its formation instructions are created in the data model in computer memory, because this is retained as the "master instruction" for the particular part, an exact duplicate can be formed by simply making a further call to these instructions and feeding this further call to an appropriate forming machine to recreate an exact duplicate of the part. This is also true of every other component which makes up a part of the data model and is stored in the data base defining the data model design, and manufacturing instruction for the complete structure.

In using the data model, if component parts for tooling, assembly, etc., for a first aircraft were produced and a first aircraft was built, all of these first physical components could be scrapped and identical ones could be produced from the data model and a second aircraft built using them. The second aircraft would essentially be a duplicate of the first. This is not true with the "master tooling" concept since each aircraft would incorporate all deviation of its "master tool" from the engineering specifications.

Again referencing FIG. 5, the operator can call up a further copy of the file of the virtual part 206 and/or the virtual surface 210 derived from the virtual part 206 from the data model and load it on a workstation screen 208-G. As described before, the operator utilizes this virtual surface 210 to form a tool (as for instance, virtual tool 156) which included and, therefore, mimicked the surface 210 (an image copy of it). Instead of making an image copy tool, a complementary image tool can also be formed.

Building up from the surface 210 on the workstation screen 208-G, the operator defines a virtual assembly jig 376 on the virtual surface 210. When a tangible component is formed which corresponds to this virtual assembly jig 376, it will be complementary to the surface of the actual tangible part such that the surface of the actual tangible part can be positioned against the assembly jig and a required assembly operation performed on the actual tangible part in conjunction with the assembly jig.

Typically, such assembly jigs would be used to locate parts during drilling, bonding, or joining and the like, where one part is prepared for assembly to an adjacent part or is fixed in position during actual assembly of these adjacent parts.

During the design of the virtual assembly jig 376 on the workstation, appropriate target points can be added to the assembly jig such as the virtual target points, collectively identified by the numeral 378. Since these target points 378 will become part of the data set defining the virtual assembly jig 376 in the data model of the aircraft, when a tangible assembly jig corresponding to the virtual assembly jig 376 is formed, tangible target points will be known on the tangible assembly jig. These tangible target points will, therefore, be known in a precise relationship with the part which will correspond to the virtual surface 210, and they will also be known with respect to the total structure of an aircraft corresponding to the virtual aircraft 154.

In addition to the virtual assembly jig 376 which is designed in the 3-D graphics, a virtual gantry structure 380 i.e. an assembly structure rough structure, can also be designed at the workstation 208-G. This gantry positions and holds the virtual assembly jig 376 in space. Appropriate locators or coordinating points, collectively identified by the numeral 382, can also be included on the virtual gantry 380. When an actual tangible gantry corresponding to the virtual gantry 380 is constructed, tangible aircraft parts being assembled, drilled or the like in conjunction with the tangible assembly jig corresponding to the virtual assembly jig 376 can be positioned in space with respect to the tangible gantry by utilizing these locators or coordinating points.

As with the above described tool 218 and its descendent tool, tool 286, the data sets (files or the like) in the data model data base containing the definitions of the virtual assembly jig 376 and virtual gantry 380 can be downloaded to appropriate NC tools or machine centers for forming the actual tangible assembly jigs and gantries.

FIG. 13 shows an assembly jig 384 which corresponds to the virtual assembly jig 376. It is supported on a gantry 386 which corresponds to virtual gantry 380. Target points 388 have been located on the assembly jig 376. These correspond to the virtual target or coordinating points 378 in the file for the virtual assembly jig 376 in the data model. Located on the gantry 386 are locators 390 which correspond to the virtual locators or coordinating points 382 for the virtual gantry 380 in the data model.

Also shown in FIG. 13 are further assembly jigs 392 and 394. These are also supported by the gantry 386. They would also include appropriate target points for precisely locating them on the gantry with respect to one another. Note assembly jig 392 contains a drill pattern 395 which would also be laid out with precision on a virtual counterpart. Once on the assembly bay floor, other common assembly components such as worker scaffolding 396 is also associated with the gantry 386.

As noted above, in using the "master tool" concept, the assembly jigs had to be rigged with the gauging master and locators positioned. The gauging master was removed and the locators repositioned on the rough structure. Not only did this introduce problems with respect to the repositioning of the locators but it meant that the assembly jigs normally had to be in "aircraft orientation" since that is how the majority of the gauging masters were oriented.

With the present invention, the assembly jigs can be positioned in whatever orientation it is convenient to use. This can vary from actual "aircraft orientation" to 90° rotation, or even completely rotated 180° out of phase or any other orientation. As such, in an assembly situation such as that of FIG. 13, the actual part might be located in an upside down position or at some angle. Thus, if it is desirable for the assembly personnel or assembly robots to work in something other than "aircraft orientation", because all parts, whether they be actual aircraft parts or assembly jigs and the like, can be absolutely referenced back to "aircraft orientation" via the data model and its associated data base, any assembly orientation can be chosen.

Figure 15:
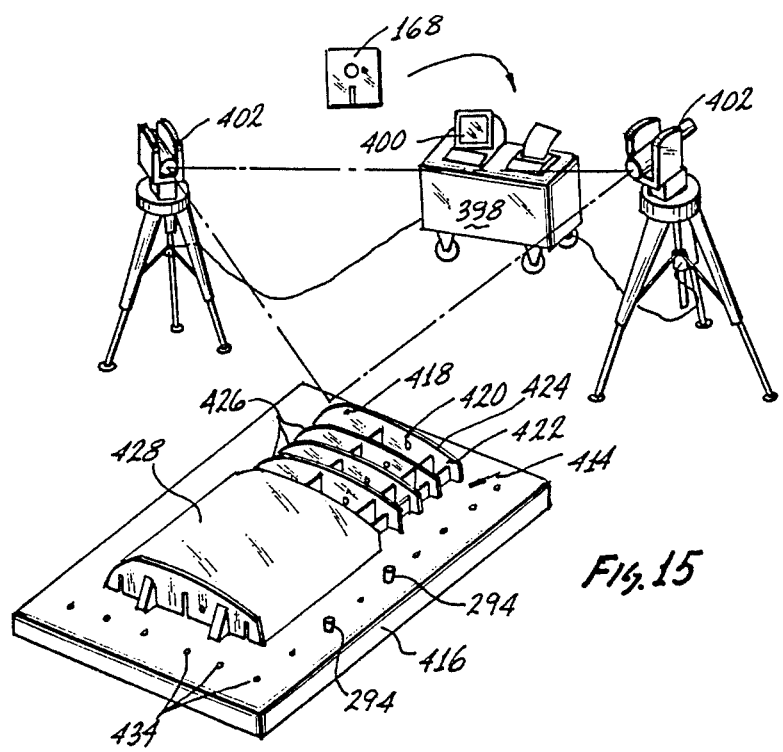
FIG. 15 is an isometric view of a partially completed tool and associated apparatus used during the manufacturing process of FIG. 3.

FIGS. 13 and 15 shows further views of the computer aided theodolite system such as the system 170 of FIG. 3. Shown in these figures is a commercial computer aided theodolite system 398, a Wild\C.A.T. 2000 Coordinate Analyzing Theodolite System sold by Wild Heerbrugg, Farmingdale, NY. The C.A.T. 2000 System utilizes either Wild T2000 or T220S theodolites, a Hewlett-Packard Series 200 Computer, a Hewlett-Packard Thinkjet Printer and runs Wild C.A.T. 2000 series software, part #900598, licensed from the Boeing Corporation. Attached as appendix A are copies of an operator manual, a literature brochure and a reference manual for the C.A.T. 2000 System, the entire contents of which are herein incorporated by reference.

The theodolite system 398 has several operational modes including job setup, measure, build and inspect which are menu driven. After set up, wherein the computer 400 is turned on and the first and second theodolites, collectively identified by the numeral 402, of the system are calibrated, leveled, collimated etc., an appropriate coordinate system can be entered and stored. The theodolites 402 of the system then measure azimuth and elevation angles of selected points in space and send this information to the computer 400. The computer software converts this angular data to X, Y, Z coordinates relative to the currently established coordinate system. The software can also manipulate this data to provide other information pertinent to the measurement.

In a build mode, the theodolite system 398 allows coordinates of a location to be entered. The theodolites 402 are then redirected until they point to that position in space. A part can now be located with respect to that position. In the inspection mode, the system 398 indicates the deviation of the positions the theodolites 402 are pointing to from a previously indicated set of coordinates.

By following the above teachings of this invention, target or coordinating points for each component of a structure, a tool associated with that structure or an assembly tool utilized in conjunction with that structure, are known in the file or files of the data model and are also known with respect to the engineering definition of the structure within the data model. During construction or formation of these component parts etc., these target or coordinating points can be "downloaded" to and incorporated directly on the components or associated structures by forming tangible targets or coordinating points as an integral part of each component, or group of components, or associated structure.

The theodolite system 398 can be used to verify the relationship of one component to another by using these known coordinating points, or it can be used to position one component or associated structure with respect to a further component or further associated structure.

Thus in FIG. 13, target points 388 on the assembly jig 384 can be used to locate a component part with respect to the assembly jig 384, or to locate the assembly jig 384 with respect to the gantry 386 or the other assembly jigs 392 or 394. Further in FIG. 13, set in the assembly bay or cell are targets, collectively identified by the numeral 404. For illustrative purposes, these are shown permanently reset into the assembly bay floor in a precisely known relationship with one another in a manner equivalent to the grids system on surfaces such as surface 288. They, thus, can serve as known coordinating points for any structure or structures which are assembled in that assembly bay. Alternately to setting the target 404 in the assembly cell floor, the targets 404 could be associated with other structure within the assembly cell such as the walls, ceiling or the like.

The theodolite system 398 can reference these targets 404 to establish a known coordinate system. This coordinate system can then be used as a "yard stick" for referencing back to the coordinates of the engineering definition such that anything in the data model data base can be referenced in 3-D space with anything associated with the coordinate targets 404.

As opposed to the use of gauging masters, in the structure of FIG. 13, the position of the locators 390 can be verified by using the theodolite system 398 and the data in the data model which defines the location of the locators 390. Thus, if desired, in between each assembly operation conducted at the assembly cell, the locators 390 can quickly be audited with the theodolite system 398. This can be done in tens of minutes compared to the several days which are required when using gauging masters.

Further, since everything with respect to the manufacture of an aircraft is referenced directly back to the data model and no gauging masters are needed, the formation of the component parts and the construction of the gantry 386 and its associated assembly jigs 384, 392 and 394 can be started immediately upon completion of the design phase of the aircraft and does not have to wait for the formation and construction of other components.

The formation and construction of these components can be done in independent in time. Thus the assembly jigs can be constructed in parallel with other components such as the above described bonding tool 296 or they could even be constructed prior to the bonding tool 296.

In an analogous manner to the assembly jigs 384, the gantry 386 and their targets 388 and locators 390 and the assembly cell targets 404, in FIG. 14, an assembly floor is also equipped with targets, collectively identified by the numeral 406, permanently recessed therein. These can be used with a computer aided theodolite system 408 which has been permanently installed on the assembly floor. Since all component parts of the aircraft can include appropriate coordinating points thereon, the theodolite system 408 can reference coordinating points on component parts of a fuselage section 410 of an aircraft being assembled. The coordinating points can then be referenced back to the data of the data model in the data base file to the coordinating points of an aft section 412 of the aircraft. This can be used to precisely position the aft section 412 to the fuselage section 410.

In FIG. 15, a tool 414 is shown during assembly on a table 416. For illustration purposes, the near half of the tool 414 has been faired-in with plaster while the far end has been left open. Further, target pins 294 have been positioned in some of the holes of the table 416. This incompletely finished tool is useful for showing several aspects of the invention. As described above for tool 218 and its locator edges 252 and 256, the tool 414 would use locator edges to establish exact positioning between its individual profile and connector boards.

The theodolite system 398 can reference the target pins 294 to establish the plane of the table 416 in its memory. This can then be used to coordinate any thing associated with the table 416 with the data model definitions in its data base. Alternately, target points or coordinating points 418, 420 and 422 on profile board 424, can be used to establish a plane and to coordinate with the data model since by the above described method of formation of the profile board, these target points are also precisely known. In any event, whichever of the table 416 or the profile board 424 is used to set the coordinate system, the other can be referenced to it.

In addition to the use of locator edges to establish the precise positioning of profile boards to connector boards, the theodolite system 398 can also be used to check the location of each of the remaining profile boards, collectively identified by the numeral 426, one at a time as they are loaded onto the connector boards, or as a group when the assembly is finished.

In the same manner, the theodolite system 398 can be used to verify the surface profile of the faired-in section 428 of the tool 414 After plaster fairing, the surface profile of the section 428 of tool 414 is an exact image of an actual portion of the surface of an aircraft. Since utilizing the data model, a file copy from the data model data base containing the engineering definition of an aircraft part can be downloaded as for instance via a floppy disk and can be uploaded into the theodolite system 398, any point on the surface of the section 428 can be compared to its virtual image in the data model.

Any deviation which might have been introduced by inappropriate assembly or fairing can be corrected to the engineering specification of the master design definition prior to perpetuation of any such deviation to actual production components. If the plaster fairing is high or low, it can be shaved or filled in as required.

Figure 16:
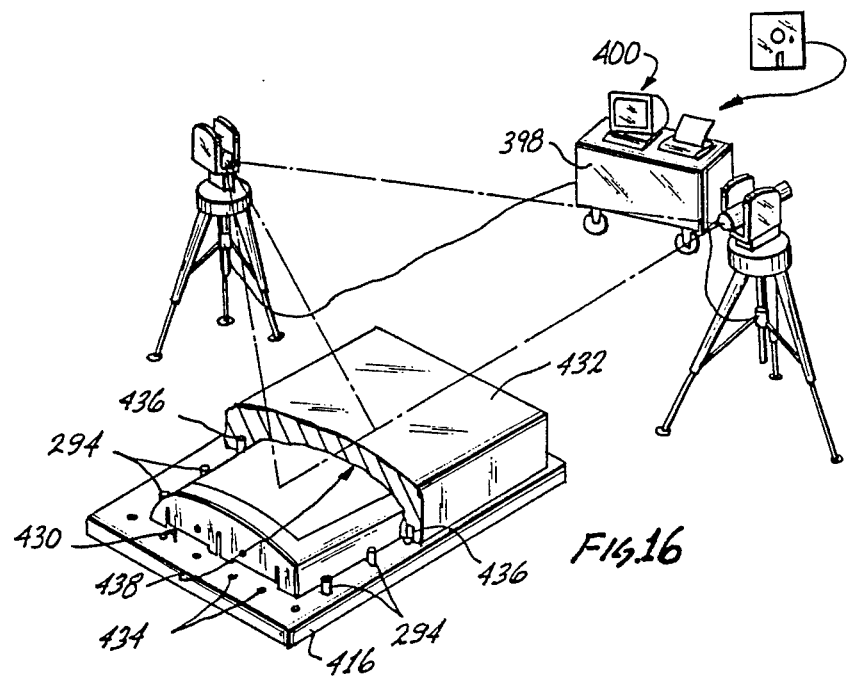
FIG. 16 is an isometric view showing the completed tool of FIG. 15 plus a fragmentary view of a further tool and associated components utilized during the manufacturing process of FIG. 3.

In FIG. 16, the remainder of the plaster has been faired on to the tool 414 of FIG. 15 to form completed tool 430, and a complementary bonding tool 432 cast on the tool 430. The near part of the bonding tool 432 is broken away to show the tool 430 as well as certain of the target pins 294 on the table 416.

In the manner described above, by casting the bonding tool 432 over both the tool 430, as well as portions of the table 416 including the target pins 294, the bonding tool 432 not only forms a complementary image of the tool 430 but also incorporates the hole grid 434 on the table 416 because the target pins 294 form target holes 436 in the bonding tool 432 which correspond precisely to the hole grid 434 of the table 416.

Just as the theodolite system 398 can audit the surface of the tool 430 and reference back to the data model, so can the theodolite system 398 audit the complementary surface 438 of the bonding tool 432. As with the lines 344, 346 and 348 (FIG. 4) discussed above, since a virtual surface, such as virtual surface 210, of the aircraft structure in the engineering definition in the data model data base is only a virtual mathematical surface which divides space and has no thickness, we can look at it from the outside like we do when we compare the surface of the tool 430 to the master design definition. However, we can also look at it from the inside and compare the complementary image of that surface on the bonding tool 432.

Referring back to the bonding tool 298 of FIG. 10, as noted, it included holes 296. These were "picked up" when the bonding tool 298 was pulled from both the tool 286 and the surface 288 which included target pins 294. The inside surface 440 of the bonding tool 298 is a complementary surface, but the data model definition does not care if we look at it from the outside in or the inside out. Thus, the inside surface 440 of the bonding tool 298 can be referenced back to its virtual counterpart in the data model data base file. Its virtual counterpart, of course, being the virtual surface 210. This surface 210 is the same, irrespective of whether in human terms it is looked at from the outside in or the inside out.

The holes 296 picked up from the surface 288 allow coordination of the inside surface of the bonding tool 298 back to the virtual tool 156 in the data model and from there to the virtual surface 210, which the bonding tool 298 is a tangible complementary mimic thereof.

Using the theodolite system 398, the holes 296 from the target pins 294 in the surface 288 allow for the precise placement in coordination of further precisely known target points 442 on the inside surface 440 of the bonding tool 298. Coordinate points on the virtual surface 210 can be picked up and downloaded to the theodolite system 398 and then the theodolite system 398 placed in build mode and the theodolites 402 sighted. Reference points for the targets 442 are made by scribing, drilling and the like at the points on the inside surface 440 of the bonding tool 298 at which the theodolites are pointing.

Alternately, a theodolite equipped with a laser can be used to locate appropriate target points on any of the surfaces described. Having established the targets 442 on the inside surface of the bonding tool 298, when a composite skin panel 444 is formed against the inside surface 440 in FIG. 17-a, the targets 442 are used to precisely locate the longeron 446 and spars 448 against the skin panel 444.

The bonding tool 298 (or 432 or 176) allows for direct assembly of the supporting structures (longerons 446 and spars or stiffeners 448) onto a composite skin panel 444. It can also serve as the support structure during curing of these components in an autoclave. By forming the bonding tool 298 of calcium oxide, calcium sulfate, or combinations of these two calcium salts as a matrix material, and by incorporating layers of structural fibers in this matrix, an easily constructed, inexpensive, but highly accurate and autoclaveable bonding tool is achieved.

Suitable for the calcium oxide or calcium sulfate are Ultracal TM 30 or Ultracal TM 60 manufactured by United States Gypsum Company. Suitable as the structural fibers are layers of fiber glass mat particularly those with randomly oriented fibers. It has been found that fiber glass mats manufactured for use with polyester resins form a very good interface with the above noted Ultracal TM products if layered in the Ultracal TM product. Normally, several layers would be utilized. As for instance, 20 to 30 such layers.

The resulting bonding tools, as for instance bonding tool 298, are then used to support the skin panel 444, the longhorns 446, and spars 448, during curing to form a finished component 450 which meets the engineering definition for that part as defined in the data base file of the data model. As so constructed, the bonding tool 298 can be used or cycled repeatedly for the forming and curing of identical parts. At any time, an audit can be made of the bonding tool 298 to verify that it still defines the proper surface parameters. Since such an audit is referenced directly back to the data model via the theodolites system 398 and not through a check tool, there is never any question whether or not the bonding tool 298 still meets the engineering specifications for the part formed on it.

FIG. 18 is a flow sheet of certain processes of the invention. These processes are initiated by logging on at 451 in an appropriate computer system and creating a file for the data model 452. Once in the data model 452, the engineering definition 454 of the aircraft structure is entered. A component portion of that engineering definition 454 is then selected and a component or surface definition 456 is created.

The data sub set defining the surface portion 456 can then be further processed by either one of two branches which diverge at junction 458. First following the left hand branch, a tool definition 460 is created by an operator interacting with appropriate data from the data model 452 utilizing appropriate 3-D graphics software. Having created the tool definition 460, next tool manufacturing processing steps 462 are defined. Again, this is done by the operator in conjunction with software assistance, as for instance the above noted MAXCAM software.

Once the tool definition 460 is complete, and its manufacturing processing steps 462 are completed, the manufacturing processing steps 462 are downloaded to appropriate tooling means 464 to make the component tool parts.

The tool definition 460 can be fed back or uploaded to the data model 452 to become an inherent adjunct part of the data model 452. Additionally, the steps outlining the manufacturing processing steps 462 for the tool can also be fed back to the data model 452 and become an inherent part of it. Having been added to the data model 452, both of these additions to the data model 452 can now be accessed as component parts of the data model 452.

Referring now to the right hand branch leading from the junction 458, a tool can be auto defined by appropriate software, such as the above mentioned TCAD to create an auto tool definition 465. This auto tool definition 465 is then downloaded to further automated manufacturing software such as the above mentioned TCAM which defines automated manufacturing processing steps 466 for the formation of a tool.

Once the automated manufacturing processing steps 466 are created, they are downloaded to automatic tool producing machinery represented by auto tooling means 468. The component parts of the tool are formed by the auto tooling means 468. As with the left hand operator branch of FIG. 18, the right hand automated branch of FIG. 18 can also feed back or upload back to the data model 452 via the connector A-A. Thus, both the auto tool definition 465 and the automated manufacturing process steps 466 can be fed back to the data model 452 to become an inherent part of the data model 452.

Anything in the data model 452 can be downloaded to a theodolite system 470 for comparison of components. Thus, if desired, the tool parts, either via the operator branch to the left of FIG. 18 or the automated branch to the right of FIG. 18, can be compared at junction 472 with appropriate coordinates which have been downloaded into the theodolite 470 from the data model 452. At the comparison at junction 472, feedback can once again be made to the data model 452 to update the data model 452 as to the actual physical parameters of the tool components.

The tool components are then assembled at assembly process step 474, and again, if desired, a comparison can be made at the junction 476 utilizing the theodolite system 470. Once again feedback can be made back to the data model 452 for input of the actual parameters of the assembled tool to the data model 452.

From the assembled tool a component part of the aircraft is made at process 478. If desired, the theodolite system 470 can again be utilized to check this component part to anything in the data model 452 at junction 480. Again, the actual physical parameter of the completed part can be uploaded back to the data model 452 to become an inherent component part of the data model 452. The parts produced are then assembled into the final aircraft structure at assembly step 482, and the totality of the aircraft structure can again be checked at junction 484 with input from the theodolite system 470. Again, the actual parameters of the completed aircraft structure can be uploaded back to the data model 452 to become an inherent component of the data model 452.

At all points during the manufacturing of tooling, the formation of component parts, or the final assembly, any parameters determined from previous parts or steps, having been fed back and made an integral part of the data model 452, can be downloaded to the theodolite system 470 to audit further parts, tools, assemblies, etc., at later steps.

As the manufacturer of the aircraft proceeds from the original definition, an engineering definition at 454, to the final assembly, a complete history of all component parts, tools, etc., which have gone into the assembled aircraft, can be measured against their engineering definitions, and any deviation thereof can be stored as part of the data model 452 and downloaded to the theodolite system 470 as input to be used during auditing of later manufacturing steps.

By constant update of the data model 452, an archive of all information known with respect to any intermediate component, part, tool, assembly, etc., or the final assembled aircraft, can be associated together and downloaded where appropriate for other manufacturing steps. Any and all of the individual theodolite audits of tools, parts, or assembly audits, may or may not be made depending upon the necessity or desirability of an audit at that point.

Expanding the right hand branch leading from junction 458 of FIG. 18 above, the auto tool definition step 465 and the automatic manufacturing processes step 466 are outlined in greater detail in FIG. 20. In FIG. 20 both a part and a tool utilized during manufacture of that part are represented. Additionally FIGS. 21 and 22 show other view of portions of the tool of FIG. 20.

Shown in FIG. 20 is a part 486. The part 486 represents a portion of a bulk head of a tangible aircraft corresponding to the virtual aircraft 154 defined in the memory of computer system 152. To assist in the manufacture of the part 486 a vacuum mill fixture 488 is indicated. This is determined because part 486 has a thin web 490 which separates an upper pocket 492 and a lower pocket 494.

While one of the pockets 492 or 494 could be machined without any problems in the raw stock for the part 486, when the opposing pocket was machined, because of the thinness of the web 490, distortion of the web 490 could occur. This happens because during machining the mill cutter 496 utilized to cut the pocket can indirectly deflect or distort the web 490 via vibration, vacuum or the like. If deflected, the center of the web 490 would be positioned out of line with the edges of the web 490. Because of this either the web 490 is inappropriately milled such that its center is thinner or thicker than its edges or more drastically the cutter 496 could actually penetrate the web 496. If either of these happen, the part 496 is rendered useless.

In order to avoid these problems after a first pocket is formed, as for instance the lower pocket 494, the vacuum mill fixture 488 will be utilized to hold the web 490 in a fixed position allowing accurate parallel walls to be formed on the opposing sides of the web 490 between the upper and lower pockets 492 and 494.

Prior to describing the actual iteration of the definition of a virtual vacuum mill fixture and its physical tangible counterpart component, fixture 488,, description of the individual parts of the fixture 488 will facilitate the understanding of the definition and formation of the same.

The mill fixture 488 has a base plate 498 having a plug or a riser 500 located thereon. Located on the base plate 498 to assist in maintaining positioning of the part 492 on the raiser 500 are toggle clamps 502 and 504. Further a set block 506 is also positioned on the base plate 498.

As is seen in FIG. 22, the set block 506 has a large central opening 508 and is fixed to the base plate 498 via screws collectively identified by the numeral 510.

The plug or riser 500 has a groove 512 on its upper surface for receiving an 0 ring to allow for creation of a vacuum seal between the top surface of the riser 500 and the lower surface of the web 490. Inboard of the groove 512 are four vacuum holes collectively identified by the numeral 514.

As seen in FIG. 21, the vacuum holes 514 continue through the riser 500 and open in to a vacuum manifold 516 machined into the bottom of the riser 500. Further, as is evident in FIG. 21, holes collectively identified by the numeral 518 are drilled, reamed and then tapped for mounting the riser 500 to the base plate 498 with bolts, one of which bolt 520 is shown exploded from the base of the riser 500 in FIG. 21.

To complete the base plate, slots 522 are formed on opposite edges of the base plate for attachment of the base plate via bolts to T grooves in the milling machine wherein the vacuum mill fixture 488 will be utilized. Additionally, a vacuum aperture 524 is drilled through one side of the riser 500 to connect with the vacuum manifold 516. A vacuum fitting 526 is threaded into the vacuum aperture 524 for attachment to a suitable vacuum source.

To use the vacuum mill fixture 488 it is first attached via appropriate bolts to a milling machine. After aligning the fixture 488 with the coordinates of the milling machine, the part 486 is then located thereon by first positioning an O ring within the groove 512 and then lowering the lower pocket 494 over the riser 500. A vacuum is then fed via the vacuum fixture 526, the vacuum aperture 524, the vacuum manifold 516 and the vacuum holes 514 to the underside of the web 490 to hold it fixed against the upper surface of the vacuum mill fixture 488. The clamps 502 and 504 are tighten against the part 492 to insure that it remains fixedly attached to the fixture 488 during machining. Machining of the upper pocket 492 can now be conducted without distortion of the web 490.

To align the fixture 488 to the coordinates of the milling machine, the set block 506 is utilized. A spindle on a cutter head of the milling machine fits into the set block 506 to zero the milling machine cutter to the location of the vacuum mill fixture 488.

It is evident that vacuum mill fixtures have certain inherent characteristics and parts. They require face plates which can be attached to an appropriate milling machine bed via appropriate slots 522. They require set blocks 506 for alignment of the mill cutter to the vacuum mill fixture and the part located thereon. Further, they require an appropriately shaped plug or riser which fits into a pocket on the part being milled and a vacuum source to the top of that plug or riser for holding the part onto the vacuum mill fixture.

In view of the standard requirements of vacuum mill fixtures it is possible to incorporate these requirements in a software macro which is then included in a library. The macro for the vacuum mill fixture in turns calls more basic routines stored in the library which define "features" for the individual components of various structures. These features are broken down to basic elements such as planes, holes, pockets, flanges, bosses and other basic structural elements. Whenever a vacuum mill fixture is needed a call is then made to the library for the definitions of the necessary standard parts of the vacuum mill fixture. Having once defined the necessary components of the mill fixture what remains is to customize those components to the geometry and dimensions of the particular part which the mill fixture is associated.

Libraries can be created for other tools, parts and the like which have inherent standard features. A data base can thus be created of the requirements of certain tools and parts for facilitating computerized design and manufacture of the same.

Figure 23:
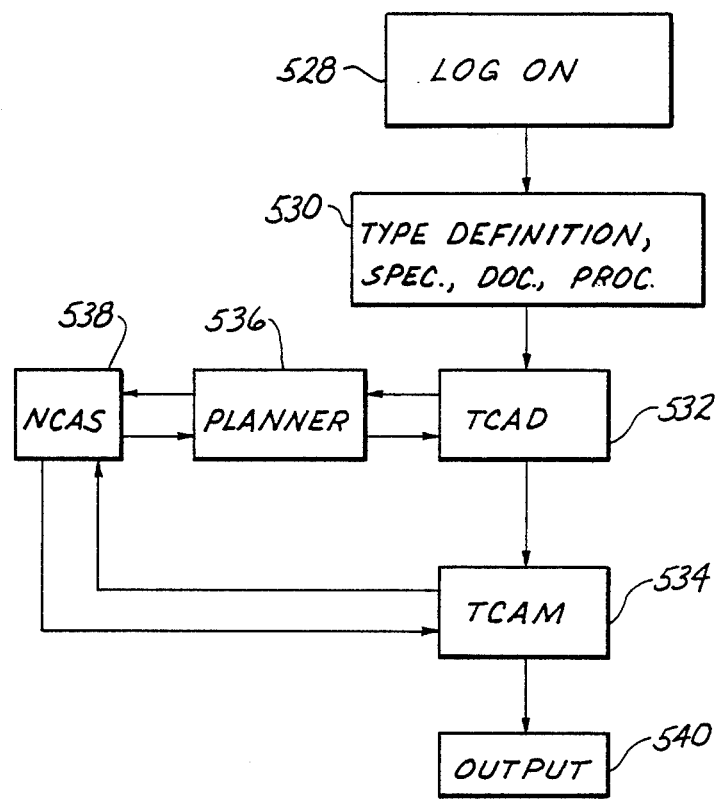
FIG. 23 is a schematic flow scheme of an automated design and manufacture process of the invention.
Figure 24:
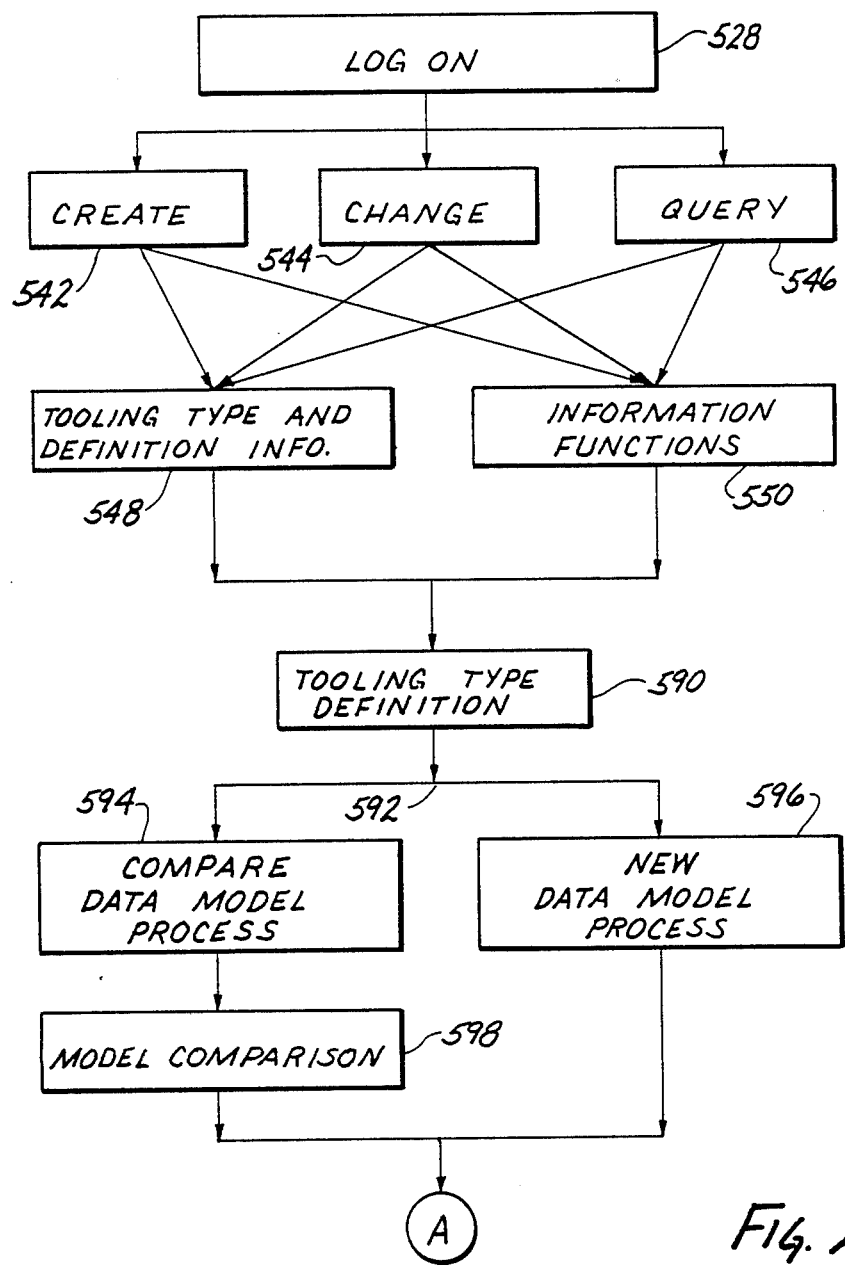
FIGS. 24, 25 and 26 are detailed flow schemes of the flow scheme of FIG. 23.
Figure 25:
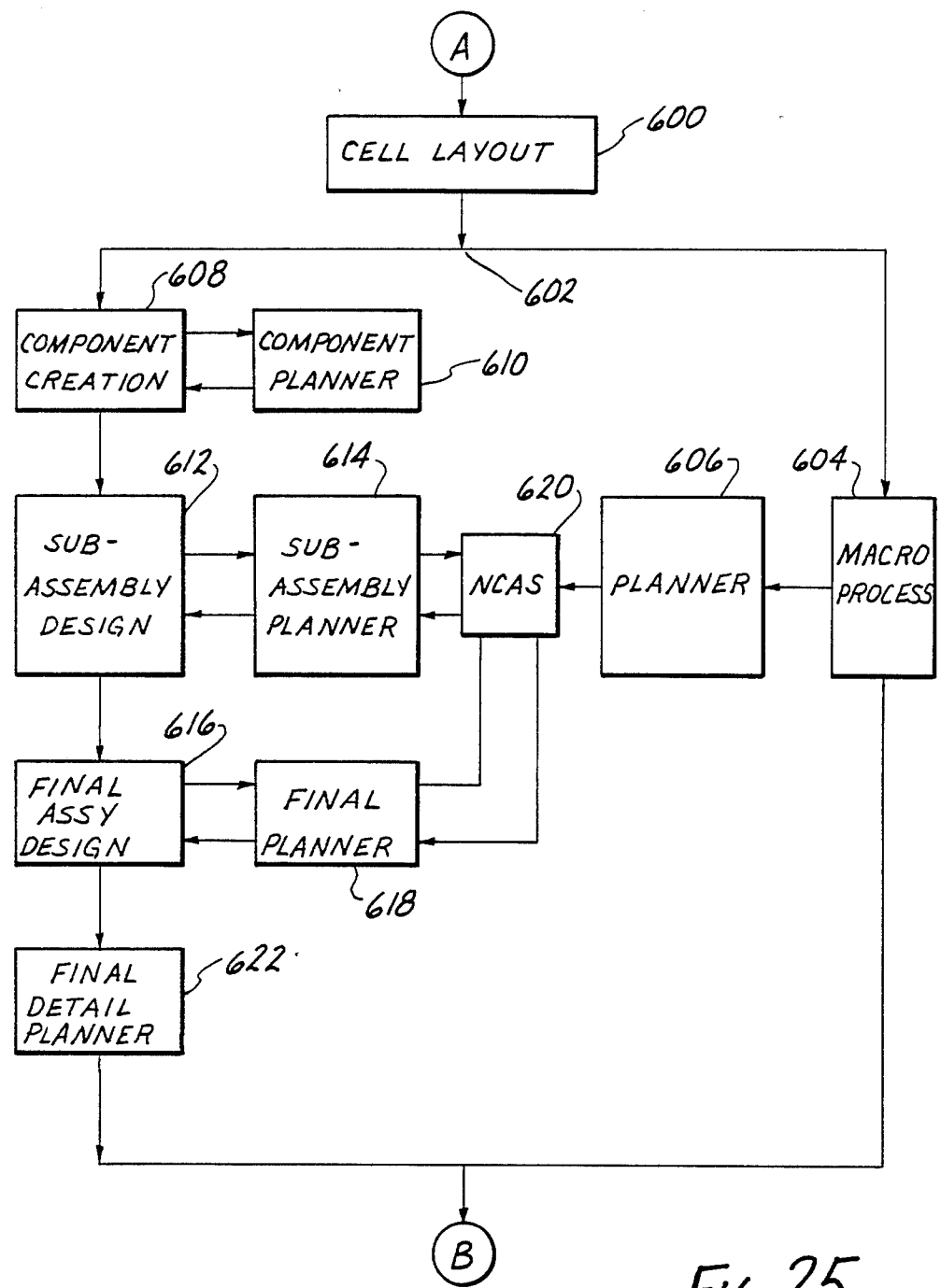
Figure 26:
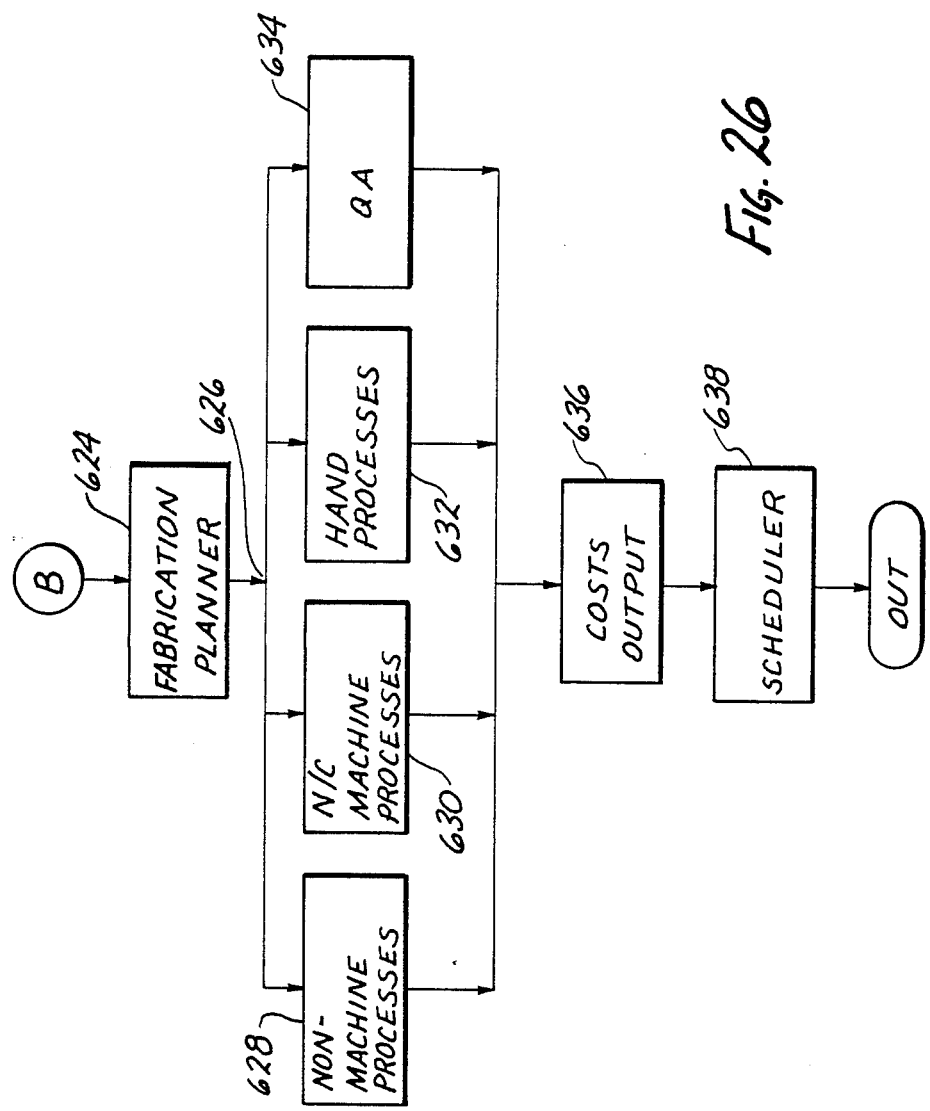
Figure 27:
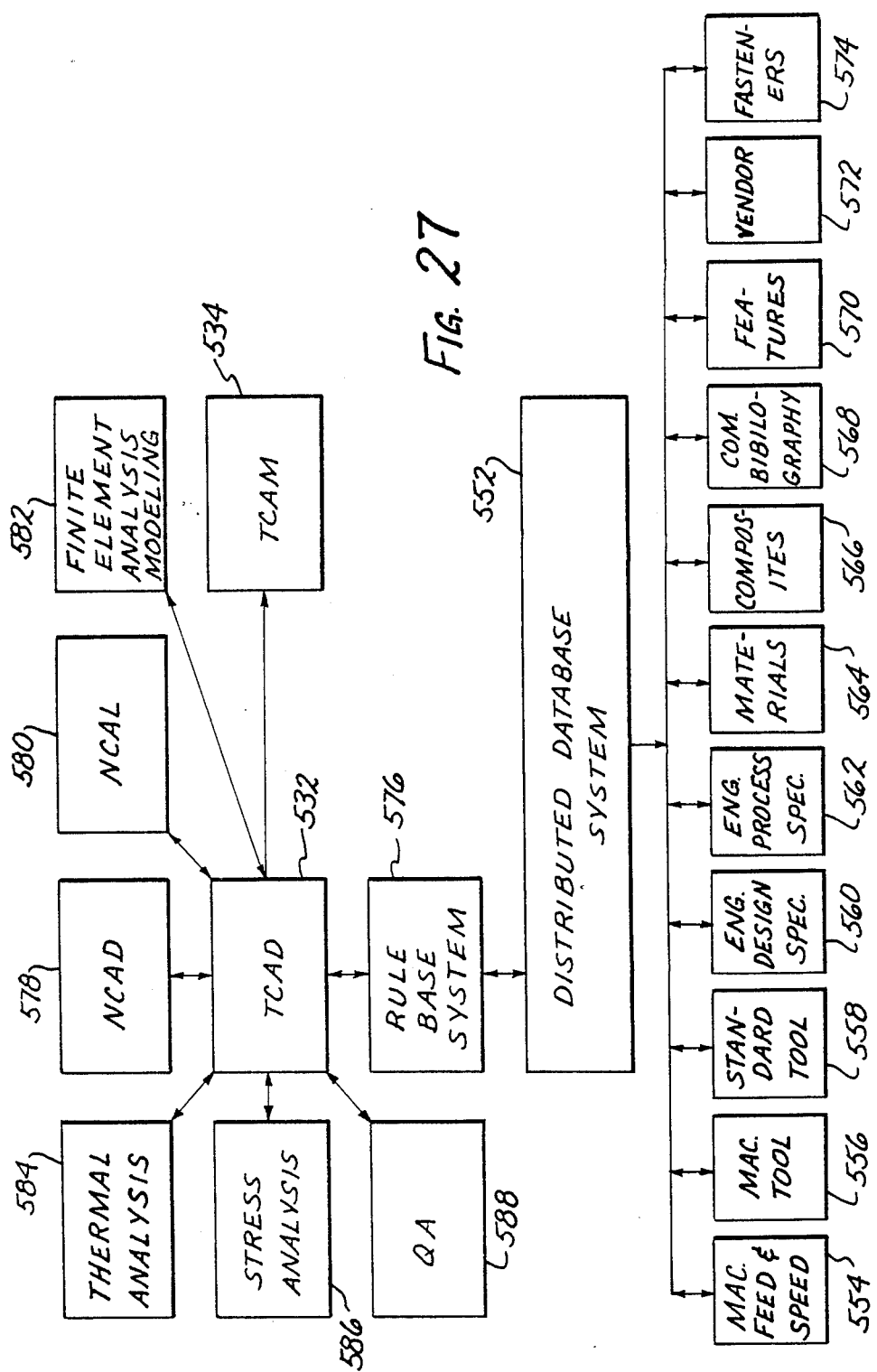
FIG. 27 is a detailed flow scheme of a portion of the scheme seen in FIG. 24.

FIG. 23 shows a block diagram of the overall steps necessary to generate an appropriate tool utilizing an appropriate data base of a standard part or the like. FIGS. 24, 25 and 26 show a more detailed flow chart of the over all steps incorporated in FIG. 23 and FIG. 27 shows a more specific interaction of certain of the entries of FIG. 24.

As is shown in FIG. 23 the user of the automatic tool design and manufacturing system illustrated therein would log on at an appropriate terminal at 528. After entering an appropriate user ID and other necessary information, the user is queried by the system for certain information at process 530 as, for instance, for a definition of the tool type or other specifications, documentation or procedures. These would all be menu driven giving the user a menu choice to choose from.

After responding to the process at 530 as will be outlined in greater detail below, the user then enters into the tooling computer aided design process at 532, e.g. the above identified TCAD software, and from there is led to the tooling computer aided manufacturing process at 534, e.g. the above referenced TCAM software. These two processes thus correspond to steps 465 and 466 of FIG. 18.

Additionally, however, as is seen in FIGS. 23, a process planner 536 is integrated with the design process and the planner, in turn, is integrated with a computer assisted standards process at 538. There is feedback of the standards process to the computer assisted design process via the planner. The standards process 538 is also integrated with the computer assisted manufacture process 534. The output at process 540 of the system of FIG. 23 represents a tangible hard tool corresponding to the vacuum mill fixture 488 of FIG. 20.

The log on at 528 is repeated in FIG. 24. Other of the processes of FIG. 23 are expanded in FIGS. 24, 25 and 26. After log on at 528 of FIG. 24 or through out the design process the user can pull up a procedures menu querying the user as to whether or not the user wants to create a new entry at 542, change an existing entry at 544 or query the system with respect to anything else at 546. Each of the procedures illustrated at 542, 544 and 546 are integrated with both a tooling type and definition function generally indicated at 548 or an information function generally indicated at 550.

Within the tooling type and definition function 548 a tool order is entered for a new tool or updating of a tool status or closing a file. The tool can be defined by the tool type, by its project or by its part material. A plan of formation of the tool of either assembly or fabrication is also selected. Further, scheduling as to either in house or off site for any of its design, plan, assembly or fabrication can be selected.

At the information function 550 the libraries are accessed and general tool specifications can be added, updated or simply queried. Further, material definitions as to material size, shape and the like, material in stock, material specifications, QA requirements, vendor information and other such information could also be created, changed or queried. Additionally, standard purchasing details, e.g. in stock, on order or new item, can be accessed and/or updated. This allows for the creation of a single source data base with respect to all materials, standards and procedures. Thus any and all users of the system always are working with the most current information on any item in the system.

In FIG. 27 a more detailed expansion of the data libraries and the various program interfaces is illustrated. The data libraries include a distributed data base system at 552. Within the distributed data base system are various libraries useful with respect to the design and manufacturing of tools.

The libraries include a machine feed and speeds library 554 wherein pertinent data with respect to the appropriate RPM and feed rates of a tool for different materials are maintained. Further, the libraries includes a machine tool library 556 which is an archive of all existing machines and their characteristics as, for instance, whether or not they are vertical axis machines, horizontal axis machines, 3 axis machines, 5 axis machines, whether or not their beds are T slotted, whether or not the beds are movable, whether or not the tool spindles are movable and other similar informations which define the characteristics of the individual machines and any and all operations they can perform.

The libraries further include a standard tool library 558 wherein specifications with respect to all the cutting tools are maintained. The characteristics of the cutting tools as, for instance, the mill cutter 496, are maintained within this library. These characteristics would include the size of the tools, the number of flutes, tip radii, whether or not the tool is an end mill, a side mill or the like.

Additionally the libraries would include the engineering design specification library 560. This library includes information with respect to general specifications of all parts and tools as, for instance, the specifications with respect to tolerances, fillet radius, corner radius, surface finish and the like. Other specifications are contained within the engineering specification library 562 with respect to material handling, part lubrication, part painting, part stamping, protection of parts and materials during moving and other associated specifications.

A further library is the materials library 564. This library contains specifications with respect to materials as, for instance, densities of materials, corrosion parameters of materials, hardness of materials, QA specifications of different materials, material costs and other associated material properties.

Associated with the material library 564 is the composite library 566 which contains the specifications with respect to composites materials equivalent to those for materials in library 564. Thus, this library would include the processing characteristics about resins and etc. which make up the composites utilized.

A further library is the composite bibliography library 568. This library contains the appropriate information with respect to the material and composite characteristics such as heat expansion, cold contraction, warpage and other physical features.

The features library 570 is a library of particular features (as introduced above) as, for instance, holes, pockets, flanges and other geometrically definable features. In this library a feature as, for instance, a hole will be defined by certain characteristics. Thus, a hole can be defined by the radius of the hole and the length of the string defining the depth of the hole. Parameters with respect to other features are contained in the library such that these features can be selected as standard items therefore rendering it unnecessary to reinvent the wheel each time it is used or, in this case, reinvent or redefine a hole or flange each time such a standard feature is utilized on a part or tool.

The vendor library 572 contains information with respect to vendors which are utilized for material supply or out of house operations. The vendors would be identified with respect to various information and capabilities as, for example, identification that a vendor is in possession of a 5 axis milling machine and thus suitable for selection if a 5 axis operation is needed out of house.

Completing the libraries is a fastener library 574. The date bases in this library store information with respect to standard fasteners, nuts, bolts, screws, etc. Included as part of the data base would be the physical properties of each of the fasteners, i.e. densities, weights, lengths, widths, thread counts and the like as well as unit cost and other pertinent information with respect to the fasteners.

The distributed data base system interfaces with the tooling computer aided design process 532 via a rule base system 576. The rule base system 576 contains the rules and the logic for input/output to the distributed data base system.

As is also evident from FIG. 27, in addition to the tooling computer aided design process 532 and the tooling computer aided manufacturing process 534, other computer aided process can be accessed by the system. This includes the above referred to NCAD shown at 578 for design information of the product which is to be built (the data model of the product, i.e. the data model of aircraft 154) and the above referenced NCAL shown at 580 for extracting lofting information needed for surface features. Also included is a finite element analytical modeling system 582 for modeling solid surfaces from data stored within the data bases of the invention. Additionally, a thermal analysis system 584 and a stress analysis system 586 are also interconnected to the process 532. This allows for both stress and thermal analysis of a design during generation of that design. Finally, a quality assurance (QA) process 588 is also interrelated with the process 532. This process generates the necessary specifications for QA of the parts to be constructed.

The various processes 532, 534 and 576 through 588 allow for generation of additional data with respect to a tooling or part design being considered and/or analysis of particular parameters of this design during generation of the design. Integration of these features with the design phase allows for consideration of important aspects of the design in an integrated manner during design and not after. Thus if an element of a design is deficient in some respect it can be discovered very early in the design phase and corrected as an integral part of the design process.

In reference again to FIG. 24 at process 590 a tooling type definition is entered indicating whether the tool is a new tool or is a change being made to an old tool. This choice dictates the process path taken at junction 592.

At junction 592 the engineering definition of a part (the data model for the part), as, for instance, a part from the data model 452 of FIG. 18 is copied to either process 594 or 596. In process 596 since we are dealing with the formation of a new part or tool the data model definition will be utilized directly for further processing as is outlined below.

At process 594 a comparison module or data base 598 is accessed for analyzing and recording a history of any changes to an existing part in the data model data base and creating a file showing the differences between the prior part and its modified version. This allows the old data model of a part to be compared to a new data model. The difference between them is then analyzed to see if these differences require changes to be made to the fabrication/assembly tool or tools necessary for fabrication and/or assembly of the part in question. If the tool or tools do require changes, these changes are then incorporated in further design processing.

Continuing the process at FIG. 25 the cell layout for the environmental use of the tool is acquired at process 600. At this point input can be made by the user indicating the layout area for use of the tool, i.e. whether or not it will be a table fixture, a floor fixture, a mobile fixture, such that information can be tabulated with respect to indicating table size, table location, table type, floor area, work area, tool crib, whether or not fork-lift access or roll away pathway must be considered and other physical layouts for use of the tool. Further information can be extracted from the machine library above with respect to a machine description, its size, its T slots locations, their shapes and other pertinent considerations. Information can thus be entered into the system dealing with the physical location of the tool and/or the machine on which it is created to prevent inappropriate scheduling of, for instance, a large tool in an area where there is insufficient access to the machine on which the tool is to be fabricated.

At junction 602 a branch is made depending on whether a new unique tool is to be fabricated or whether a known type of tool from a standard library is indicated. If a component as, for instance, the above described tool 488 is to be fabricated or modified, since information concerning "generic vacuum mill fixtures" is already known in the libraries, the right hand path from junction 602 to process 604 is indicated for the facilitation of a tool known to the system.

For our known type of tool, i.e. the vacuum mill fixture 488, the specification for this pre-existing tool in the libraries is accessed at macro design process 604. A planner at 606 is accessed for the accumulation of the detailed plans with respect to individual components of the standard tool.

Referring back to FIGS. 20 through 22, the vacuum mill fixture 488 was composed of certain components which are generic to a vacuum mill fixture, i.e. the base plate 498, the riser 500 and the set block 506. Assuming that the tooling type entered at process 548 is for a vacuum mill fixture as per information in the above referred to libraries, each of these components is created as dictated by a vacuum mill fixture macro within the process 604 and a plan with respect to the details of each component is accumulated in the processor 606.

The macro will include the definition of a vacuum mill fixture and appropriate calls to the various libraries for the generation of the necessary components of the fixture. The operator in utilizing this system for the creation of the vacuum mill fixture as, for instance, the fixture 488 of FIG. 20 is simply lead through the appropriate steps as encoded in the macro.

Within the macro design process 604 the riser is created to fit with the pocket 494 of the model of the part 486 in the data model entered in the system at 596. The geometry and the dimensions of the riser are such that it mimics the geometry of the pocket and is dimensioned a standard increment smaller than the pocket.

The macro includes the appropriate instructions for reading the size of the cavity wherein the riser is located. In response the macro appropriately sizes the riser to fit within the cavity within particular tolerances specified in the macro or as dictated by the library specifications, e.g. library 560.

For a riser to fit into the lower pocket 494 the design specifications for the lower pocket 494 are utilized by the mill fixture macro in sizing the riser to fit in the pocket 494 taking into account the normal clearance and tolerances necessary between the inside surface of the pocket 494 and the outside surface of the appropriate riser, as for instance the riser 500. Thus, an operator need not worry about specifying any dimensions and the like. The operator simply needs to specify a vacuum mill fixture and the macro for that particular tool utilizes the logic incorporated therein in conjunction with the library data base for creating the appropriate tool geometry and sizing.

The design of the riser is completed by incorporation of the vacuum holes and vacuum manifold therein. Again this can follow pre-established specifications entered into the libraries or alternatively the system design also allows an operator to override and dictate the positioning of the manifold. In any event manifold dimensioning takes in to account the volume of the area wherein a vacuum needed. This is directly related to the geometry of the bottom of the pocket 494, i.e. the size of the surface of the web 490 in the pocket. Sizing of the vacuum holes 514 and manifold 516 necessary to accommodate the vacuum is extracted from the specifications library and incorporated into the riser design. All of this information is accumulated in the planner 606.

Having established the geometry and dimensions of the riser this information is now available for sizing and shaping of the base plate 498. Further considerations for the base plate are made to incorporate the machine which will be utilized to form the upper pocket 492. Additional base plate data is extracted from the libraries indicating that flat stock is necessary. The flat stock must be finished to the size of the base plate, slots 522 must be formed therein, and appropriate threaded holes for attachment of the riser 500 and the set block 506 are needed. The position of the toggle clamps is dictated by the geometry of the part 486 and further openings must be provided for attachment of the toggle clamps 502 and 504. As with other features, the necessary definitions for the holes etc. are extracted from the features library.

This information is added to the other information in the planner 606. The parts for the tool 488 are completed by selection of a standard set block from the libraries. This to is added to the information accumulating in the planner 606 until all data necessary for the formation and the detailed plan of each of the components parts is created. Any sub-assembly data indicated by the tool macro is also extracted from the libraries and added to the data base accumulating in the planner 606.

For each individual type of tool appropriate macros can be created and then be selected for the generation of the tool at a later date. Insofar as in a particular field of manufacture as, for instance, for the manufacture of airplanes, repetitive classes of tools are generally utilized, once a macro is created for a particular tool the characteristics of that tool are stored in the macro and can simply be accessed at will at later dates for creation of further tools of that type. Once an appropriate macro is created incorporating the features of a particular tool as defined by an expert in that tool, later calls to the same macro can be made by a less skilled person who simply needs to follow the necessary guides incorporated into the macro in creation of the tool.

Assuming that a unique tool or a unique modification is desirous, the left hand branch from junction 602 is accessed by the system. For the sake of illustration while as described above, the vacuum mill fixture 488 is a tool known to the system the vacuum mill fixture 488 of FIG. 21 will also be utilized to illustrated the left hand branch of FIG. 25.

Again referring back to FIGS. 20 through 22, the vacuum mill fixture 488 was composed of the base plate 498, the riser 500, the set block 506 and the toggle clamps 502 and 504. Each of these components can be in individually created at process 608 and a plan with respect to the details of each component can be accumulated in the component planner 610. Thus, at process 608 as, for instance, assisted by an operator, a generic component for the base plate 498 is extracted from the libraries. Since this generic component is flat stock, it must be finished to the size of the base plate, slots 522 must be formed therein and appropriate threaded holes for attachment of the toggle clamp 502 and 504 and the set block 506 are needed in the base plate. Further, openings must be provided for attachment of the riser 500 via the bolts 520. This information is set forth in an individual plan in the planner 610 for this component. Additionally, data necessary for the formation and the detailed plan of each of the other of the components is created or extracted from the libraries, e.g. utilization of standard toggle clamps known in the fasteners library 574.

In creating and assembling components, more basic features of these components, i.e. features as described above, are extracted from the libraries and built into virtual parts. The individual components can be built up feature by feature into desired component with feedback helping to define the geometry and sizing of the features. For example a hole feature is defined by two parameters, its string length and its radius. The thickness of the plate wherein the hole is to be located dictates the length of the string (the depth) of a hole located in the plate and the diameter of a standard bolt fastener dictates the radius of the hole.

Once the data base with respect to the individual components is established, sub assembly design can be considered at process 612 and assembled in planner 614. Insofar as the vacuum mill fixture 488 does not include separate sub assemblies, assembly of the individual components designed at process 608 moves to final assembly design process 616.

For final assembly design consideration is given as to how the components would be affixed to one another, how they will come together and the like. Thus, for attachment of the toggle clamps 502 and 504 data is created indicating that appropriate holes must be located in the base 498. This is fed back to the component creating process 608 whereby the appropriate holes, as were defined above, are included in the individual component. The plans with respect to the individual components are updated at the final planner 618.

Interrogation of a computer assisted feature based standards program at 620 allows for the generation of cost analysis for the individual steps required for each of the individual component and/or their sub assembly or final assembly for both the right hand branch and the left hand branch illustrated in FIG. 25. The computer assisted feature based standards program 620 determines time and material costs for each individual operation. As components, sub assemblies and final assemblies are defined, the standards for the material costs and the individual processing steps is assessed and are systematically compiled within the planners 606, 610, 614 or 618. This information is incorporated as an integral part of the design and later after being augmented to include the overall manufacturing plan, the accumulated information allows for creation of a cost analysis for the final tool.

Suitable for the computer assisted feature based standards program 620 is NCAS (Northrop Computer Assisted Standards, Northrop Corporation). Other such programs include Genplan (Lockheed Corporation), OMNI (a public domain standards program available from the Alameda Air Command, United States Air Force, Alameda Airbase, Alameda, CA) or MTM (a commercially available series of five programs from the MTM [Motion Time Measure] association).

The plans created within the macro planner 606, component planner 610, sub assembly planer 614 or final planner 618 include component list and associated definitions and instructions with respect to these components for positioning and location requirements, how the components are attached together, and calls to the computer assisted standards program 620 for cost analysis. At the final planner 622 all plans are joined together into a coherent whole.

On FIG. 26 we now enter the tooling computer assisted manufacturing phase generally indicated at process 534 in FIG. 23. From the final planner 522 of FIG. 25, the data collected in the data base is input to the fabrication planner 624 for the creation of a fabrication plan. At this point features of the final plan are analyzed for ascertaining the order of doing things, the parts necessary, the exact specification and processes necessary for each individual component and assembly of the same into a unified whole.

At the fabrication planner 624 each of the features is looked at and defined in order. For example, for any particular component an order to obtain the material is specified, the QA necessary for the material is specified, layout is then specified, any cutting operations and identification operations are specified, any intermediate steps followed by other steps as, for instance, milling followed by tempering are also specified, final QA is specified and final preparation for shipping, handling is likewise specified. At the fabrication planner 624 complete fabrication plans with the time standards and sequence of operation is created complete with any particular schedules or diagrams necessary for humans interacting with the system.

At junction 626 the fabrication plan for the processes for the tool are segregated into non numerically controlled machining operations, numerically controlled machining operations, hand processing and quality assurance operations.

The non numerically controlled machining processes generally indicated at 628 would set forth a plan including operator instructions and the like for processes as, for instance, table saw gross cutting of raw stock.

The numerical controlled machining processes at process 630 create the necessary numerically controlled machine cutter paths necessary for NC machining of the component parts of tools. Additionally, numerically controlled cutter requirements are specified (what cutter are needed), operator instructions are set forth, staging requirements, nesting requirements and other numerically controlled machining associated operations are also specified.

For hand process at 632 those operations requiring hand processes as, for instance, deburring, degreasing, painting, stamping and the like are detailed.

For QA processes at 634 the necessary data is generated for downloading to computer controlled theodolites and other QA tools as described above.

Output of associated costs is at 636. This is generated utilizing calls to the standards program at 620 and the resultant information accumulated in the various planners. Output of the final schedule is at 638.

As per the schedule generated at 638 the appropriate numerically controlled machining, non numerically controlled machining or hand processes are coded or specified for production of a tool as, for instance, the vacuum mill fixture 480 of FIG. 20 and comparison of the finished tool via the QA data generated at process 634 is made to insure compliance of the tool with respect to the data model originally created within the computer data base systems.

Final output thus yields a tool definition which can be filed for archival purposes and/or for appropriate human use, tool design, tool assembly plans, and time standards associated therewith, tool fabrication plans and time standards associated therewith, NC tape generation or other communication to appropriate NC machines, schedules for fabrication assembly and overall costs for the production of the tools.

A typical session for the preparation of a tool would be as follows. An operator logs on at process 528 and is presented with an initial logon message and menu. The operator is instructed that the system will enable the operator to process an order completely by simply following tutorial menus which will guide the operator through the tool definition, tool design, tool planning, tool fabrication, standards and scheduling. Further the operator is told at the end of the session that the following will be outputted: a tool definition sheet, a tool design plot, a tool assembly plan, a tool fabrication plan, NC tape, machine operator instructions, a numerical control cutter request and schedules and cost.

After logon the menu asks the operator to select a procedure and is given the choices of the create process 542, the change process 544 or the query process 546. Next the operator is asked to select a function between the tool type definition at process 548 or the tool design information at process 550.

Assuming that the tool type definition was selected a further screen at process 590 queries the operator as to whether or not the tool order is simply a status check, a new tool or to close an order. The operator is asked to define the tool by tool type, by the project or by the part material and then to specify whether or not it is an assembly or fabrication. Next the operator is queried to choose scheduling information between design, plan, assembly or fabrication.

If a new tool is being created, the appropriate data base design information, i.e. the data model, with respect to the part, i.e. the part 486, is called from the computer memory at process 596 or if an existing tool is being modified, the call is made at process 594. As noted above, if an existing tool is being modified a history between the new tool and the old tool is created at process 598.

Retreating for a moment if, in fact, at the menu asking for the function selection between the tool type definition function 548 and the tool design information function 550 the operator had chosen the tool design function, new material, material update or a query of existing library functions could be made with respect to material definitions, standard purchase details and the like as, for instance, adding vendor information, stock information, redefining materials, adding new material definitions and the like.

Returning again to a tool design, the operator is next requested to select a major tool category. Assuming for the purposes of an example, the operator chooses "machine tools" from the list of particular categories of tools.

Upon this selection a further menu showing sub categories of "machine tools" are presented for the operators selection. The operator selects from one of the subclasses of machine tools as, for instance, "vacuum mill fixtures". Cell layout menus are now presented to the operator and the design stage is now entered at junction 602. In this instance, since an existing class of tools, "vacuum mill fixtures", has been selected and since the system contains macros for this tool, the system branches to the macro design process 604 and presents the operator the three dimensional graphics representation of the part, i.e. the part 486, followed by the automatic creation by the system of an appropriate vacuum mill fixture also in 3-D graphics representation generated via the vacuum mill fixture macro and the system libraries.

As the system generates the appropriate parts of the vacuum mill fixture which fits the part 486, the screen is continuously updated for the operators use in following the automatic design process. If the operator chooses to over ride any part of the system as, for instance, deleting a vacuum riser or the like, the operator can interact with the system to over ride the automatic functions being processed in the macro.

Assuming the operator allows for complete automatic generation of the appropriate vacuum mill fixture, after the design of the same is completed by the macro at process 604 and the elements necessary for the fabrication plan are assembled by the planner 606, the system progresses into the computer assisted manufacturing phase wherein the fabrication plan is created and presented to the operator with the appropriate details and-/or schedules of each of the four outputs: the non numerical machine output at process 628, the numerical machining output at process 630, the hand processing output at 632, and quality assurance output at process 634.

The appropriate non numerical controlled machining instructions are generated, the appropriate numerically controlled machining tapes are punched or other software or direct hardware links are generated including floppy disc generation for theodolite use. Further a tool definition sheet is generated as are a tool design plot, a tool assembly plan, a tool fabrication plan, machine operator instructions, cutter requests and tooling estimate data.

Where appropriate hard copies of the same are output by the system as for instance the tooling estimating costs and the machine operator instructions. Other instructions such as the numerically controlled cutter request might be redirected to a master scheduler for the shop floor to insure that the cutters would be available when the components are to be machined. The operator can now log off with the appropriate design and manufacturing instructions completed for the tool.

Since data within the data base libraries has been utilized, the operator need not be a sophisticated tool designer. Additionally, depending upon the situation and the desired control over the system, the system could be further automated under the control of an even lower level basic control macro eliminating the necessity for the operator to interact at all with the terminal. In such a situation, after design of an appropriate article within the data bases of the computer, i.e. an aircraft, appropriate macros would analyze the aircraft and then specify the design of the component parts. The parts in turn would then be analysis and the necessary tooling ascertained, design and manufactured.

This invention utilizes certain principles and/or concepts as are set forth in the claims appended hereto. Those skilled in the manufacturing arts will realize that these principles and/or concepts are capable of being utilized in a variety of embodiments which may differ from the exact embodiments which are utilized for illustrative purposes herein. For this reason, this invention is not to be construed as being limited solely to the illustrative embodiments but should only be construed in view of the claims.

We claim:

1. A method of manufacturing tooling for aircraft construction which comprises:
   constructing a definition of said aircraft in a computer memory;
   defining in said computer memory a first tool means for forming a component part of said aircraft;
   defining in said computer memory a second tool means for assembling a component part of said aircraft wherein said component part of said aircraft is formed with said first tool means;
   downloading said definitions of said first tool means and said second tool means to means for forming tools; and
   operating said means for forming tools to form said first tool means and said second tool means essentially independent from one another.

2. The method of manufacture of claim 1 including:
   selecting said first tool means as a forming tool for forming component aircraft parts.

3. The method of manufacture of claim 1 including:
   selecting said second tool means as an assembly jig for performing an assembly operation.

4. The method of manufacture of claim 1 including:
   forming said second tool means without spatial location reference to said first tool means.

5. The method of manufacture of claim 1 including:
   selecting said first tool means to include a plurality of profile boards and at least one connector board;
   selecting said profile boards to include at least one profile edge;
   locating said profile edge of each of said profile boards in a mold line surface which defines said image of said part;
   selecting each of said profile boards to further include locator means for fixedly locating said profile board with respect to said connector board;
   selecting said connector board to further include locator means for fixedly locating said connector board with respect to each of said profile boards; and
   selecting said respective locator means to each include a locator edge on said respective profile boards and said respective connector board.

6. A method of manufacture of claim 1 including:
   associating an interface means with said computer memory, said interface means for inputting commands to said computer memory; and
   inputting commands through said interface means to said computer memory to generate said definitions of said first tool means and said second tool means.

7. A method of manufacture of claim 1 including:
   associating computer aided tool design software with said computer memory; and
   operating said computer aided tool design software to defining at least in part said first tool means and said second tool means.

8. A method of manufacture of claim 7 wherein:
   associating computer aided tool manufacture software with said computer system; and
   operating said computer aided tool manufacture software in coordination with said computer aided tool design software to define said first and said second tool means and to further define a sequence of operations for forming said first and said second tool means, said sequence of operations for forming said first and said second tool means downloaded to said means for forming tools.

9. A method of producing a tool of claim 8 including:
   defining a features library in said computer memory, said features library including a plurality of features each having a set of defined attributes describing each of said respective features; and calling said features library from said computer aided tool design software to selected features from said features library and to incorporate said features in to said first and second tool means design.

10. A method of producing a tool of claim 9 including:

interfacing a time and costs standards software program in said computer memory, said time and costs standards software program including a standard for material costs and manufacturing time for each of said respective features in said features library;

calling said time and costs standards software program from said computer aided tool manufacture software to generate material costs and manufacturing times for said first and second tool means.

11. A method of producing a tool of claim 1 including:

operating said means for forming tools to form said first tools means and said second tool means essentially parallel in time with one another.

12. The method of manufacturing of claim 1 including:

constructing said definition of said aircraft as a graphics data set in a data base in a 3-dimensional graphics computer system;

generating said definition of said aircraft to include coordinate points precisely locating said definition of said aircraft in a three dimensional coordinate system;

selecting at least a portion of said definition of said aircraft;

defining one of said first tool means and said second tools means as a set of further data in said data base defining virtual images of component parts of a tool which interact with said selected portion of said definition of said aircraft;

generating said virtual image of said component parts of said tool to include coordinate points in said coordinate system;

associating a data transferring means with said computer system, said data transferring means for outputting, storing and transferring data between data devices;

downloading a memory copy of at least said further data from said data base to said transferring means to form a copy of at least said further data;

transferring said copy of said further data from said transferring means to a numerically controlled machining tool means;

operating said numerically controlled machining tool means with said copy of said further data to form said component parts of said tool and further to locate coordinating points on at least one said component parts of said tool wherein said located coordinating points on said component parts of said tool correspond to said coordinate points in said coordinate system;

assembling said component parts of said tool into said tool;

inputting at least said copy of said further data to a microprocessor controlled measuring means, said measuring means for measuring target points in three dimensional space;

operating said measuring means to measure said coordinating points on said component parts of said tool; and comparing said measured coordinating points on at least one of said component parts of said tool to respective coordinate points in said further data.

13. A method of manufacturing an aircraft which comprises:

generating a definition of said aircraft as a graphics data set in a data base in a 3-dimensional graphics computer system;

generating said definition of said aircraft to include coordinate points precisely locating said definition of said aircraft in a three dimensional coordinate system;

selecting at least a portion of said definition of said aircraft;

generating further data in said data base defining virtual images of component parts of a tool which interact with said selected portion of said definition of said aircraft;

generating said virtual image of said component parts of said tool to include coordinate points in said coordinate system;

associating a data transferring means with said computer system, said data transferring means for outputting, storing and transferring data between data devices;

downloading a memory copy of at least said further data from said data base to said transferring means to form a copy of at least said further data;

transferring said copy of said further data from said transferring means to a numerically controlled machining tool means;

operating said numerically controlled machining tool means with said copy of said further data to form said component parts of said tool and further to locate coordinating points on at least one said component parts of said tool wherein said located coordinating points on said component parts of said tool correspond to said coordinate points in said coordinate system;

assembling said component parts of said tool into said tool;

inputting at least said copy of said further data to a microprocessor controlled measuring means, said measuring means for measuring target points in three dimensional space;

operating said measuring means to measure said coordinating points on said component parts of said tool; and comparing said measured coordinating points on at least one of said component parts of said tool to respective coordinate points in said further data.

14. A method of manufacturing an aircraft which comprises:

generating a definition of said aircraft as a graphics data set in a data base in a 3-dimensional graphics computer system;

generating said definition of said aircraft to include coordinate points precisely locating said definition of said aircraft in a three dimensional coordinate system;

selecting at least a portion of said definition of said aircraft;

generating further data in said data base defining virtual images of component parts of a tool which interact with said selected portion of said definition of said aircraft;

generating said virtual image of said component parts of said tool to include coordinate points in said coordinate system;

associating computer aided tool design software with said computer system;

running said computer aided tool design software to generate at least in part said further data defining said virtual images of said component parts of said tool;

associating computer aided tool manufacture software with said computer system;

running said computer aided tool manufacture software in coordination with said computer aided tool design software to generate said further data defining said virtual images of said component parts of said tool;

defining a features library in said data base, said features library including a plurality of features each having a set of defined attributes describing each of said respective features;

calling said features library from said computer aided tool design software to selected features from said features library and to incorporate said features into said virtual images of said component parts of said tool;

interfacing a time and costs standards software program with said computer system, said time and costs standards software program including a standard for material costs and manufacturing time for each of said respective features in said features library;

calling said time and costs standards software program from said computer aided tool design software and said computer aided tool manufacture software to generate material costs and manufacturing times for said component parts of said tool;

associating a data transferring means with said computer system, said data transferring means for outputting, storing and transferring data between data devices;

downloading a memory copy of at least said further data from said data base to said transferring means to form a copy of at least said further data;

transferring said copy of said further data from said transferring means to a numerically controlled machining tool means;

operating said numerically controlled machining tool means with said copy of said further data to form said component parts of said tool and further to locate coordinating points on at least one said component parts of said tool wherein said located coordinating points on said component parts of said tool correspond to said coordinate points in said coordinate system;

assembling said component parts of said tool into said tool;

inputting at least said copy of said further data to a microprocessor controlled measuring means, said measuring means for measuring target points in three dimensional space;

operating said measuring means to measure said coordinating points on said component parts of said tool; and comparing said measured coordinating points on at least one of said component parts of said tool to respective coordinate points in said further data.

15. An aircraft manufacturing system which comprises:

a 3-dimensional graphics computer system having memory;

said computer system containing a graphics definition of an aircraft stored in a data base in said memory;

said computer system including means for defining a graphics virtual surface of said aircraft in said memory;

said computer system including means for defining a graphics virtual member in said memory, said virtual member including at least a portion of said graphics virtual surface;

emulating means for forming a tangible member which corresponds to said virtual member, said emulating means operatively interfaced with said computer system;

means connected with said computer system for downloading said definition of said virtual member to said emulating means whereby said emulating means forms a tangible member corresponding to said virtual member;

said emulating means includes at least one numerically controlled tool means for forming a part;

said tangible member comprises an image tool means for forming one of an image copy or a complimentary image copy of at least a portion of said aircraft;

said means for defining said graphics virtual member includes an interface means for inputting commands to said computer system, said interface means connected to said computer system.

said interface means includes a plurality of software macro means each for defining a discrete operation of said tool means;

said interface means further includes means for choosing a sequence of said software macros means;

said definition of said aircraft includes coordinate points means for precisely locating a design definition of said aircraft in a three dimensional coordinate system;

said means for downloading said definition of said virtual member includes means for including coordinate points on said virtual member precisely locating said virtual member in said three dimensional coordinate system; and said emulating means including means for translating said coordinate points on said virtual member to coordinating points on said tangible member, said coordinating points on said tangible member precisely related to said design definition of said aircraft in said three dimensional coordinate system.

* * * * *